(12) United States Patent
Ikeda et al.

(10) Patent No.: US 8,848,424 B2
(45) Date of Patent: Sep. 30, 2014

(54) VARIABLE RESISTANCE NONVOLATILE MEMORY DEVICE, AND ACCESSING METHOD FOR VARIABLE RESISTANCE NONVOLATILE MEMORY DEVICE

(71) Applicant: Panasonic Corporation, Osaka (JP)

(72) Inventors: Yuichiro Ikeda, Hyogo (JP); Kazuhiko Shimakawa, Osaka (JP); Ryotaro Azuma, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/976,172

(22) PCT Filed: Nov. 15, 2012

(86) PCT No.: PCT/JP2012/007322
§ 371 (c)(1),
(2), (4) Date: Jun. 26, 2013

(87) PCT Pub. No.: WO2013/076935
PCT Pub. Date: May 30, 2013

(65) Prior Publication Data
US 2014/0056055 A1 Feb. 27, 2014

(30) Foreign Application Priority Data
Nov. 22, 2011 (JP) .................................. 2011-255471

(51) Int. Cl.
*G11C 11/00* (2006.01)
*G11C 13/00* (2006.01)
*H01L 27/24* (2006.01)
*H01L 27/10* (2006.01)

(52) U.S. Cl.
CPC .......... *G11C 13/003* (2013.01); *G11C 2213/72* (2013.01); *G11C 2213/71* (2013.01); *H01L 27/2481* (2013.01); *H01L 27/101* (2013.01); *G11C 13/00* (2013.01)
USPC ... 365/148; 365/51; 365/230.03; 365/230.04; 365/63; 365/46

(58) Field of Classification Search
CPC .......... G11C 2213/71; G11C 2313/72; H01L 27/2481; H01L 27/101; H01L 27/249
USPC .............. 365/148, 51, 230.03, 230.04, 63, 46
See application file for complete search history.

(56) References Cited

U.S. PATENT DOCUMENTS 6,917,532 B2 7/2005 Van Brocklin et al.
6,972,985 B2 12/2005 Rinerson et al.
(Continued)

FOREIGN PATENT DOCUMENTS

JP 2004-31948 1/2004
JP 2005-311322 11/2005
(Continued)

OTHER PUBLICATIONS

International Search Report issued Dec. 18, 2012 in corresponding International Application No. PCT/JP2012/007322.
(Continued)

*Primary Examiner* — Viet Q Nguyen
(74) *Attorney, Agent, or Firm* — Wenderoth, Lind & Ponack, L.L.P.

(57) ABSTRACT

A variable resistance nonvolatile memory device includes: bit lines in layers; word lines in layers formed at intervals between the layers of the bit lines; a memory cell array including basic array planes and having memory cells formed at crosspoints of the bit lines in the layers and the word lines in the layers; global bit lines provided in one-to-one correspondence with the basic array planes; and sets provided in one-to-one correspondence with the basic array planes, and each including a first selection switch element and a second selection switch element, wherein memory cells connected to the same word line are successively accessed in different basic array planes, and memory cells are selected so that voltages applied to the word line and bit lines are not changed and a direction in which current flows through the memory cells is the same.

10 Claims, 32 Drawing Sheets

(56) References Cited

U.S. PATENT DOCUMENTS

| | | | |
|---|---|---|---|
| 7,394,680 B2 | 7/2008 | Toda et al. | |
| 7,400,522 B2 | 7/2008 | Toda et al. | |
| 7,606,059 B2 | 10/2009 | Toda | |
| 7,692,951 B2 | 4/2010 | Toda et al. | |
| 7,778,062 B2 | 8/2010 | Toda et al. | |
| 7,826,249 B2 | 11/2010 | Toda | |
| 7,889,538 B2 | 2/2011 | Toda | |
| 7,920,408 B2 * | 4/2011 | Azuma et al. | 365/148 |
| 8,102,697 B2 | 1/2012 | Toda | |
| 8,125,817 B2 * | 2/2012 | Takagi et al. | 365/148 |
| 8,441,839 B2 * | 5/2013 | Azuma et al. | 365/148 |
| 8,467,228 B2 * | 6/2013 | Ikeda et al. | 365/148 |
| 2003/0235063 A1 | 12/2003 | Van Brocklin et al. | |
| 2005/0230724 A1 | 10/2005 | Hsu | |
| 2005/0243595 A1 | 11/2005 | Rinerson et al. | |
| 2006/0268594 A1 | 11/2006 | Toda | |
| 2007/0132049 A1 | 6/2007 | Stipe | |
| 2007/0285966 A1 | 12/2007 | Toda et al. | |
| 2007/0285967 A1 | 12/2007 | Toda et al. | |
| 2007/0285968 A1 | 12/2007 | Toda et al. | |
| 2008/0304308 A1 | 12/2008 | Stipe | |
| 2008/0310211 A1 | 12/2008 | Toda et al. | |
| 2009/0052225 A1 | 2/2009 | Morimoto | |
| 2010/0008126 A1 | 1/2010 | Toda | |
| 2010/0046273 A1 | 2/2010 | Azuma et al. | |
| 2010/0165702 A1 | 7/2010 | Toda | |
| 2011/0019462 A1 | 1/2011 | Toda | |
| 2012/0099365 A1 | 4/2012 | Toda | |

FOREIGN PATENT DOCUMENTS

| | | |
|---|---|---|
| JP | 2006-514393 | 4/2006 |
| JP | 2006-203098 | 8/2006 |
| JP | 2007-165873 | 6/2007 |
| JP | 2007-536680 | 12/2007 |
| JP | 2010-020863 | 1/2010 |
| WO | 2004/084229 | 9/2004 |
| WO | 2005/117021 | 12/2005 |
| WO | 2009/001534 | 12/2008 |

OTHER PUBLICATIONS

I. G. Baek, et al., "Multi-layer Cross-point Binary Oxide Resistive Memory (OxRRAM) for Post-NAND Storage Application", IEDM 2005 (IEEE International Electron Devices Meeting 2005), Session 31 (Fig. 7, Fig. 11), Dec. 5, 2005.

* cited by examiner (a) Single-layer crosspoint memory cells (b) Multilayer crosspoint memory cells (a)

(b)

(c)

(d)

(e)

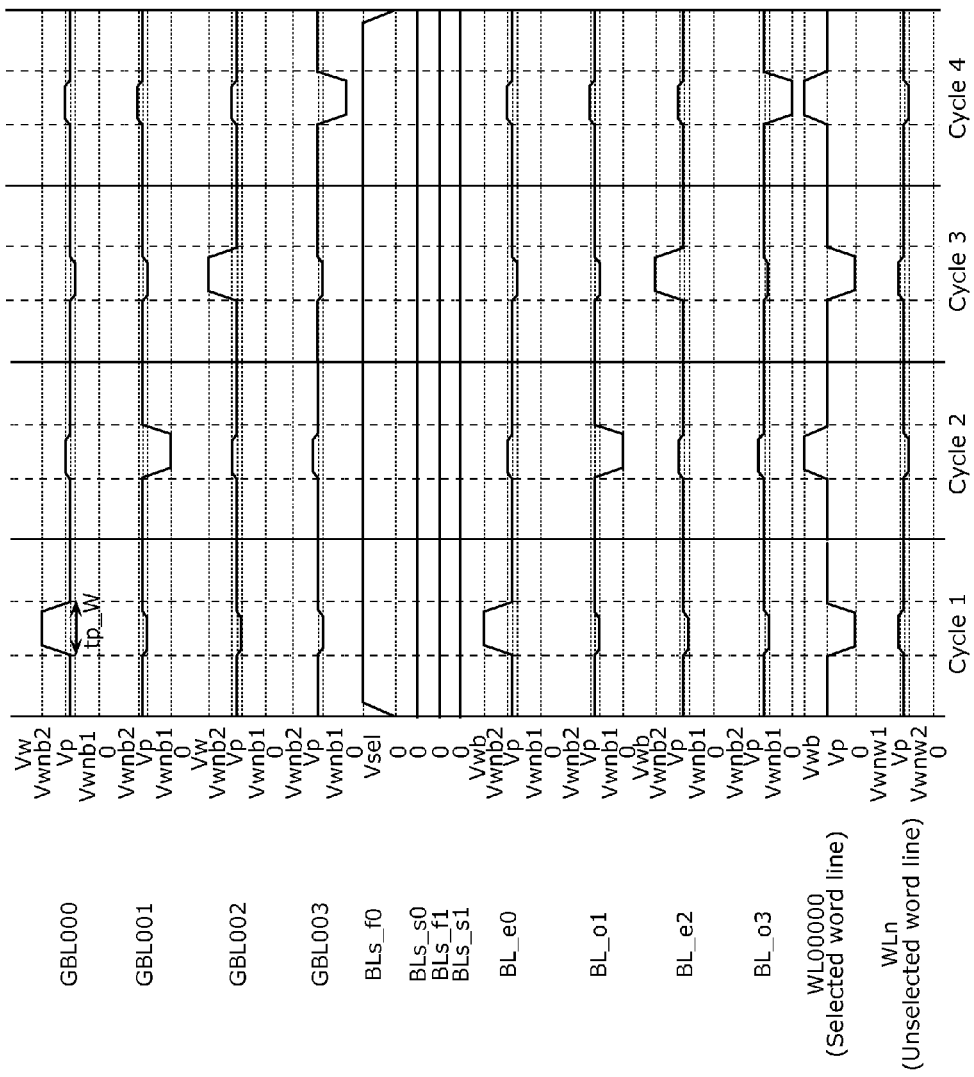

(a) When accessing BL_e2

(b) When accessing BL_e3

(a) When accessing BL_e2

(b) When accessing BL_e3

VARIABLE RESISTANCE NONVOLATILE MEMORY DEVICE, AND ACCESSING METHOD FOR VARIABLE RESISTANCE NONVOLATILE MEMORY DEVICE

TECHNICAL FIELD

The present invention relates to a variable resistance nonvolatile memory device having a memory cell which includes a so-called variable resistance element, and an accessing method for the same.

BACKGROUND ART

In recent years, research and development has advanced which is conducted on variable resistance nonvolatile memory devices having memory cells which include so-called variable resistance elements (hereinafter, also simply referred to as "nonvolatile memory devices"). A variable resistance element is an element that has a property of changing its resistance value according to an electrical signal, and allows information to be written thereto due to such a change in the resistance value.

One structure of memory cells which include variable resistance elements is a crosspoint structure. In the crosspoint structure, each memory cell is placed at a different one of crosspoints of orthogonally arranged bit lines and word lines so as to be interposed between one of the bit lines and one of the word lines. Conventionally, various configurations of a nonvolatile memory device having such a crosspoint structure have been proposed (Patent Literatures (PTLs) 1 to 6 and Non-Patent Literature (NPL) 1, for instance).

CITATION LIST

Patent Literature

[PTL 1] Japanese Unexamined Patent Application Publication No. 2006-203098 (FIGS. 2 and 5)
[PTL 2] Japanese Unexamined Patent Application Publication No. 2005-311322 (FIG. 4)
[PTL 3] Japanese Unexamined Patent Application Publication No. 2006-514393
[PTL 4] Japanese Unexamined Patent Application Publication No. 2004-31948
[PTL 5] Japanese Unexamined Patent Application Publication No. 2007-165873 (FIGS. 5 and 9)
[PTL 6] International Patent Application Publication No. 2009/001534

Non Patent Literature

[NPL 1] Baek, I. G. et al., "Mufti-layer Cross-point Binary Oxide Resistive Memory (OxRRAM (registered trademark)) for Post-NAND Storage Application" IEDM2005 (IEEE International Electron Devices Meeting 2005), Dec. 5, 2005, pp. 769-772, Session 31 (FIGS. 7 and 11)

SUMMARY OF INVENTION

Technical Problem

There is a demand for simplifying the control of successive accesses when memory cells are successively accessed in a variable resistance nonvolatile memory device as described above.

An object of the present invention is to provide a variable resistance nonvolatile memory device which allows simple access control when successively assessing memory cells.

Solution to Problem

In order to achieve the above object, a variable resistance nonvolatile memory device according to an aspect of the present invention is a variable resistance nonvolatile memory device which includes memory cells each having a variable resistance element, a resistance state of which reversibly changes based on an electrical signal, the variable resistance nonvolatile memory device including: a substrate; bit lines in a plurality of layers which are stacked in a Z direction, and in which the bit lines extending in an X direction are aligned in a Y direction, the X and Y directions being directions orthogonal to each other on a plane parallel to a main surface of the substrate, the Z direction being a direction in which the layers are stacked above the main surface of the substrate; word lines in a plurality of layers which are stacked in the Z direction and formed at intervals between the layers of the bit lines, and in which the word lines extending in the Y direction are aligned in the X direction; a memory cell array having the memory cells formed at crosspoints of the bit lines in the layers and the word lines in the layers and interposed between the bit lines and the word lines, the memory cell array including a plurality of basic array planes aligned in the Y direction and each having memory cells which are included in the memory cells and are interposed between, among the bit lines in the layers, bit lines in the layers at a same position in the Y direction and the word lines crossing the bit lines at the same position; global bit lines provided in one-to-one correspondence with the basic array planes; sets provided in one-to-one correspondence with the basic array planes, and each including a first selection switch element and a second selection switch element; and a control unit configured to control an order of accessing the memory cells, wherein each of the basic array planes further includes a first via group interconnecting even-layer bit lines among the bit lines in the basic array plane, and a second via group interconnecting odd-layer bit lines among the bit lines in the basic array plane, for each of the basic array planes, the first via group in the basic array plane is connected to the global bit line corresponding to the basic array plane via one of the first selection switch element and the second selection switch element which are included in the set corresponding to the basic array plane, and the second via group in the basic array plane is connected to the corresponding global bit line via the other of the first selection switch element and the second selection switch element which are included in the corresponding set, when one of the basic array planes is a first basic array plane, and a different one of the basic array planes is a second basic array plane, the different one being adjacent to the first basic array plane in the Y direction, the first via group in the first basic array plane and the second via group in the second basic array plane are adjacent to each other in the Y direction, and the second via group in the first basic array plane and the first via group in the second basic array plane are adjacent to each other in the Y direction, the first via group in the first basic array plane is connected to the global bit line corresponding to the first basic array plane via the first selection switch element corresponding to the first basic array plane, and the second via group in the first basic array plane is connected to the corresponding global bit line via the second selection switch element corresponding to the first basic array plane, and the second via group in the second basic array plane is connected to the global bit line corresponding to the second basic array plane via the first selection switch element corresponding to the second basic array plane, and the first via group in the second basic array plane is connected to the corresponding global bit line via the second selection switch element corresponding to the second basic array plane, in the sets corresponding to the basic array planes and each including the first selection switch element and the second selection switch element, electrical connection and disconnection of the first selection switch elements are controlled by a first common bit line selection signal, and electrical connection and disconnection of the second selection switch elements are controlled by a second common bit line selection signal, resistance states of the memory cells change to a first resistance state when a current flows through the memory cells in the Z direction, and change to a second resistance state different from the first resistance state when a current flows through the memory cells in a direction opposite to the Z direction, the control unit is configured to make a first access to a first memory cell connected to a first word line and a first bit line in the first basic array plane, and subsequently to the first access, select a second memory cell connected to the first word line and a second bit line in a basic array plane different from the first basic array plane and make a second access to the second memory cell, and the control unit is configured to select the second memory cell so that: a voltage applied to the first word line when the second access is made is the same as a voltage applied to the first word line when the first access is made; a voltage applied to the second bit line when the second access is made is the same as a voltage applied to the first bit line when the first access is made; and a direction in which a current flows through the first memory cell by the first access is the same as a direction in which a current flows through the second memory cell by the second access.

It should be noted that these general and specific aspects may be implemented using a system, a method, an integrated circuit, a computer program, a computer-readable recording medium such as a CD-ROM, or any combination of systems, methods, integrated circuits, computer programs, and recording media.

Advantageous Effects of Invention

The present invention simplifies the control performed when successively accessing memory cells in a variable resistance nonvolatile memory device.

BRIEF DESCRIPTION OF DRAWINGS

FIG. 12A is a timing waveform diagram for general writing operation of the basic array plane group in FIG. 6.

DESCRIPTION OF EMBODIMENTS (Underlying Knowledge Forming Basis of the Present Invention)

As described in the Background Art section, various configurations have been proposed as nonvolatile memory devices having a crosspoint structure in which a variable resistance element is used.

PTL 1 discloses a nonvolatile memory device which includes bipolar type variable resistance elements as memory cells. PTL 1 discloses that a varistor, for example, is used for a diode of a memory cell, as a bi-directional non-linear element, in order to reduce a so-called leakage current that flows into unselected cells. PTL 1 also discloses the crosspoint structure.

PTL 2 discloses a nonvolatile memory device which includes a three-dimensional crosspoint variable resistance memory cell array having a multilayer structure.

NPL 1 discloses a memory cell structure having a combination of a variable resistance film and a unidirectional diode. NPL 1 also discloses a multilayer structure.

PTL 3 discloses a multilayer memory structure in which memory cells which include Zener diodes and variable resistance memory elements that can be rewritten to with a bipolar voltage are used.

PTL 4 discloses a multilayer memory structure in which memory cells including memory elements and unidirectional control elements are used.

Figure 22:
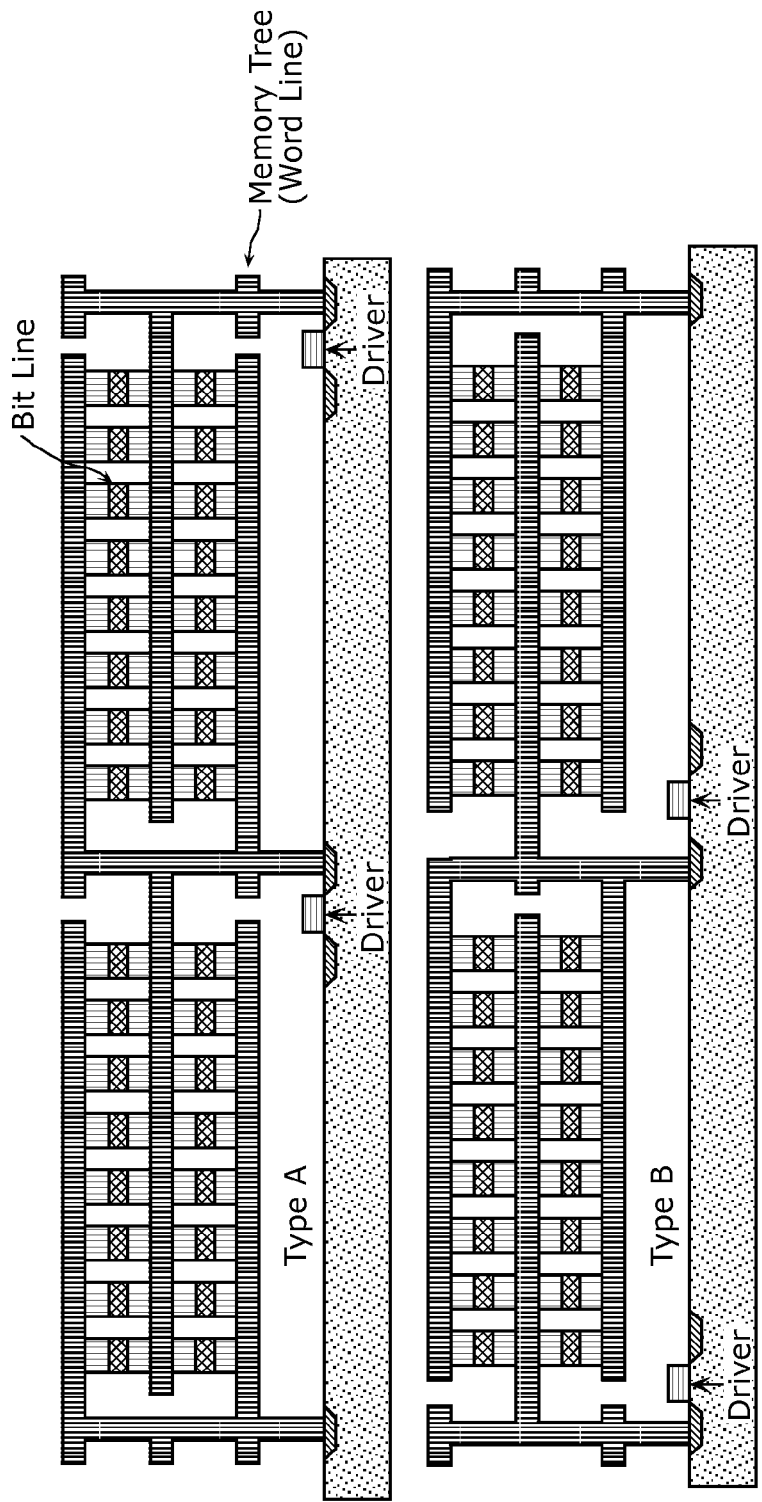
FIG. 22 is a cross-sectional view illustrating a configuration of a conventional basic array plane.

PTL 5 discloses a nonvolatile memory which has a three-dimensional structure, and includes memory cells having poly-silicon diodes and including variable-resistance memory elements (RRAMs (registered trademark) that can be rewritten to with a unipolar voltage. As illustrated in FIG. 22, PTL 5 discloses a word line structure in which odd-layer word lines and even-layer word lines within the same array plane are connected to different vertical lines (tree trunks). Here, odd-layer word lines and even-layer word lines in a certain array plane are connected to different drive circuits via drivers. Further, a driver which selects odd-layer word lines and a driver which selects even-layer word lines in a certain array plane, and a driver which selects odd-layer word lines and a driver which selects even-layer word lines in an array plane adjacent to the certain array plane are each controlled by different control signals. It should be noted that although PTL 5 discloses the case of word lines, such a structure can be applied to bit lines rather than word lines.

However, there is a problem that when a conventional nonvolatile memory device as described above is achieved as an integrated circuit, high integration is difficult due to an increase in the layout area therefor.

For example, in the structure described in PTL 5, a driver (selection switch) which selects odd-layer word lines and a driver (selection switch) which selects even-layer word lines within the same array plane are controlled by different control signals and connected to different drive circuits. Further, drivers (selection switches) in a certain array plane and those in an array plane adjacent to that array plane are controlled by different control signals and connected to different drive circuits. Therefore, four drivers (selection switches) are necessary for two array planes, and in addition, the four drivers (selection switches) need to be connected to different drive circuits, and one terminal of each of the drivers (selection switches) cannot be shared. Thus, the layout area for the drivers (selection switches) is increased, which results in a problem of difficulty in high integration of a nonvolatile memory device.

To address this problem, PTL 6 discloses that with a hierarchical bit line structure in which odd-layer bit lines and even-layer bit lines within the same array plane are connected to common contact vias, the contact vias to which the odd-layer bit lines and the even-layer bit lines are connected are further selected using selection switches, and one diffusion region of each of the selection switches is shared, thereby enabling suppression of an increase in a layout area. Furthermore, PTL 6 also discloses that gates of selection switches for odd-layer bit lines in a plurality of planes are commonly connected, and similarly gates of selection switches for even-layer bit lines are commonly connected, thereby constituting blocks, and accesses are made on a block-by-block basis, and thus the layout area can be reduced.

Here, in designing of a memory cell array in general, the area therefor is required to be decreased as much as possible, and bit lines and word lines are provided at minimum intervals allowed in the implementing process. However, since capacitive coupling between lines is greatly increased, a signal is transmitted to an unselected bit line or word line adjacent to the selected bit line and word line due to capacitive coupling, which exerts an influence on the behavior of a signal in the selected bit line and word line. With the structure disclosed in PTL 6 (FIG. 23), in a basic array plane group 400, the behavior of a signal in an unselected bit line adjacent to a selected bit line is different in the case of selecting a memory cell in an array plane located in an inner part of a block and in the case of selecting a memory cell in an array plane located at the end portion of the block, and thus even when the resistance value written in the memory cells is the same, there is a difference in the behavior of signals in selected lines depending on the position of the selected memory cells, and fluctuations in read speed occur, which is a problem (details of this operation will be described below). Accordingly, it is necessary to take one of the following measures, namely, designing a circuit with a margin for the fluctuation provided in the read speed and designing a layout with a margin provided in the wiring intervals between bit lines and in the wiring intervals between word lines.

The above problem can be addressed using a variable resistance nonvolatile memory device which includes memory cells each having a variable resistance element, a resistance state of which reversibly changes based on an electrical signal, the variable resistance nonvolatile memory device including: a substrate; bit lines in a plurality of layers which are stacked in a Z direction, and in which the bit lines extending in an X direction are aligned in a Y direction, the X and Y directions being directions orthogonal to each other on a plane parallel to a main surface of the substrate, the Z direction being a direction in which the layers are stacked above the main surface of the substrate; word lines in a plurality of layers which are stacked in the Z direction and formed at intervals between the layers of the bit lines, and in which the word lines extending in the Y direction are aligned in the X direction; a memory cell array having the memory cells formed at crosspoints of the bit lines in the layers and the word lines in the layers and interposed between the bit lines and the word lines, the memory cell array including a plurality of basic array planes aligned in the Y direction and each having memory cells which are included in the memory cells and are interposed between, among the bit lines in the layers, bit lines in the layers at a same position in the Y direction and the word lines crossing the bit lines at the same position; global bit lines provided in one-to-one correspondence with the basic array planes; and sets provided in one-to-one correspondence with the basic array planes, and each including a first selection switch element and a second selection switch element, wherein each of the basic array planes further includes a first via group interconnecting even-layer bit lines among the bit lines in the basic array plane, and a second via group interconnecting odd-layer bit lines among the bit lines in the basic array plane, for each of the basic array planes, the first via group in the basic array plane is connected to the global bit line corresponding to the basic array plane via one of the first selection switch element and the second selection switch element which are included in the set corresponding to the basic array plane, and the second via group in the basic array plane is connected to the corresponding global bit line via the other of the first selection switch element and the second selection switch element which are included in the corresponding set, when one of the basic array planes is a first basic array plane, and a different one of the basic array planes is a second basic array plane, the different one being adjacent to the first basic array plane in the Y direction, the first via group in the first basic array plane and the second via group in the second basic array plane are adjacent to each other in the Y direction, and the second via group in the first basic array plane and the first via group in the second basic array plane are adjacent to each other in the Y direction, the first via group in the first basic array plane is connected to the global bit line corresponding to the first basic array plane via the first selection switch element corresponding to the first basic array plane, and the second via group in the first basic array plane is connected to the corresponding global bit line via the second selection switch element corresponding to the first basic array plane, and the second via group in the second basic array plane is connected to the global bit line corresponding to the second basic array plane via the first selection switch element corresponding to the second basic array plane, and the first via group in the second basic array plane is connected to the corresponding global bit line via the second selection switch element corresponding to the second basic array plane, and in the sets corresponding to the basic array planes and each including the first selection switch element and the second selection switch element, electrical connection and disconnection of the first selection switch elements are controlled by a first common bit line selection signal, and electrical connection and disconnection of the second selection switch elements are controlled by a second common bit line selection signal.

Here, in the variable resistance nonvolatile memory device having the above configuration, when successively accessing memory cells in a certain area in a memory cell array while incrementing an address, memory cells connected to the same word line are successively accessed by merely changing selection of a global bit line, in general. Specifically, for example, if an access is made to a memory cell connected to a first word line and an even-layer bit line in a first basic array plane in a first cycle of access operation, in a second cycle following the first cycle, an access is made to a memory cell connected to the first word line and an odd-layer bit line in a second basic array plane adjacent to the first basic array plane in a Y direction. Specifically, accesses are made one by one to memory cells connected to the same word line in adjacent basic array planes.

However, with the accessing method, if a first potential is applied to a bit line and a second potential lower than the first potential is applied to a word line in each cycle, a voltage is applied in a direction from the even-layer bit line to the first word line in the first cycle, whereas a voltage is applied in a direction from the odd-layer bit line to the first word line in the following second cycle. Specifically, a direction in which voltage is applied to a memory cell is reversed for each cycle. Consequently, if a voltage is applied to a memory cell in the first basic array plane in the first cycle in a direction for causing the memory cell to have high resistance, a voltage is applied to a memory cell in the adjacent second basic array plane in the second cycle in a direction for causing the memory cell to have low resistance state.

Thus, in order to successively perform operation of writing to memory cells (causing memory cells to have low resistance), in the first cycle, the first potential is applied to a bit line and the second potential lower than the first potential is applied to a word line, whereas in the following second cycle, the second potential is applied to a bit line and the first potential is applied to the word line. Accordingly, it is necessary to change the potential relation between a word line and a bit line in each cycle as in the above manner, and thus the control of applying voltages to a bit line and a word line becomes complicated, which is a problem.

Further, depending on a feature of a memory cell, it may be necessary to apply different voltages when causing a variable resistance element to have high resistance and to have low resistance. In a memory cell array which includes memory cells having such a feature, it is necessary to apply different potentials to a bit line and a word line, and thus the control of applying voltages to a bit line and a word line becomes still more complicated, and in addition, power consumption for control increases, which leads to a problem.

In view of the above, an object of the present invention is to provide a nonvolatile memory device which includes a variable resistance nonvolatile memory element and allows successive accesses to memory cells in a certain area in a memory cell array while incrementing an address, without changing potentials applied to a word line and a bit line in each cycle.

In order to achieve the above object, a variable resistance nonvolatile memory device according to an aspect of the present invention is a variable resistance nonvolatile memory device which includes memory cells each having a variable resistance element, a resistance state of which reversibly changes based on an electrical signal, the variable resistance nonvolatile memory device including: a substrate; bit lines in a plurality of layers which are stacked in a Z direction, and in which the bit lines extending in an X direction are aligned in a Y direction, the X and Y directions being directions orthogonal to each other on a plane parallel to a main surface of the substrate, the Z direction being a direction in which the layers are stacked above the main surface of the substrate; word lines in a plurality of layers which are stacked in the Z direction and formed at intervals between the layers of the bit lines, and in which the word lines extending in the Y direction are aligned in the X direction; a memory cell array having the memory cells formed at crosspoints of the bit lines in the layers and the word lines in the layers and interposed between the bit lines and the word lines, the memory cell array including a plurality of basic array planes aligned in the Y direction and each having memory cells which are included in the memory cells and are interposed between, among the bit lines in the layers, bit lines in the layers at a same position in the Y direction and the word lines crossing the bit lines at the same position; global bit lines provided in one-to-one correspondence with the basic array planes; sets provided in one-to-one correspondence with the basic array planes, and each including a first selection switch element and a second selection switch element; and a control unit configured to control an order of accessing the memory cells, wherein each of the basic array planes further includes a first via group interconnecting even-layer bit lines among the bit lines in the basic array plane, and a second via group interconnecting odd-layer bit lines among the bit lines in the basic array plane, for each of the basic array planes, the first via group in the basic array plane is connected to the global bit line corresponding to the basic array plane via one of the first selection switch element and the second selection switch element which are included in the set corresponding to the basic array plane, and the second via group in the basic array plane is connected to the corresponding global bit line via the other of the first selection switch element and the second selection switch element which are included in the corresponding set, when one of the basic array planes is a first basic array plane, and a different one of the basic array planes is a second basic array plane, the different one being adjacent to the first basic array plane in the Y direction, the first via group in the first basic array plane and the second via group in the second basic array plane are adjacent to each other in the Y direction, and the second via group in the first basic array plane and the first via group in the second basic array plane are adjacent to each other in the Y direction, the first via group in the first basic array plane is connected to the global bit line corresponding to the first basic array plane via the first selection switch element corresponding to the first basic array plane, and the second via group in the first basic array plane is connected to the corresponding global bit line via the second selection switch element corresponding to the first basic array plane, and the second via group in the second basic array plane is connected to the global bit line corresponding to the second basic array plane via the first selection switch element corresponding to the second basic array plane, and the first via group in the second basic array plane is connected to the corresponding global bit line via the second selection switch element corresponding to the second basic array plane, in the sets corresponding to the basic array planes and each including the first selection switch element and the second selection switch element, electrical connection and disconnection of the first selection switch elements are controlled by a first common bit line selection signal, and electrical connection and disconnection of the second selection switch elements are controlled by a second common bit line selection signal, resistance states of the memory cells change to a first resistance state when a current flows through the memory cells in the Z direction, and change to a second resistance state different from the first resistance state when a current flows through the memory cells in a direction opposite to the Z direction, the control unit is configured to make a first access to a first memory cell connected to a first word line and a first bit line in the first basic array plane, and subsequently to the first access, select a second memory cell connected to the first word line and a second bit line in a basic array plane different from the first basic array plane and make a second access to the second memory cell, and the control unit is configured to select the second memory cell so that: a voltage applied to the first word line when the second access is made is the same as a voltage applied to the first word line when the first access is made; a voltage applied to the second bit line when the second access is made is the same as a voltage applied to the first bit line when the first access is made; and a direction in which a current flows through the first memory cell by the first access is the same as a direction in which a current flows through the second memory cell by the second access.

Accordingly, when successive accesses are made to memory cells in a certain area in a memory cell array while incrementing an address, it is not necessary to change potentials applied to a word line and a bit line in each cycle of access operation, and thus it is possible to simplify a control circuit. In addition, it is not necessary to change potentials applied to a bit line and a word line in each cycle, and thus power consumption can be reduced.

Furthermore, as the variable resistance nonvolatile memory device according to another aspect of the present invention, the control unit is configured to select the second memory cell connected to the first word line and the second bit line in a third basic array plane which is the basic array plane different from the first basic array plane and adjacent to the second basic array plane in the Y direction, and make the second access to the second memory cell.

Accordingly, the need for changing potentials applied to a word line and a bit line in each cycle is eliminated by merely changing the order of selecting a global bit line, and thus, it is possible to simplify a control circuit.

Furthermore, as another aspect, the control unit is configured to select the second memory cell connected to the first word line and the second bit line in the second basic array plane, and make the second access to the second memory cell.

Accordingly, the need for changing potentials applied to a word line and a bit line in each cycle is eliminated by merely adding switching selection switch elements. Thus, it is possible to simplify a control circuit.

Furthermore, a feature of the present invention is, as an accessing method for a variable resistance nonvolatile memory device, an accessing method for a variable resistance nonvolatile memory device which includes memory cells each having a variable resistance element, a resistance state of which reversibly changes based on an electrical signal, the variable resistance nonvolatile memory device including: a substrate; bit lines in a plurality of layers which are stacked in a Z direction, and in which the bit lines extending in an X direction are aligned in a Y direction, the X and Y directions being directions orthogonal to each other on a plane parallel to a main surface of the substrate, the Z direction being a direction in which the layers are stacked above the main surface of the substrate; word lines in a plurality of layers which are stacked in the Z direction and formed at intervals between the layers of the bit lines, and in which the word lines extending in the Y direction are aligned in the X direction; a memory cell array having the memory cells formed at crosspoints of the bit lines in the layers and the word lines in the layers and interposed between the bit lines and the word lines, the memory cell array including a plurality of basic array planes aligned in the Y direction and each having memory cells which are included in the memory cells and are interposed between, among the bit lines in the layers, bit lines in the layers at a same position in the Y direction and the word lines crossing the bit lines at the same position; global bit lines provided in one-to-one correspondence with the basic array planes; and sets provided in one-to-one correspondence with the basic array planes, and each including a first selection switch element and a second selection switch element, wherein each of the basic array planes further includes a first via group interconnecting even-layer bit lines among the bit lines in the basic array plane, and a second via group interconnecting odd-layer bit lines among the bit lines in the basic array plane, for each of the basic array planes, the first via group in the basic array plane is connected to the global bit line corresponding to the basic array plane via one of the first selection switch element and the second selection switch element which are included in the set corresponding to the basic array plane, and the second via group in the basic array plane is connected to the corresponding global bit line via the other of the first selection switch element and the second selection switch element which are included in the corresponding set, when one of the basic array planes is a first basic array plane, and a different one of the basic array planes is a second basic array plane, the different one being adjacent to the first basic array plane in the Y direction, the first via group in the first basic array plane and the second via group in the second basic array plane are adjacent to each other in the Y direction, and the second via group in the first basic array plane and the first via group in the second basic array plane are adjacent to each other in the Y direction, the first via group in the first basic array plane is connected to the global bit line corresponding to the first basic array plane via the first selection switch element corresponding to the first basic array plane, and the second via group in the first basic array plane is connected to the corresponding global bit line via the second selection switch element corresponding to the first basic array plane, and the second via group in the second basic array plane is connected to the global bit line corresponding to the second basic array plane via the first selection switch element corresponding to the second basic array plane, and the first via group in the second basic array plane is connected to the corresponding global bit line via the second selection switch element corresponding to the second basic array plane, in the sets corresponding to the basic array planes and each including the first selection switch element and the second selection switch element, electrical connection and disconnection of the first selection switch elements are controlled by a first common bit line selection signal, and electrical connection and disconnection of the second selection switch elements are controlled by a second common bit line selection signal, and resistance states of the memory cells change to a first resistance state when a current flows through the memory cells in the Z direction, and change to a second resistance state different from the first resistance state when a current flows through the memory cells in a direction opposite to the Z direction, the accessing method including: (a) making a first access to a first memory cell connected to a first word line and a first bit line in the first basic array plane; and subsequently (b) selecting a second memory cell connected to the first word line and a second bit line in a basic array plane different from the first basic array plane and making a second access to the second memory cell, wherein the second memory cell is selected so that: a voltage applied to the first word line in step (b) is the same as a voltage applied to the first word line in step (a); a voltage applied to the second bit line in step (b) is the same as a voltage applied to the first bit line in step (a); and a direction in which a current flows through the first memory cell in step (a) is the same as a direction in which a current flows through the second memory cell in step (b).

Furthermore, according to the accessing method according to another aspect, in step (b), the second memory cell is selected which is connected to the first word line and the second bit line in a third basic array plane which is the basic array plane different from the first basic array plane and adjacent to the second basic array plane in the Y direction, and the second access is made to the second memory cell.

Furthermore, according to the accessing method according to still another aspect, in step (b), the second memory cell is selected which is connected to the first word line and the second bit line in the second basic array plane, and the second access is made to the second memory cell.

It should be noted that according to the variable resistance nonvolatile memory device according to an aspect of the present invention, for each of the basic array planes, the first via group in the basic array plane connects all the even-layer bit lines in the basic array plane using a single via, and the second via group in the basic array plane connects all the odd-layer bit lines in the basic array plane using a single via, the even-layer bit lines being adjacent in the Z direction with the odd-layer bit lines in the basic array plane interposed, the odd-layer bit lines being adjacent in the Z direction with the even-layer bit lines in the basic array plane interposed.

It should be noted that the variable resistance nonvolatile memory device according to an aspect of the present invention further includes, for each of the basic array planes, a current limiting circuit between the global bit line corresponding to the basic array plane and terminals, one of the terminals being a terminal of the first selection switch element corresponding to the basic array plane and the other of the terminals being a terminal of the second selection switch element corresponding to the basic array plane.

It should be noted that the variable resistance nonvolatile memory device according to an aspect of the present invention further includes: a global bit line decoder/driver which selects at least one of the global bit lines, and applies a read voltage to the at least one selected global bit line; a read circuit which reads the resistance state of a memory cell in the basic array plane corresponding to the at least one global bit line selected by the global bit line decoder/driver; and a control circuit which controls the global bit line decoder/driver, wherein when an operation of reading from a memory cell in the first basic array plane is performed, the control circuit controls the global bit line decoder/driver to prevent an operation of reading from a memory cell in the second basic array plane from being simultaneously performed.

It should be noted that according to the variable resistance nonvolatile memory device according to an aspect of the present invention, when the operation of reading from the memory cell in the first basic array plane is performed, the control circuit further controls the global bit line decoder/driver to cause an operation of reading from a memory cell in a third basic array plane to be simultaneously performed, the third basic array plane not being adjacent to the first basic array plane in the Y direction.

It should be noted that these general and specific aspects may be implemented using a system, a method, an integrated circuit, a computer program, a computer-readable recording medium such as a CD-ROM, or any combination of systems, methods, integrated circuits, computer programs, and recording media.

In the following, a detailed description is given of an embodiment of a variable resistance nonvolatile memory device according to the present invention, with reference to drawings.

It should be noted that each embodiment described below shows a general or specific example. The numerical values, shapes, materials, constituent elements, the arrangement and connection of the constituent elements, steps, the processing order of the steps and the like described in the following embodiment are mere examples, and thus do not limit the scope of the appended Claims and their equivalents. Therefore, among the constituent elements in the following embodiment, constituent elements not recited in any of the independent claims defining the most generic part of the inventive concept are described as arbitrary constituent elements.

<Configuration of Variable Resistance Nonvolatile Memory Device According to the Present Invention>

Figure 1:
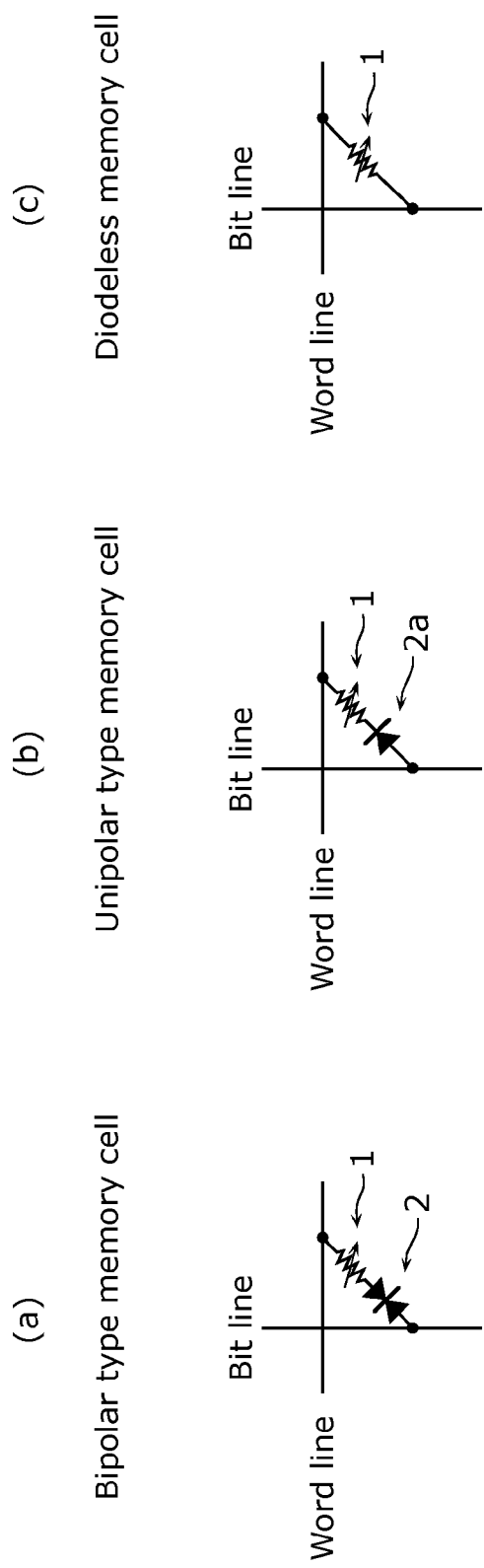
FIG. 1 Part (a) of FIG. 1 is a circuit diagram illustrating a memory cell in an embodiment of the present invention, (b) of FIG. 1 is a circuit diagram illustrating a unidirectional memory cell, and (c) of FIG. 1 is a circuit diagram illustrating a diodeless memory cell.

Part (a) of FIG. 1 is a circuit diagram of a memory cell (crosspoint memory cell) included in a variable resistance nonvolatile memory device in the present embodiment. As illustrated in (a) of FIG. 1, in the present embodiment, bipolar type memory cells are assumed to be used whose resistance value changes due to application of voltages or currents that are of different polarities and greater than or equal to a predetermined threshold value. Each bipolar type memory cell includes a variable resistance nonvolatile memory element 1 whose resistance changes due to bi-directional current or voltage application (hereinafter, also referred to as variable resistance element 1) and a bi-directional diode element 2 connected to the variable resistance element 1 in series. The variable resistance element 1 can be at least in a low resistance state and a high resistance state, and store information therein according to a reversible change in the resistance value (resistance state) based on an applied electrical signal. Specifically, the variable resistance element 1 has a property of changing its state to the high resistance state when an absolute value of a voltage applied to the variable resistance element 1 in the low resistance state exceeds a first predetermined voltage, and changing its state to the low resistance state when an absolute value of a voltage applied to the variable resistance element 1 in the high resistance state in a direction opposite (reverse polarity) to the direction in which the first voltage is applied (application polarity) exceeds a second predetermined voltage. The bi-directional diode element 2 has a non-linear current characteristic with respect to an applied voltage and is bi-directional, thus allowing a current to flow bi-directionally (into a positive voltage region and a negative voltage region).

Figure 2:
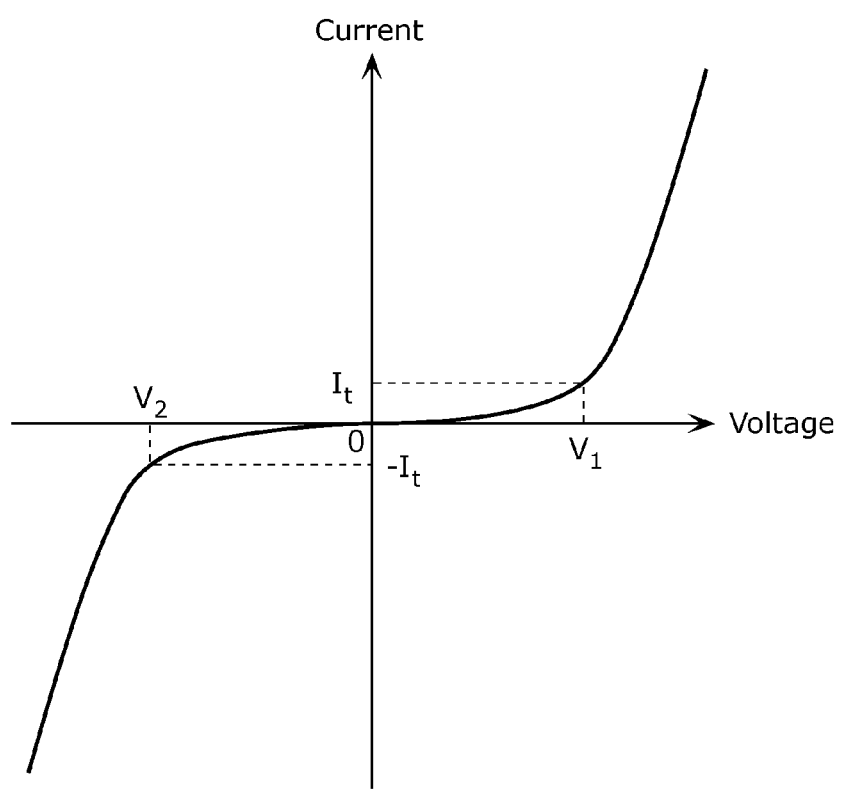
FIG. 2 is a graph illustrating an example of a voltage-current characteristic of a bi-directional diode element.

FIG. 2 illustrates an example of a voltage-current characteristic of the bi-directional diode element 2. It ($>0$) represents a predetermined current value for determining a threshold voltage, V1 represents a first threshold voltage (positive threshold voltage), and V2 represents a second threshold voltage (negative threshold voltage). As illustrated in FIG. 2, this characteristic is nonlinear, and a resistance is high in a region in which voltage V satisfies V2<V<V1, which substantially prevents a current from flowing. At this time, assuming that a current which flows through the bi-directional diode element 2 is I, I satisfies the following relationship: $-It<I<It$. In contrast, in a region in which voltage V satisfies V≤V2 or V1≤V, a resistance value falls rapidly, which allows a large current to flow. At this time, It≤I is satisfied in a region in which V1≤V, and I≤−It is satisfied in a region in which V≤V2.

Here, a threshold voltage means a voltage applied when a predetermined current flows. A predetermined current here has a value which can be arbitrarily determined in order to determine a threshold voltage, and is determined according to a characteristic of an element controlled by a diode and a characteristic of a diode. Normally, a current at the point in time when a state in which a current does not substantially flow is shifted to a state in which a large current flows is determined as a threshold current.

It should be noted that although the magnitude of a current at the time of positive voltage and the magnitude of a current at the time of negative voltage are illustrated to have origin symmetry in FIG. 2, these do not necessarily need to be symmetrical. For example |V1| may be smaller than |V2|, or |V2| may be smaller than |V1|.

A memory element is achieved using a bipolar type memory cell provided between a bit line and a word line.

It should be noted that a unipolar type memory cell including the variable resistance element 1 and a unidirectional diode element 2*a* as illustrated in (b) of FIG. 1 or a diodeless memory cell including only the variable resistance element 1 as illustrated in (c) of FIG. 1 can be adopted as a configuration of a memory cell included in a variable resistance nonvolatile memory device according to the present invention.

Here, one terminal of the variable resistance element is connected to a bit line, the other terminal of the variable resistance element and one terminal of the diode element are connected to each other, and the other terminal of the diode element is connected to a word line in (a) and (b) of FIG. 1; however, one terminal of the variable resistance element may be connected to a word line, the other terminal of the variable resistance element and one terminal of the diode element may be connected to each other, and the other terminal of the diode element may be connected to a bit line.

Figure 3:
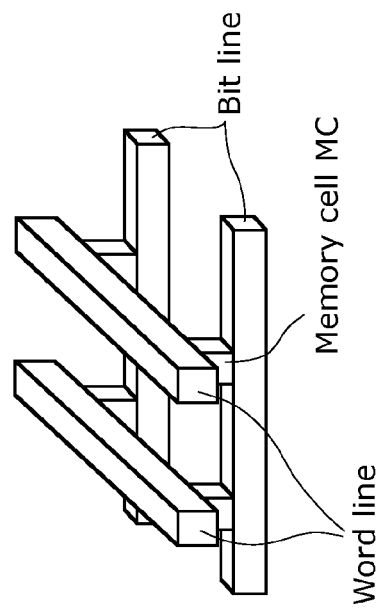
FIG. 3 Part (a) of FIG. 3 is a diagram illustrating a single-layer crosspoint structure, and (b) of FIG. 3 is a diagram illustrating a multilayer crosspoint structure.
Figure 3:
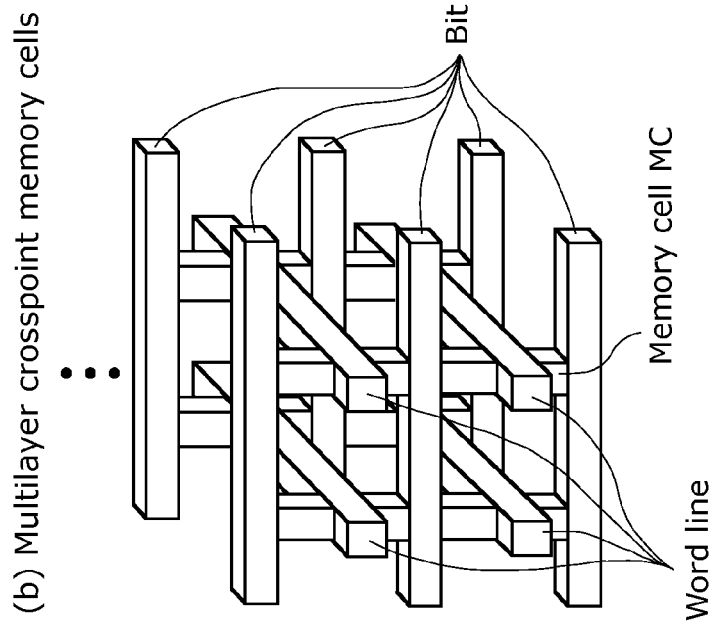

Parts (a) and (b) of FIG. 3 are conceptual diagrams illustrating a three-dimensional structure including memory cells. Part (a) of FIG. 3 illustrates a three-dimensional structure which includes so-called single-layer crosspoint memory cells, and in which each memory cell MC is placed at a different one of crosspoints between bit lines and word lines which are orthogonally arranged so as to be interposed between one of the bit lines and one of the word lines. Part (b) of FIG. 3 illustrates a three-dimensional structure which includes so-called multilayer crosspoint memory cells, and in which the single-layer crosspoint memory cells in (a) of FIG. 3 are stacked.

Figure 4:
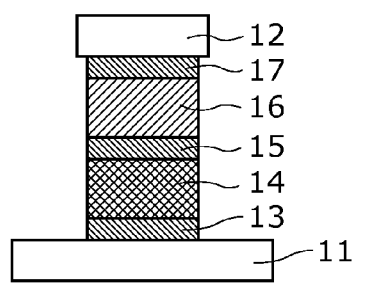
FIG. 4 Parts (a) to (d) of FIG. 4 illustrate examples of cross-sectional structures of memory cells in the embodiment of the present invention, and (e) of FIG. 4 illustrates an example of a cross-sectional structure of the diodeless memory cell in (c) of FIG. 1.
Figure 4:
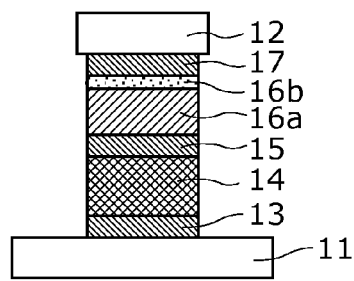
Figure 4:
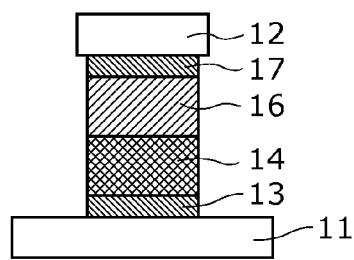
Figure 4:
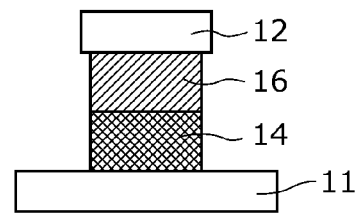
Figure 4:
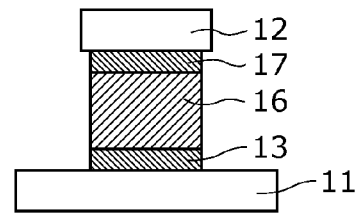

Part (a) of FIG. 4 illustrates an example of the cross-sectional structure of various memory cells in the present embodiment. In (a) of FIG. 4, one of a lower line 11 and an upper line 12 is a bit line, and the other is a word line. Further, a lower electrode 13, a diode layer 14, an internal electrode 15, a variable resistance layer 16, and an upper electrode 17 are formed between the lower line 11 and the upper line 12, in this stated order. Specifically, in the configuration in (a) of FIG. 4, the bi-directional diode element 2 includes the lower electrode 13, the diode layer 14, and the internal electrode 15, and the variable resistance element 1 includes the internal electrode 15, the variable resistance layer 16, and the upper electrode 17.

The variable resistance layer 16 is a layer which is interposed between the internal electrode 15 and the upper electrode 17, and a resistance value of which reversibly changes based on an electrical signal given between the internal electrode 15 and the upper electrode 17. The resistance state thereof reversibly transitions between the low resistance state and the high resistance state, according to the polarity of a voltage applied across the internal electrode 15 and the upper electrode 17, for example.

It should be noted that an oxygen-deficient metal oxide can be used for the variable resistance layer 16. When a tantalum oxide is used as the transition metal oxide, the stoichiometric composition of a tantalum oxide is $Ta_2O_5$, and thus if the composition thereof is expressed by $TaO_x$, $0<x<2.5$ needs to be satisfied. Specifically, the oxygen content needs to be lower than that of $Ta_2O_5$, which is the stoichiometric composition. The $TaO_x$ film according to the present embodiment may satisfy $0.8 \leq x \leq 1.9$.

A hafnium oxide or a zirconium oxide can be used as another transition metal oxide. When the composition of a hafnium oxide is expressed by $HfO_x$, at least $0<x<2.0$ needs to be satisfied. Furthermore, $0.9 \leq x \leq 1.6$ may be satisfied.

When the composition of a zirconium oxide is expressed by $ZrO_x$, at least $0<x<2.0$ needs to be satisfied. Furthermore, $0.9 \leq x \leq 1.4$ may be satisfied.

Part (b) of FIG. 4 illustrates another example of the cross-sectional structure of a memory cell in the present embodiment, where the variable resistance layer 16 has a stack structure. Specifically, the variable resistance layer 16 has a stack structure including a first variable resistance layer 16*a* and a second variable resistance layer 16*b*. Here, the second variable resistance layer 16*b* may have a higher oxygen content and be thinner than the first variable resistance layer 16*a*. In other words, the first variable resistance layer 16*a* comprises a first oxygen-deficient metal oxide 16*a*, and the second variable resistance layer 16*b* comprises a second metal oxide 16*b* having a lower oxygen deficiency than the first metal oxide. In the second variable resistance layer of a variable resistance element, a minute local region is formed, oxygen deficiency of which reversibly changes according to an application of an electrical pulse. It is considered that such a local region includes a filament formed by an oxygen defect site.

Here, "oxygen deficiency" means a proportion of oxygen that is insufficient for the amount of oxygen included in a stoichiometric metal oxide (a stoichiometric metal oxide having the highest resistance value if there are a plurality of stoichiometric metal oxides). A stoichiometric metal oxide is more stable and has a higher resistance value than a non-stoichiometric metal oxide.

For example, if metal is tantalum (Ta), the stoichiometric composition of tantalum oxide is $Ta_2O_5$ according to the above-mentioned definition, and thus can be represented by $TaO_{2.5}$. The oxygen deficiency of $TaO_{2.5}$ is 0%, whereas the oxygen deficiency of $TaO_{1.5}$ will be oxygen deficiency=(2.5−1.5)/2.5=40%. In addition, the oxygen deficiency of an oxygen-excess metal oxide has a negative value. It should be noted that a description is given in the present specification assuming that oxygen deficiency includes a positive value, 0, and even a negative value, unless otherwise specified.

An oxide having a low oxygen deficiency is relatively close to a stoichiometric oxide and thus has a great resistance value, whereas an oxide having a high oxygen deficiency is relatively close to a metal included in an oxide and thus has a small resistance value.

"Oxygen content" is a ratio of oxygen atoms to a total number of atoms. For example, an oxygen content of $Ta_2O_5$ corresponds to a ratio of oxygen atoms to a total number of atoms (O/(Ta+O)), and is 71.4 atm %. Thus, the oxygen content of an oxygen-deficient tantalum oxide will be higher than 0 and lower than 71.4 atm %. For example, if a metal included in the first metal oxide layer and a metal included in the second metal oxide layer are the same type of metal, there is a correspondence between an oxygen content and an oxygen deficiency. Specifically, if the oxygen content of the second metal oxide is higher than the oxygen content of the first metal oxide, the oxygen deficiency of the second metal oxide is lower than the oxygen deficiency of the first metal oxide.

For example, when a tantalum oxide is used, the stack structure includes a first tantalum oxide layer (composition: $TaO_x$) 16a and a second tantalum oxide layer (composition: $TaO_y$) 16b. Here, 0<x<2.5 and x<y may be satisfied. Furthermore, the second tantalum oxide layer ($TaO_y$) 16b may be in contact with the upper electrode 17, and have a thickness of 1 nm to 8 nm inclusive, and furthermore $0.8 \le x \le 1.9$ and $2.1 \le y$ may be satisfied.

Metal other than tantalum may be used as the metal included in the variable resistance layer 16. A transition metal or aluminum (Al) can be used as a metal included in the variable resistance layer 16. Tantalum (Ta), titanium (Ti), hafnium (Hf), zirconium (Zr), niobium (Nb), tungsten (W), nickel (Ni), and the like can be used as a transition metal. A transition metal can be in a plurality of oxidation states, and thus can achieve different resistance states by oxidation reduction reaction.

When a hafnium oxide is used for the variable resistance layer having a stack structure, the stack structure includes a first hafnium oxide layer (composition: $HfO_x$) 16a and a second hafnium oxide layer (composition: $HfO_y$) 16b. Here, 0<x<2.0 and x<y may be satisfied. Furthermore, the second hafnium oxide layer ($HfO_y$) 16b may be in contact with the upper electrode 17, and have a thickness of 3 nm to 4 nm inclusive, and furthermore $0.9 \le x \le 1.6$ and $1.8 < y$ may be satisfied.

When a zirconium oxide is used for the variable resistance layer having a stack structure, the stack structure includes a first zirconium oxide layer (composition: $ZrO_x$) 16a and a second zirconium oxide layer (composition: $ZrO_y$) 16b. Here, 0<x<2.0 and x<y may be satisfied. Furthermore, the second zirconium oxide layer ($ZrO_y$) 16b may be in contact with the upper electrode 17 and have a thickness of 1 nm to 5 nm inclusive, and $0.9 \le x \le 1.4$ and $1.9 < y$ may be satisfied.

In the variable resistance layer 16 having a stack structure, different types of metal may be used as a first metal included in the first metal oxide 16a and a second metal included in the second metal oxide 16b. In this case, the second metal oxide may have a lower oxygen deficiency than the first metal oxide, or in other words, have a higher resistance. With such a configuration, voltage applied across the first electrode and the second electrode in changing the resistance is distributed more to the second metal oxide, thereby causing an oxidation-reduction reaction in the second metal oxide to be more likely to occur.

In addition, when different materials are used for the first metal contained in the first metal oxide which forms the first variable resistance layer and the second metal contained in the second metal oxide which forms the second variable resistance layer, the second metal may have a lower standard electrode potential than the standard electrode potential of the first metal. A standard electrode potential represents a feature that the higher a standard electrode potential is, the less likely oxidization is to occur. Accordingly, an oxidation reduction reaction occurs easily in the second metal oxide having a relatively low standard electrode potential. It should be noted that a resistance change phenomenon is considered to be caused by a change in a resistance value (oxygen deficiency) of the second metal oxide having high resistance due to a filament (conducting path) being changed by an oxidation reduction reaction occurring in a minute local region formed in the second metal oxide.

For example, an oxygen-deficient tantalum oxide ($TaO_x$) is used as the first metal oxide, and a titanium oxide ($TiO_2$) is used as the second metal oxide, thereby achieving stable resistance change operation. Titanium (standard electrode potential=−1.63 eV) is a material whose standard electrode potential is lower than tantalum (standard electrode potential=−0.6 eV). In this way, an oxide of a metal whose standard electrode potential is lower than the first metal oxide is used for the second metal oxide, thereby allowing oxidation reduction reaction to more easily occur in the second metal oxide. As another combination, an aluminum oxide ($Al_2O_3$) can be used as the second metal oxide serving as a resistive layer. For example, an oxygen-deficient tantalum oxide ($TaO_x$) may be used as the first metal oxide, and an aluminum oxide ($Al_2O_3$) may be used as the second metal oxide.

The upper electrode 17 connected to the second metal oxide 16b having a lower oxygen deficiency comprises, for example, platinum (Pt), iridium (Ir), palladium (Pd), or the like, which is a material having a higher standard electrode potential than the metal included in the second metal oxide 16b and the material included in the internal electrode 15. In addition, the internal electrode 15 connected to the first metal oxide 16a having a higher oxygen deficiency may comprise, for example, tungsten (W), nickel (Ni), tantalum (Ta), titanium (Ti), aluminum (Al), tantalum nitride (TaN), titanium nitride (TiN), or the like, which is a material having a lower standard electrode potential than the metal included in the first metal oxide 16a. A standard electrode potential represents a feature that the greater the value of a standard electrode potential is, the less likely oxidization is to occur.

Specifically, a standard electrode potential V2 of the upper electrode 17, a standard electrode potential Vr2 of a metal included in the second metal oxide 16b, a standard electrode potential Vr1 of a metal included in the first metal oxide 16a, a standard electrode potential V1 of the internal electrode 15 may satisfy the relationship Vr2<V2 and V1<V. Furthermore, the relationship V2>Vr2 and Vr1≥V1 may be satisfied.

The above configuration selectively causes an oxidation reduction reaction in the second metal oxide 16b near an interface between the upper electrode 17 and the second metal oxide 16b, which leads to a stable resistance change phenomenon.

The diode layer 14 in the bi-directional diode element 2 can be formed using silicon nitride ($SiN_x$), for example.

Parts (c) and (d) of FIG. 4 illustrate other examples of the cross-sectional structure of memory cells in the present embodiment. The internal electrode 15 is excluded in (c) of FIG. 4, and in (d) of FIG. 4, the lower electrode 13 and the upper electrode 17 are further excluded, and the lower line 11 and the upper line 12 also serve as the lower electrode and the upper electrode, respectively. In the configuration in (c) of FIG. 4, the bi-directional diode element 2 includes the lower electrode 13, the diode layer 14, and the variable resistance layer 16 (also serving as the other electrode of the bi-directional diode element 2), and the variable resistance element 1 includes the diode layer 14 (also serving as the other electrode of the variable resistance element 1), the variable resistance layer 16, and the upper electrode 17. In the configuration in (d) of FIG. 4, the bi-directional diode element 2 includes the lower line 11, the diode layer 14, and the variable resistance layer 16 (also serving as the other electrode of the bi-directional diode element 2), and the variable resistance element 1 includes the diode layer 14 (also serving as the other electrode of the variable resistance element 1), the variable resistance layer 16, and the upper line 12.

The material which can be used is limited as the structure of a memory cell is further simplified.

Part (e) of FIG. 4 illustrates an example of the cross-sectional structure of the diodeless memory cell in (c) of FIG. 1. It should be noted that it is possible to form the variable resistance layer 16 in the stack structure in all of (c), (d), and (e) of FIG. 4, as in (b) of FIG. 4. It should be noted that although (a) to (e) of FIG. 4 each illustrate a structure in which the variable resistance element is disposed over the diode element, a configuration may be adopted in which the diode element is disposed over the variable resistance element.

Figure 5:
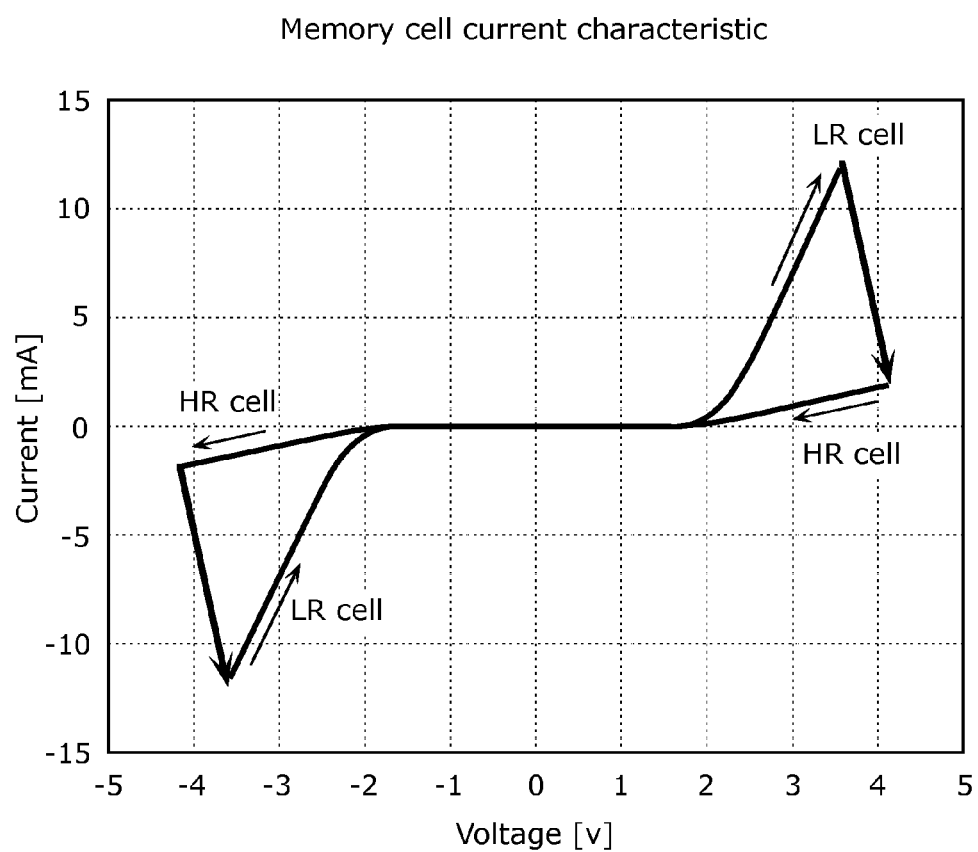
FIG. 5 is a graph illustrating a current-voltage relationship of a memory cell in the embodiment of the present invention.

FIG. 5 is a graph illustrating a current-voltage relationship of a memory cell in the present embodiment. The graph in FIG. 5 corresponds to the current-voltage characteristic of the memory cell in the circuit diagram of (a) of FIG. 1. In FIG. 5, the horizontal axis represents a voltage applied between a bit line and a word line, and the vertical axis represents a current which flows through a memory cell. Further, an "LR cell" illustrated in FIG. 5 indicates that a memory cell (more strictly, the variable resistance element in the memory cell) is in the low resistance state, and an "HR cell" indicates that a memory cell (more strictly, the variable resistance element in the memory cell) is in the high resistance state. As illustrated in FIG. 5, now assuming that a memory cell is in the low resistance state (LR cell), when a voltage applied to the memory cell increases and exceeds about "2 V", a current greatly increases. When the voltage further increases and becomes close to "4 V", the resistance value of the memory cell changes rapidly, and the memory cell enters the high resistance state (HR cell), and a current greatly decreases. On the other hand, when a voltage applied to the memory cell decreases and becomes lower than about "−4 V", the resistance value of the memory cell changes rapidly, the memory cell enters the low resistance state (LR cell), and a current greatly increases. In this way, a resistance change occurs bi-directionally for the polarities of the applied voltage.

Figure 6:
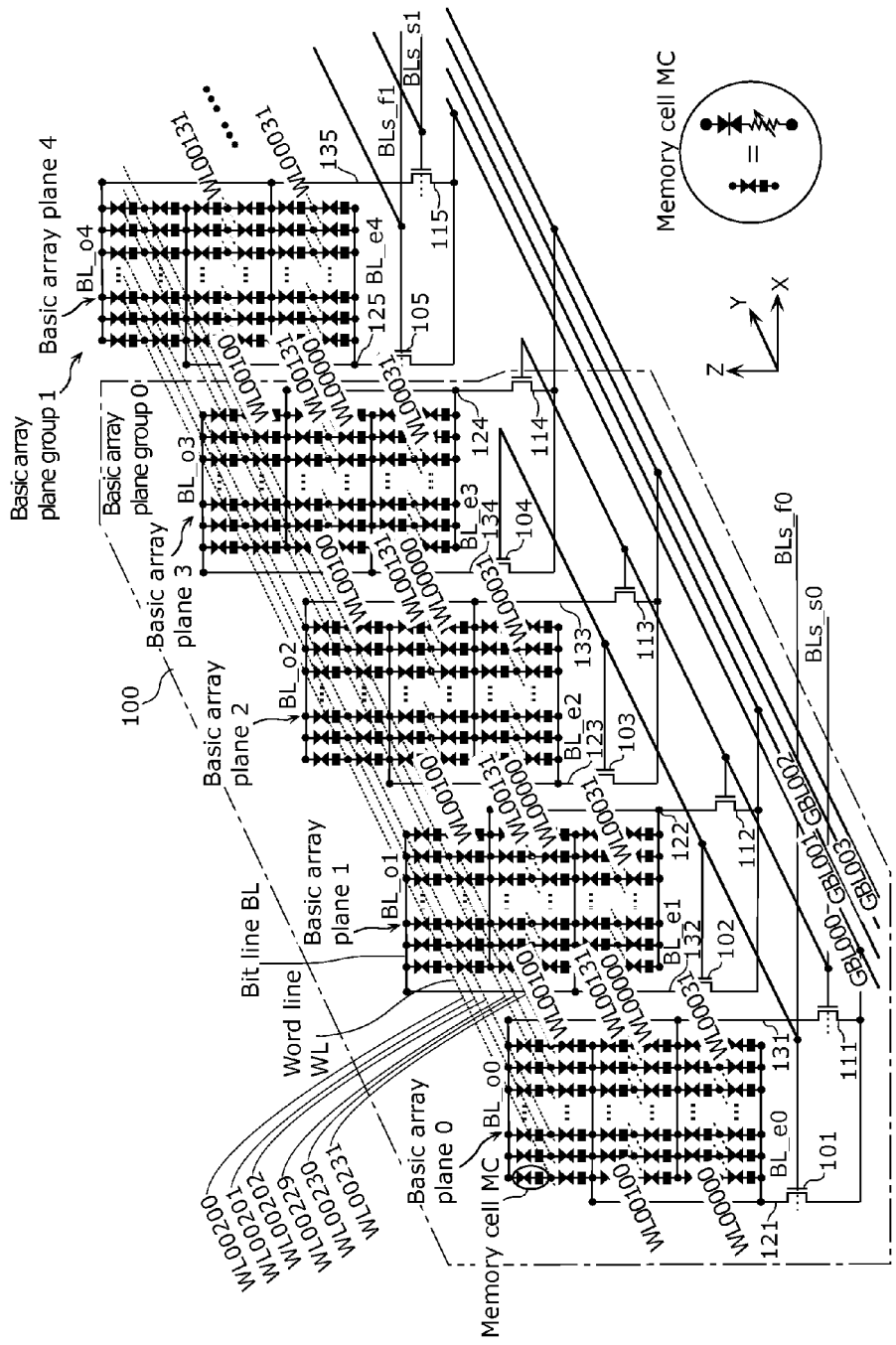
FIG. 6 is a circuit diagram illustrating an embodiment of a configuration of a basic array plane group according to the present invention.

FIG. 6 is a circuit diagram illustrating the configuration of a basic array plane group 100 in the variable resistance non-volatile memory device according to the present embodiment. In FIG. 6, the X direction is a direction in which bit lines (sub-bit lines) extend, the Y direction is a direction in which word lines extend, and the Z direction is a direction in which layers of the bit lines and the word lines are stacked. In other words, the X direction and the Y direction are directions orthogonal to each other on a plane parallel to the main surface of a substrate (not illustrated) serving as a base above which memory cells are formed, and the Z direction is a direction in which layers are stacked above the main surface of the substrate.

In FIG. 6, when each layer is a layer in which bit lines extending in the X direction are aligned in the Y direction, bit lines BL are formed in a plurality of layers (four layers in FIG. 6), whereas when each layer is a layer in which word lines extending in the Y direction are aligned in the X direction, word lines WL are formed in layers (three layers in FIG. 6) between the bit lines. Then, in the basic array plane group 100, each memory cell MC is formed at a different one of three-dimensional crosspoints between the bit lines BL and the word lines WL, so as to be interposed between one of the bit lines BL and one of the word lines WL. It should be noted that some of the memory cells MC and some of the word lines are omitted in the drawing for the sake of simplification.

For each group of bit lines BL in layers aligned in the Z direction (i.e., at the same position in the Y direction), one of basic array planes 0 to 3 is formed using memory cells MC which are formed between the bit lines BL and the word lines WL. The word lines WL are common in the basic array planes 0 to 3. In the example in FIG. 6, in each of the basic array planes 0 to 3, 32 memory cells MC are arranged in the X direction, and 6 memory cells MC are arranged in the Z direction. Further, the basic array plane group 100 includes the four basic array planes 0 to 3 aligned in the Y direction. Here, a basic array plane 4 included in another basic array plane group (basic array plane group 1) adjacent to the basic array plane group 100 (basic array plane group 0) is also illustrated in FIG. 6. It should be noted that the number of memory cells in each basic array plane and the number of basic array planes aligned in the Y direction are not limited to this example.

In the basic array planes 0 to 3, even-layer bit lines BL (BL_e0 to BL_e3) in the basic array planes are commonly connected via respective first via groups 121 to 124, whereas odd-layer bit lines BL (BL_o0 to BL_o3) are commonly connected via respective second via groups 131 to 134. It should be noted that as illustrated in FIG. 6, the "even-layer bit lines BL_e0" refer to bit lines in the second and fourth layers from the top layer among bit lines in four layers in the basic array plane 0, the "even-layer bit lines BL_e1" refer to bit lines in the second and fourth layers from the top layer among bit lines in four layers in the basic array plane 1, the "even-layer bit lines BL_e2" refer to bit lines in the second and fourth layers from the top layer among bit lines in four layers in the basic array plane 2, and the "even-layer bit lines BL_e3" refer to bit lines in the second and fourth layers from the top layer among bit lines in four layers in the basic array plane 3.

Also, the "odd-layer bit lines BL_o0" refer to bit lines in the first and third layers from the top layer among bit lines in four layers in the basic array plane 0, the "odd-layer bit lines BL_o1" refer to bit lines in the first and third layers from the top layer among bit lines in four layers in the basic array plane 1, the "odd-layer bit lines BL_o2" refer to bit lines in the first and third layers from the top layer among bit lines in four layers in the basic array plane 2, and the "odd-layer bit lines BL_o3" refer to bit lines in the first and third layers from the top layer among bit lines in four layers in the basic array plane 3.

Here, in the basic array planes 0 and 2, the first via groups 121 and 123 which commonly connect the even-layer bit lines BL (BL_e0 and BL_e2), respectively, are arranged on the left side in the basic array planes 0 and 2 when viewed in the Y direction, and the second via groups 131 and 133 which commonly connect the odd-layer bit lines BL (BL_o0 and BL_o2), respectively, are arranged on the right side in the basic array planes 0 and 2 when viewed in the Y direction. On the other hand, in the basic array planes 1 and 3, the first via groups 122 and 124 which commonly connect the even-layer bit lines BL (BL_e1 and BL_e3), respectively, are arranged on the right side in the basic array planes 1 and 3 when viewed in the Y direction, and the second via groups 132 and 134 which commonly connect the odd-layer bit lines BL (BL_o1 and BL_o3), respectively, are arranged on the left side in the basic array planes when viewed in the Y direction.

Furthermore, global bit lines GBL000 to GBL003 are formed to extend in the Y direction in one-to-one correspondence with the basic array planes 0 to 3. In addition, first selection switch elements 101 to 104 and second selection switch elements 111 to 114 are provided for the respective basic array planes 0 to 3. In FIG. 6, each of the first selection switch elements 101 to 104 and the second selection switch elements 111 to 114 includes an N-MOS transistor.

The gates of the first selection switch elements 101 to 104 are commonly connected, and the first selection switch elements 101 to 104 respectively control switching between electrical connection and disconnection of the global bit lines GBL000 to GBL003 related to (corresponding to) the basic array planes to/from the via groups 121, 132, 123, and 134 of the basic array planes, in accordance with a first bit line selection signal BLs_f0 supplied to the gates. The gates of the second selection switch elements 111 to 114 are commonly connected, and the second selection switch elements 111 to 114 respectively control switching between electrical connection and disconnection of the global bit lines GBL000 to GBL003 related to (corresponding to) the basic array planes to/from the via groups 131, 122, 133, and 124 of the basic array planes, in accordance with a second bit line selection signal BLs_s0 supplied to the gates.

This configuration achieves the above-described multilayer crosspoint structure of the variable resistance nonvolatile memory device according to the present embodiment. In addition, a hierarchical bit line system in which the bit lines BL and the global bit lines GBL are used is achieved. Furthermore, in each of the basic array planes 0 to 3, the number of the selection switch elements for achieving the hierarchical bit line system can be reduced to two by commonly connecting the even-layer bit lines BL and the odd-layer bit lines BL in the basic array plane via the first and second via groups, respectively. Accordingly, the basic array plane group of a small array size can be achieved, without increasing the layout area.

Further, with this configuration, in the basic array plane 0, the even-layer bit lines BL_e0 are connected to the first selection switch element 101 via the first via group 121, and the odd-layer bit lines BL_o0 are connected to the second selection switch element 111 via the second via group 131. In contrast, in the basic array plane 1 adjacent to the basic array plane 0 in the Y direction, the even-layer bit lines BL_e1 are connected to the second selection switch element 112 via the first via group 122, and the odd-layer bit lines BL_o1 are connected to the first selection switch element 102 via the second via group 132. Further, the gates of the first selection switch elements 101 to 104 in the basic array planes in the basic array plane group 100 are commonly connected, and electrical connection and disconnection are controlled by the first bit line selection signal BLs_f0 supplied to the gates. Similarly, the gates of the second selection switch elements 111 to 114 are commonly connected, and electrical connection and disconnection are controlled by the second bit line selection signal BLs_s0 supplied to the gates. Thus, when the first bit line selection signal BLs_f0 is selected, the first selection switch elements 101 to 104 will be in a connected state (turned ON). In the basic array plane 0, the even-layer bit lines BL_e0 are connected to the global bit line GBL000 via the first via group 121 and the first selection switch element 101, and the odd-layer bit lines BL_o0 are electrically disconnected from the global bit line GBL000, whereas in the basic array plane 1, the odd-layer bit lines BL_o1 are connected to the global bit line GBL001 via the second via group 132 and the first selection switch element 102, and the even-layer bit lines BL_e1 are electrically disconnected from the global bit line GBL001. The same as in the case of the basic array plane 0 applies to the basic array plane 2, and the same as in the case of the basic array plane 1 applies to the basic array plane 3.

Specifically, with this configuration, when the first bit line selection signal BLs_f0 for the basic array plane group 100 is selected, and even-layer bit lines in a certain basic array plane are connected to a corresponding global bit line, even-layer bit lines in two basic array planes adjacent to the basic array plane in the Y direction are electrically disconnected from respective global bit lines. It should be noted that a similar relationship to the above also holds for odd-layer bit lines, and furthermore this relationship always holds for any position of a basic array plane.

Figure 7:
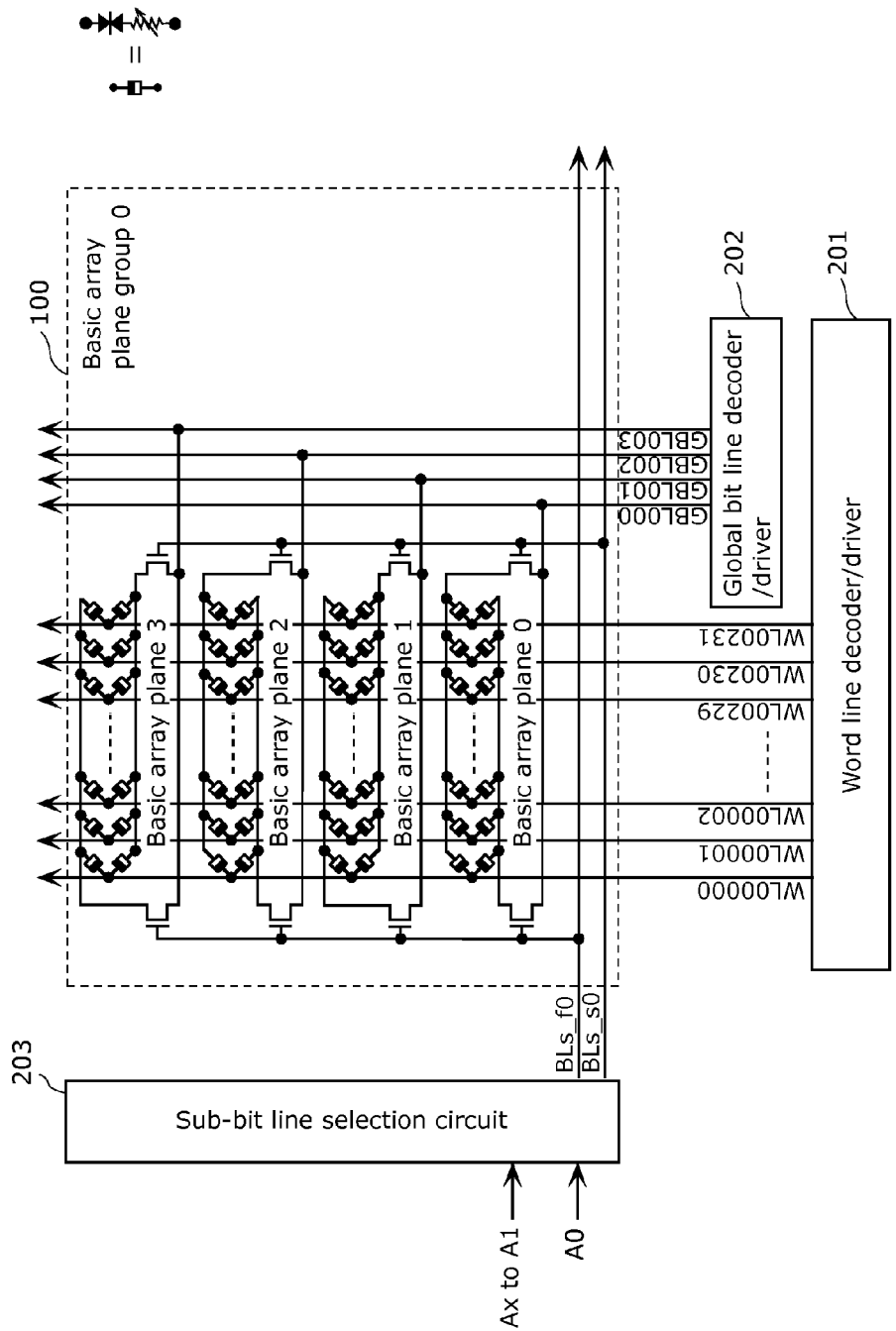
FIG. 7 is a circuit diagram illustrating the basic array plane group in FIG. 6 and its peripheral circuitry.

FIG. 7 is a circuit diagram illustrating the connecting relationship between the basic array plane group 100 in FIG. 6 and its peripheral circuitry. In FIG. 7, a global bit line decoder/driver 202 drives and controls the global bit lines GBL. Specifically, the global bit line decoder/driver 202 selects at least one of the global bit lines, and applies a read voltage to the at least one selected global bit line. A sub-bit line selection circuit 203 controls the first bit line selection signal BLs_f0 and the second bit line selection signal BLs_s0 according to address signals A0 to Ax. A word line decoder/driver 201 drives and controls the word lines WL.

Figure 8:
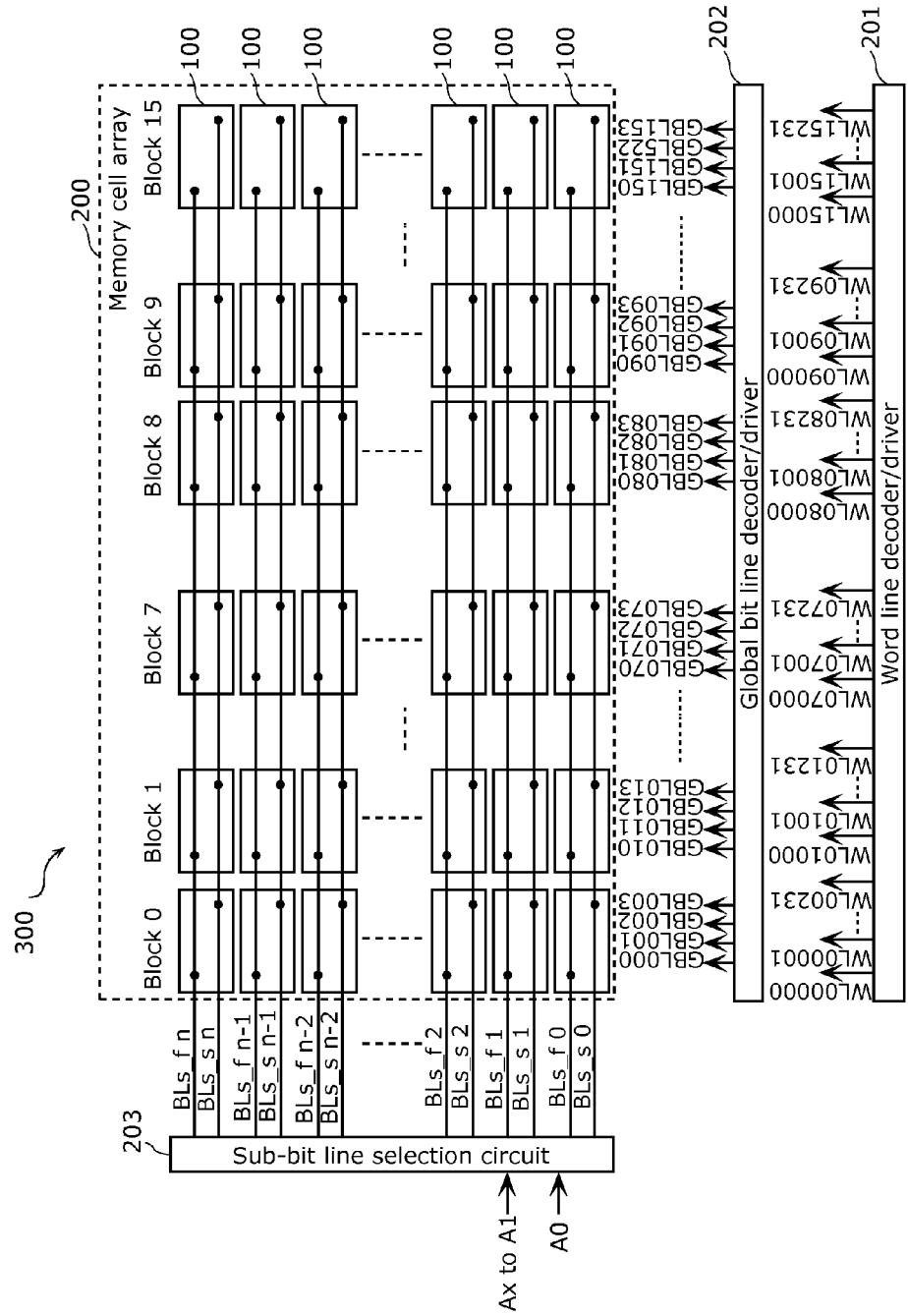
FIG. 8 is a circuit diagram illustrating a main part of a variable resistance nonvolatile memory device which includes a plurality of the basic array plane groups in FIG. 6.

FIG. 8 is a circuit diagram illustrating a main part 300 of the variable resistance nonvolatile memory device. As illustrated in FIG. 8, in the actual apparatus, a memory cell array 200 is formed by arranging a plurality of the basic array plane groups 100 illustrated in FIG. 6. In the example of FIG. 8, [(n+1)×16] basic array plane groups 100 are arranged. The word line decoder/driver 201 drives and controls word lines WL, and the global bit line decoder/driver 202 drives and controls global bit lines GBL. The sub-bit line selection circuit 203 controls first control signals BLs_f0 to BLs_fn and second control signals BLs_s0 to BLs_fn for the respective basic array plane groups 100 according to the address signals A0 to Ax.

Figure 9:
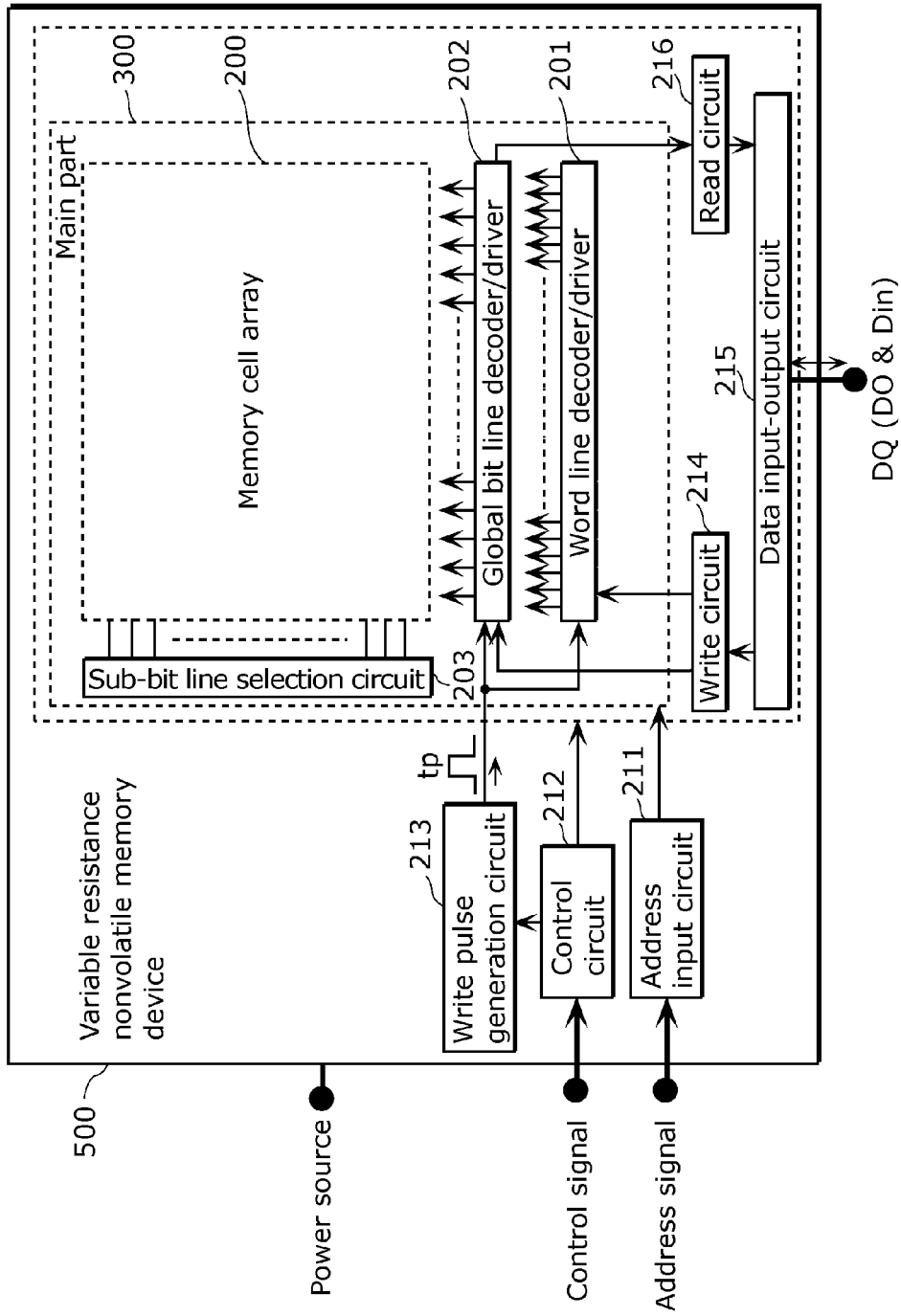
FIG. 9 is a circuit diagram illustrating an overall configuration of the variable resistance nonvolatile memory device according to the present invention.

FIG. 9 is a circuit diagram illustrating an overall configuration of a variable resistance nonvolatile memory device 500. In FIG. 9, the main part 300 corresponds to the configuration illustrated in FIG. 8.

In FIG. 9, an address input circuit 211 temporarily latches address signals from outside during an erase cycle (change to the high resistance state), a write cycle (change to the low resistance state), or a read cycle, and outputs the latched address signals to the sub-bit line selection circuit 203, the global bit line decoder/driver 202, and the word line decoder/driver 201. In response to a plurality of input signals, a control circuit 212 outputs a signal indicating a state in the erase cycle, the write cycle, the read cycle, or standby to the sub-bit line selection circuit 203, the global bit line decoder/driver 202, the word line decoder/driver 201, a write circuit 214, and a data input-output circuit 215, as a signal corresponding to each. Also, the control circuit 212 outputs an erase, write, or read pulse generating trigger signal in the erase, write, or read cycle to a write pulse generation circuit 213. The write pulse generation circuit 213 generates erase, write, or read time pulses in the erase, write, or read cycle during a given period (a period of tp_E, tp_W, or tp_R) and outputs the generated pulses to the global bit line decoder/driver 202 and the word line decoder/driver 201.

<Operation of Variable Resistance Nonvolatile Memory Device 500 According to Present Invention>

Figure 10A:
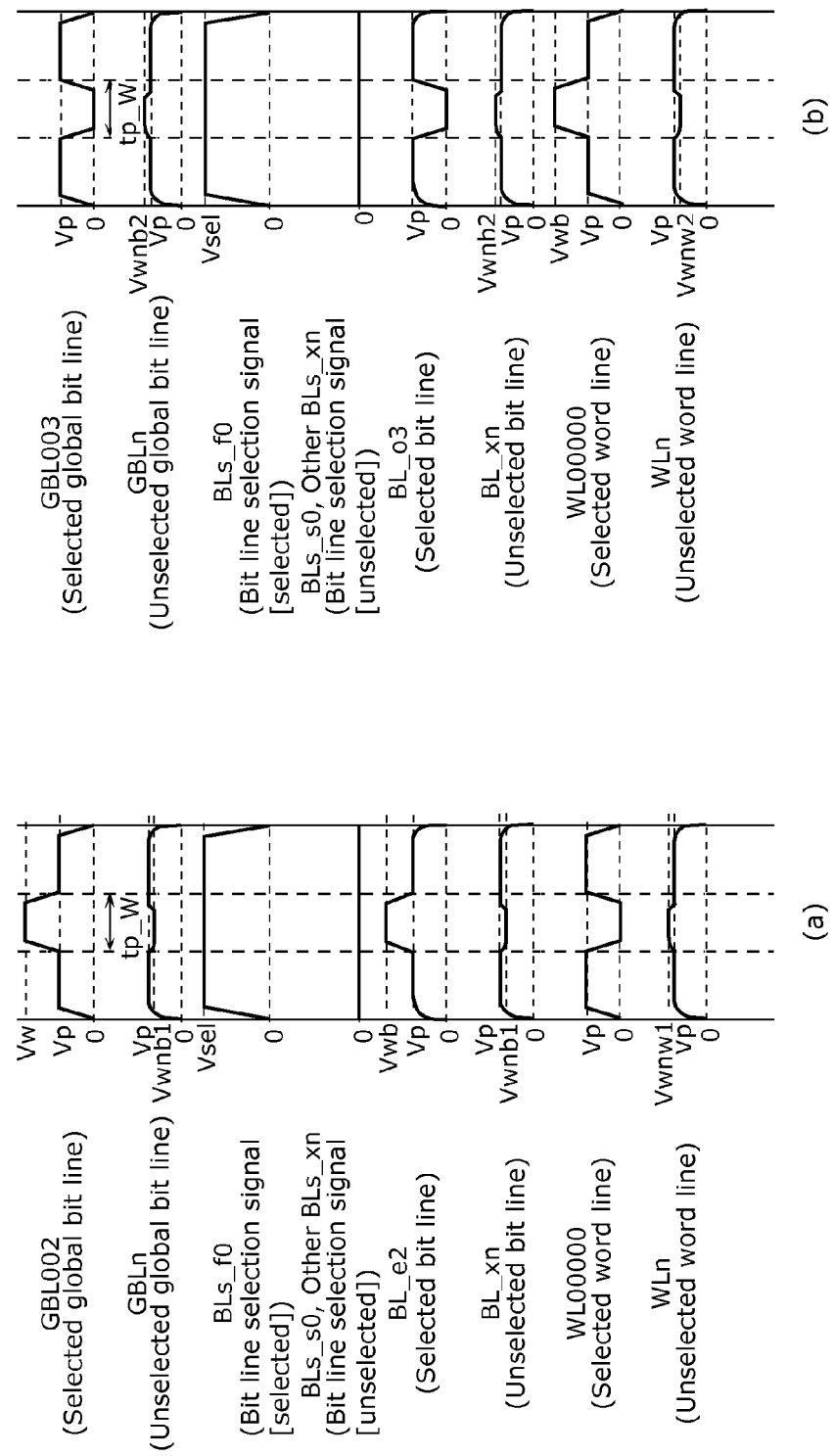
FIG. 10A is a timing waveform diagram for writing operation of the basic array plane group in FIG. 6.
Figure 10B:
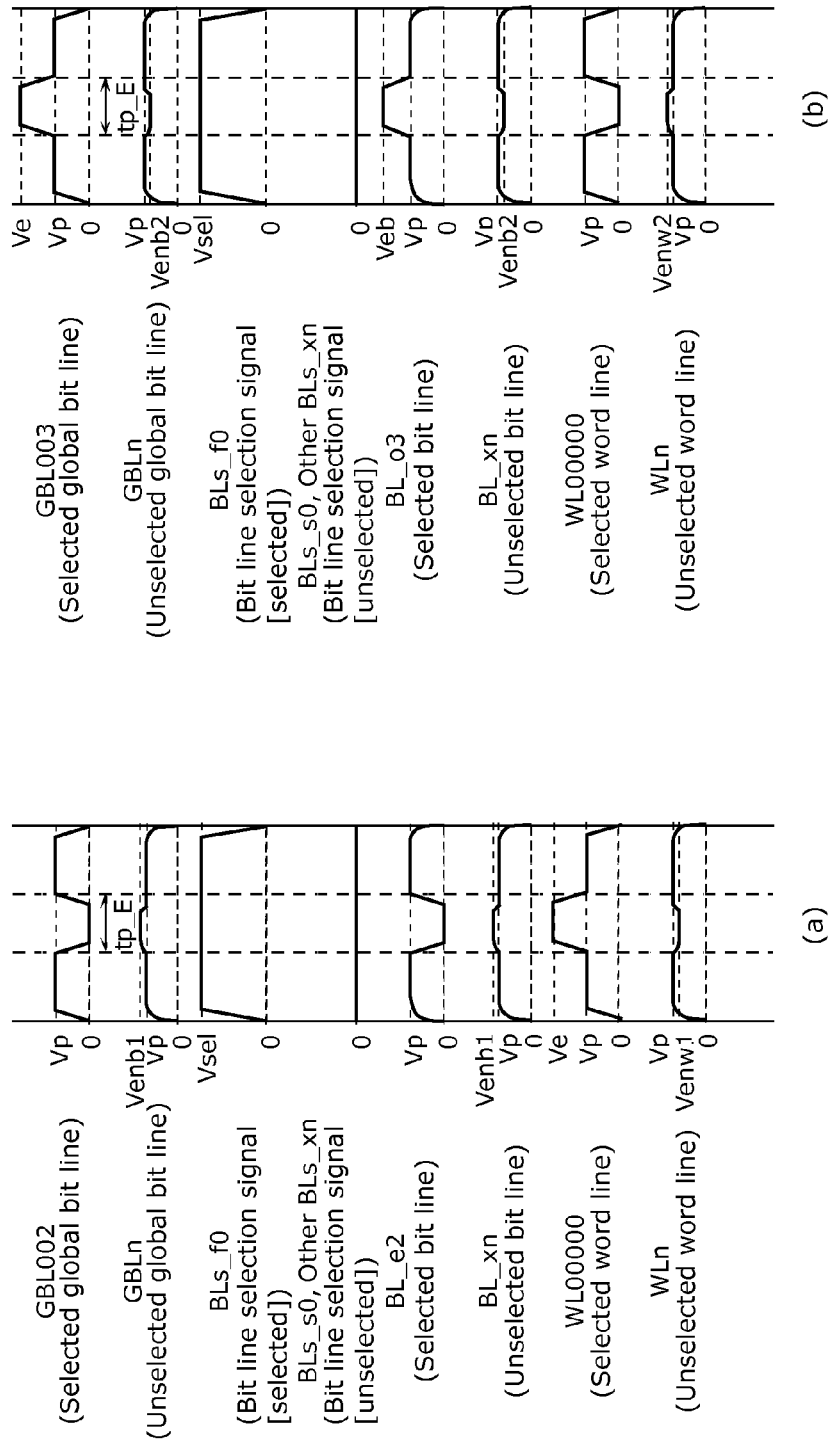
FIG. 10B is a timing waveform diagram for erasing operation of the basic array plane group in FIG. 6.
Figure 10C:
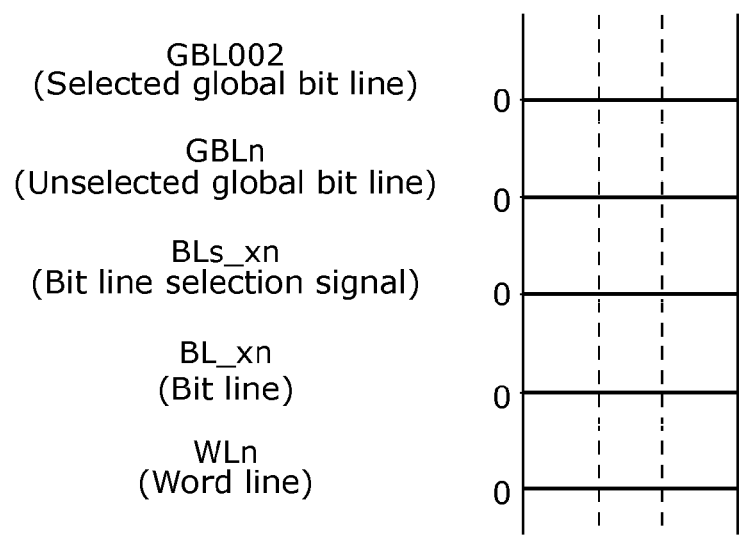
FIG. 10C is a timing waveform diagram for standby operation of the basic array plane group in FIG. 6.
Figure 10D:
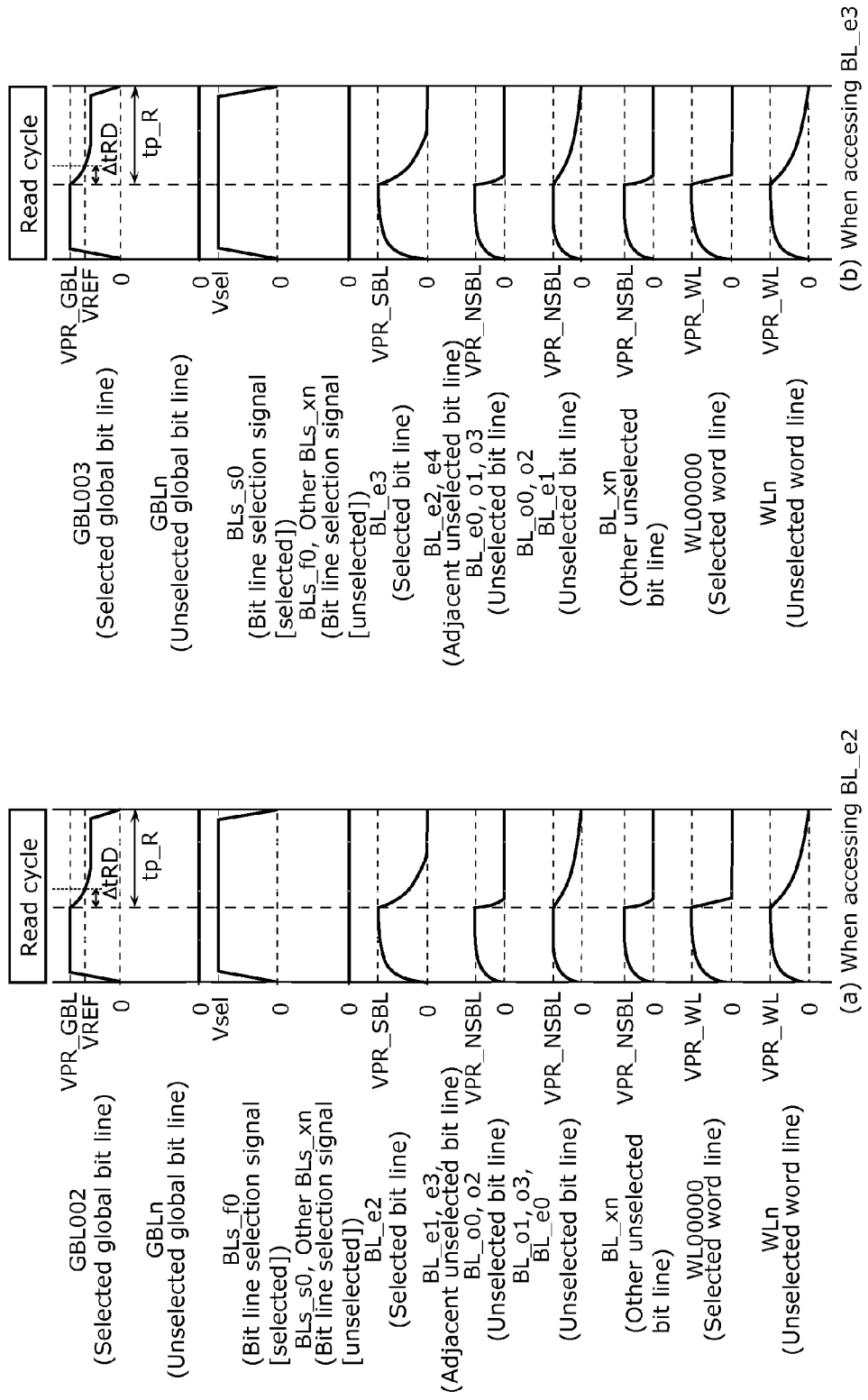
FIG. 10D Parts (a) and (b) of FIG. 10D is a timing waveform diagram for reading operation of the basic array plane group in FIG. 6.

Parts (a) and (b) of FIG. 10A, and (a) and (b) of FIG. 10B, FIG. 10C, and (a) and (b) of FIG. 10D are operation timing diagrams of the basic array plane group illustrated in FIG. 6. The operation of a memory is roughly divided into four, namely, a (low resistance) writing cycle illustrated in (a) and (b) of FIG. 10A, a (high resistance) erase cycle illustrated in (a) and (b) of FIG. 10B, a standby cycle illustrated in FIG. 10C, and a read cycle illustrated in (a) and (b) of FIG. 10D.

Here, in FIG. 6, it is assumed that all the memory cells in a memory cell array are caused to have low resistance when a higher voltage is applied to the upper end of a diode element than a voltage of the lower end of a variable resistance element, whereas all the memory cells are caused to have high resistance when a higher voltage is applied to the lower end of a variable resistance element than a voltage of the upper end of a diode element.

(Operation in Write Cycle)

First is a description of the write cycle. Part (a) of FIG. 10A illustrates the case of writing to a memory cell (causing the memory cell to have low resistance) connected to the word line WL00000 and one of the bit lines BL_e2, as an example of the writing operation. In the write cycle, the variable resistance element of a selected memory cell changes its state from the high resistance state to the low resistance state. In this memory cell, the upper end of a diode element is connected to the bit line, and the lower end of a variable resistance element is connected to the word line. First, the precharge voltage Vp is applied to a selected global bit line (GBL002 in (a) of FIG. 10A) and a selected word line (WL00000 in (a) of FIG. 10A). The precharge voltage is not applied to the other unselected global bit lines and the other unselected word lines. Further, a selection voltage Vsel is applied to a selected one of the first bit line selection signal BLs_f0 and the second bit line selection signal BLs_s0 (BLs_f0 in (a) of FIG. 10A), and selected bit lines (BL_e2 in (a) of FIG. 10A) are precharged to the precharge voltage Vp. Unselected global bit lines, unselected bit lines, and unselected word lines are precharged to the precharge voltage Vp by a current which has leaked from the selected bit lines and the selected word line via memory cells.

Next, a writing voltage Vw is applied to the selected global bit line GBL002, thereby applying a writing voltage Vwb to the selected bit lines BL_e2. In addition, 0 V is applied to the selected word line WL00000, and the writing voltage Vwb is applied to the memory cell connected to the selected word line WL00000 and one of the selected bit lines BL_e2, thereby writing to the memory cell. At this time, the voltage of the unselected bit lines changes to a stable voltage Vwnb1 which is determined based on the voltage Vwb of the selected bit lines BL_e2 and a voltage of 0 V of the selected word line WL00000, and is higher than 0 V and lower than Vwb, and the voltage of the unselected word lines changes to a stable voltage Vwnw1 higher than 0 V and lower than Vwb, as in the above case. Thus, a voltage lower than the writing voltage Vwb is merely applied to unselected memory cells.

Part (b) of FIG. 10A illustrates the case of writing to a memory cell (causing the memory cell to have low resistance) connected to the word line WL00000 and one of the bit lines BL_o3, as another example of the writing operation. In this memory cell, in contrast to the memory cell connected to the word line WL00000 and one of the bit lines BL_e2, the upper end of a diode element is connected to the bit line, and the lower end of a variable resistance element is connected to the word line, and thus it is necessary to make the relationship of a voltage applied to a bit line and a word line inverse. First, a precharge voltage Vp is applied to a selected global bit line (GBL03 in (b) of FIG. 10) and a selected word line (WL00000 in (b) of FIG. 10A). The precharge voltage is not applied to the other unselected global bit lines and the other unselected word lines. Further, a selection voltage Vsel is applied to a selected one of the first bit line selection signal BLs_f0 and the second bit line selection signal BLs_s0 (BLs_f0 in (b) of FIG. 10A), and selected bit lines (BL_o3 in (b) of FIG. 10A) are precharged to the precharge voltage Vp. Unselected global bit lines, unselected bit lines, and unselected word lines are precharged to the precharge voltage Vp by a current which has leaked from the selected bit lines and the selected word line via memory cells.

Next, the writing voltage Vwb is applied to the selected word line WL00000, and 0 V is applied to the selected global bit line GBL003. Accordingly, 0 V is applied to the selected bit lines BL_o3, and the writing voltage Vwb is applied to a memory cell connected to the selected word line WL00000 and one of the selected bit lines BL_o3, thereby writing to the memory cell. At this time, the voltage of the unselected bit lines changes to a stable voltage Vwnb2 which is determined based on a voltage of 0 V of the selected bit lines BL_o3 and the voltage Vwb of the selected word line WL00000, and is higher than 0 V and lower than Vwb, and the voltage of the unselected word lines changes to a stable voltage Vwnw2 higher than 0 V and lower than Vwb, as in the above case. Thus, a voltage lower than the writing voltage Vwb is merely applied to unselected memory cells (Operation in Erase Cycle)

Next is a description of an erase cycle. FIG. 10B illustrates the case of erasing a memory cell (causing the memory cell to have high resistance) connected to the word line WL00000 and one of the bit lines BL_e2, as an example of erase operation. In the erase cycle, the basic operation is the same as that in the write cycle. The erase cycle, however, differs from the write cycle in that a voltage of a reverse polarity is applied to a selected memory cell. First, the precharge voltage Vp is applied to a selected global bit line (GBL002 in (a) of FIG. 10B) and a selected word line (WL00000 in (a) of FIG. 10B). The precharge voltage is not applied to the other unselected global bit lines and the other unselected word lines. In addition, the selection voltage Vsel is applied to a selected one of the first bit line selection signal BLs_f0 and the second bit line selection signal BLs_s0 (BLs_f0 in (a) of FIG. 10B), and selected bit lines (BL_e2 in (a) of FIG. 10B) are precharged to the precharge voltage Vp. Unselected global bit lines, unselected bit lines, and unselected word lines are precharged to the precharge voltage Vp by a current which has leaked from the selected bit lines and the selected word line via memory cells.

Next, an erasing voltage Veb is applied to the selected word line WL00000. In addition, 0 V is applied to the selected bit lines BL_e2, and the erasing voltage Veb is applied to the memory cell connected to the selected word line WL00000 and one of the selected bit lines BL_e2, thereby erasing the memory cell. At this time, the voltage of the unselected bit lines changes to a stable voltage Venb1 which is determined based on the voltage Veb of the selected word line WL00000 and a voltage of 0 V of the selected bit lines BL_e2, and is higher than 0 V and lower than Veb, and the voltage of the unselected word lines changes to a stable voltage Venw1 higher than 0 V and lower than Veb, as in the above case. Thus, a voltage lower than the erasing voltage Veb is merely applied to unselected memory cells.

Part (b) of FIG. 10B illustrates the case of erasing a memory cell (causing the memory cell to have high resistance) connected to the word line WL00000 and one of the bit lines BL_o3, as another example of erase operation. As with the case of writing, with regard to this memory cell, in contrast to the memory cell connected to the word line WL00000 and one of the bit lines BL_e2, the upper end of a diode element is connected to a bit line, and the lower end of a variable resistance element is connected to a word line, and thus it is necessary to make the relationship of the voltage applied to a bit line and a word line inverse. First, the precharge voltage Vp is applied to a selected global bit line (GBL003 in (b) of FIG. 10B) and a selected word line (WL00000 in (b) of FIG. 10B). The precharge voltage is not applied to the other unselected global bit lines and the other unselected word lines. In addition, the selection voltage Vsel is applied to a selected one of the first bit line selection signal BLs_f0 and the second bit line selection signal BLs_s0 (BLs_f0 in (b) of FIG. 10B), and selected bit lines (BL_o3 in (b) of FIG. 10B) are precharged to the precharge voltage Vp. Unselected global bit lines, unselected bit lines, and unselected word lines are precharged to the precharge voltage Vp by a current which has leaked from the selected bit lines and the selected word line via memory cells.

Next, an erasing voltage Vb is applied to the selected global bit line GBL003, thereby applying the erasing voltage Veb to the selected bit lines BL_o3. In addition, 0 V is applied to the selected word line WL00000, and the erasing voltage Veb is applied to the memory cell connected to the selected word line WL00000 and one of the selected bit lines BL_o3, thereby erasing the memory cell. At this time, the voltage of the unselected bit lines changes to a stable voltage Venb2 which is determined based on the voltage Veb of the selected bit lines BL_o3 and a voltage of 0 V of the selected word line WL00000, and is higher than 0 V and lower than Veb, and the voltage of the unselected word lines changes to a stable voltage Venw2 higher than 0 V and lower than Veb, as in the above case. Thus, a voltage lower than the erasing voltage Veb is merely applied to unselected memory cells.

(Operation in Read Cycle)

Next is a description of the read cycle. Part (a) of FIG. 10D illustrates the case of reading the memory cell connected to the word line WL00000 and one of the bit lines BL_e2, as an example of the reading operation. In the read cycle, first, the precharge voltage VPR_GBL is applied to a selected global bit line (GBL002 in (a) of FIG. 10D). A voltage may be applied or may not be applied to the other unselected global bit lines. Further, the selection voltage Vsel is applied to a selected one of the first bit line selection signal BLs_f0 and the second bit line selection signal BLs_s0 (BLs_f0 in (a) of FIG. 10D), and an unselection voltage (0 V in (a) of FIG. 10D) is applied to the other unselected bit line selection signal. A voltage is not applied to the selected word line (WL00000 in (a) of FIG. 10D) and unselected word lines. As a result of the above voltage application, the selected bit lines (BL_e2 in (a) of FIG. 10D) are precharged to a precharge voltage VPR_SBL via the global bit line GBL002, the selected word line WL00000 and unselected word lines are precharged to VPR_WL from the selected bit lines BL_e2 via a memory cell, and unselected bit lines are precharged to VPR_NSBL from selected and unselected word lines via memory cells.

It should be noted that although a voltage may be applied to unselected global bit lines in the above, in that case, a voltage to be applied is lower than the precharge voltage VPR_GBL applied to the selected global bit line GBL002, and closer to the precharge voltage VPR_NSBL applied to the unselected bit lines, thereby enabling reduction of a leak voltage between unselected global bit lines and unselected bit lines via bit line selection switches. Further, influence on the selected global bit line GBL002 can be prevented from being exerted via interline capacitance by applying and fixing a voltage to unselected global bit lines.

Next, the application of a voltage to the selected global bit line GBL002 is stopped, and the voltage of the selected word line WL00000 is changed from VPR_WL to 0 V. A voltage is not applied to the other unselected word lines. Accordingly, a read voltage VPR_SBL is applied to the selected memory cell, and the electric charge stored in the selected bit lines BL_e2 and the selected global bit line GBL002 is discharged according to the resistance value of the variable resistance element of the memory cell. A read circuit 216 in FIG. 9 detects a time ΔtRD until when the potential of the selected global bit line GBL002 reaches a determination voltage VREF, thereby determining whether a memory cell is in the low resistance state or the high resistance state.

Here, the voltage of the selected word line WL00000 has changed from VPR_WL to 0 V, and thus the voltages of unselected bit lines and unselected word lines respectively change from VPR_NSBL and VPR_WL to the stable voltages determined based on the voltages of the selected bit lines BL_e2 and the selected word line WL00000.

At this time, although unselected bit lines adjacent to the selected bit lines BL_e2 in the same layers (i.e., in the Y direction) are the bit lines BL_e1 and BL_e3, both the unselected bit lines BL_e1 and BL_e3 are disconnected from the global bit lines by the second bit line selection signal BLs_s0 (since the second selection switch elements 112 and 114 are in the disconnected state). Thus, the load capacitance of the lines is small, and the voltage thereof quickly changes to the stable voltage. Changes in signals in both the adjacent unselected bit lines BL_e1 and BL_e3 propagate to the selected bit lines via interline capacitance between the selected bit lines BL_e2 and the adjacent unselected bit lines BL_e1 and between the selected bit lines BL_e2 and the adjacent unselected bit lines BL_e3, and thus a signal in the selected bit lines changes more quickly, compared to when signals in adjacent unselected bit lines do not change.

Part (b) of FIG. 10D illustrates the case of reading a memory cell connected to the word line WL00000 and one of the bit lines BL_e3, as another example of the reading operation. It is assumed that the resistance value of the variable resistance element is the same as that of the memory cell connected to the word line WL00000 and one of the bit lines BL_e2 described above. In the read cycle, first, a precharge voltage VPR_GBL is applied to a selected global bit line (GBL003 in (b) of FIG. 10D). A voltage may be applied or may not be applied to the other unselected global bit lines, as in the above description. Further, a selection voltage Vsel is applied to a selected one of the first bit line selection signal BLs_f0 and the second bit line selection signal BLs_s0

(BLs_s0 in (b) of FIG. 10D), and an unselection voltage (0 V in (b) of FIG. 10D) is applied to the other unselected bit line selection signal. A voltage is not applied to the selected word line (WL00000 in (b) of FIG. 10D) and unselected word lines. As a result of the above voltage application, the selected bit lines (BL_e3 in (b) of FIG. 10D) are precharged to the precharge voltage VPR_SBL via the global bit line GBL003, the selected word line WL00000 and unselected word lines are precharged to VPR_WL from the selected bit lines BL_e3 via a memory cell, and unselected bit lines are precharged to VPR_NSBL from selected and unselected word lines via memory cells.

Next, the application of a voltage to the selected global bit line GBL003 is stopped, and the voltage of the selected word line WL00000 is changed from VPR_WL to 0 V. A voltage is not applied to the other unselected word lines. Accordingly, the read voltage VPR_SBL is applied to the selected memory cell, the electric charge stored in the selected bit lines BL_e3 and the selected global bit line GBL003 is discharged via the memory cell. The read circuit 216 in FIG. 9 detects a time ΔtRD until when the potential of the selected global bit line GBL003 reaches the determination voltage VREF, thereby determining whether the memory cell is in the low resistance state or the high resistance state.

Here, the voltage of the selected word line WL00000 has changed from VPR_WL to 0 V, and thus the voltages of unselected bit lines and unselected word lines respectively change from VPR_NSBL and VPR_WL to the stable voltages determined based on the voltages of the selected bit lines BL_e3 and the selected word line WL00000.

At this time, although unselected bit lines adjacent to the selected bit lines BL_e3 in the same layers (i.e., in the Y direction) are the bit lines BL_e2 and BL_e4, both the unselected bit lines BL_e2 and BL_e4 are disconnected from the global bit lines by the bit line selection signals BLs_f0 and BLs_f1, respectively (since the first selection switch elements 103 and 105 are in the disconnected state), and thus the load capacitance of the lines is small, and the voltage thereof quickly changes to the stable voltage. Changes in the signals in the adjacent unselected bit lines BL_e2 and BL_e4 propagate to the selected bit lines via the interline capacitance between the selected bit lines BL_e3 and the adjacent unselected bit lines BL_e2 and between the selected bit lines BL_e3 and the adjacent unselected bit lines BL_e4, and thus a signal in the selected bit lines changes more quickly, compared to when signals in adjacent unselected bit lines do not change.

However, the speed at which signals in the adjacent unselected bit lines BL_e2 and BL_e4 change is substantially the same as the speed at which signals in the adjacent unselected bit lines BL_e1 and BL_e3 change in the case of reading the memory cell connected to the selected word line WL00000 and one of the bit lines BL_e2, and also the influence is substantially the same which is exerted on a change in a signal in the selected bit lines BL_e3 via the interline capacitance between the selected bit lines BL_e3 and the adjacent unselected bit lines BL_e2 and between the selected bit lines BL_e3 and the adjacent unselected bit lines BL_e4. Therefore, when the resistance value of the variable resistance element of a selected memory cell is the same, the time ΔtRD until when the potential of a global bit line reaches the determination voltage VREF has substantially the same value as that in the case of reading the memory cell connected to the selected word line WL00000 and one of the unselected bit lines BL_e2.

Figure 23:
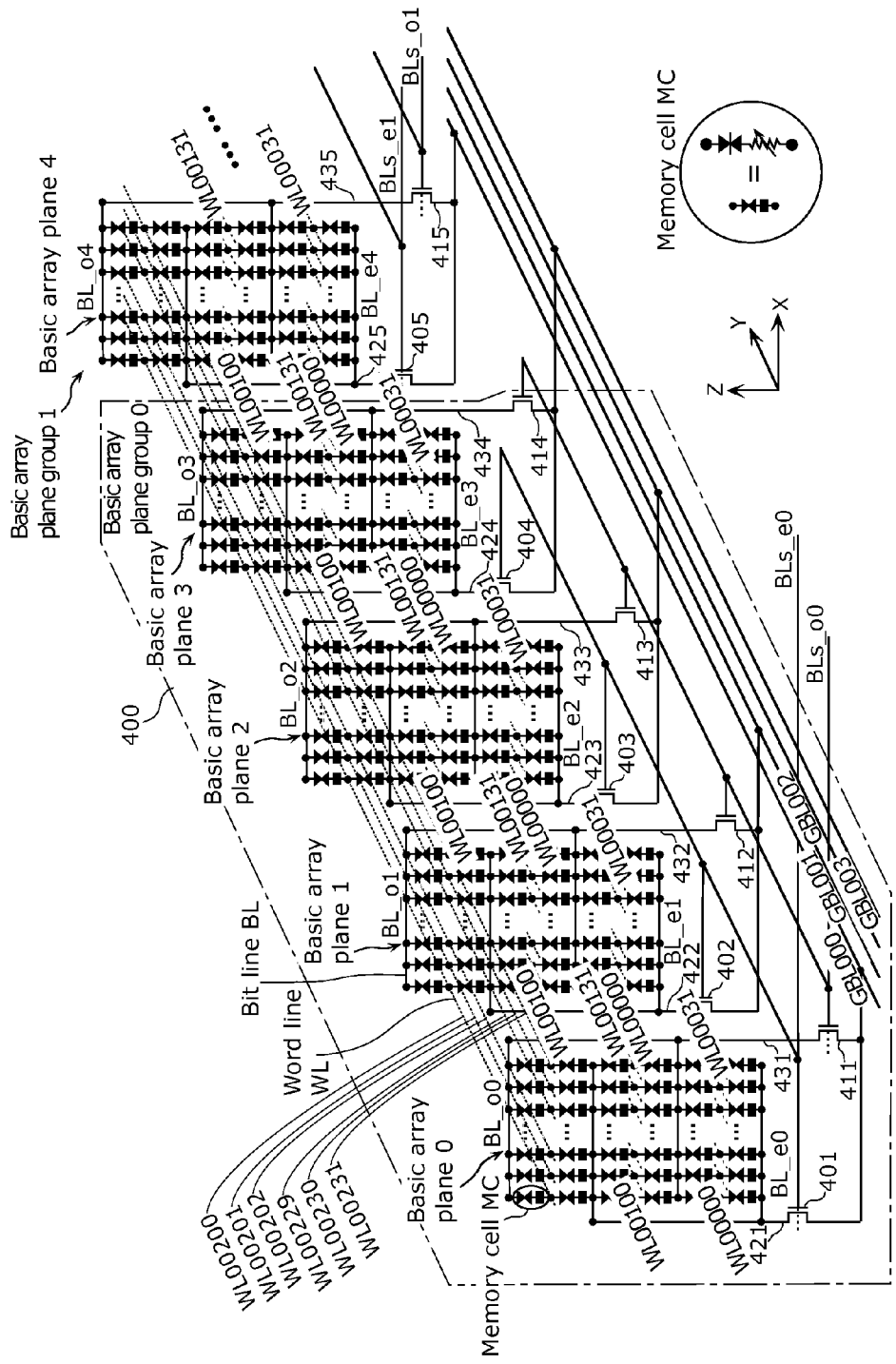
FIG. 23 is a circuit diagram illustrating a configuration of a conventional basic array plane group.

Now, consider the case of PTL 6 using a memory cell array according to a conventional example, or specifically, a configuration illustrated in FIG. 23.

Figure 24:
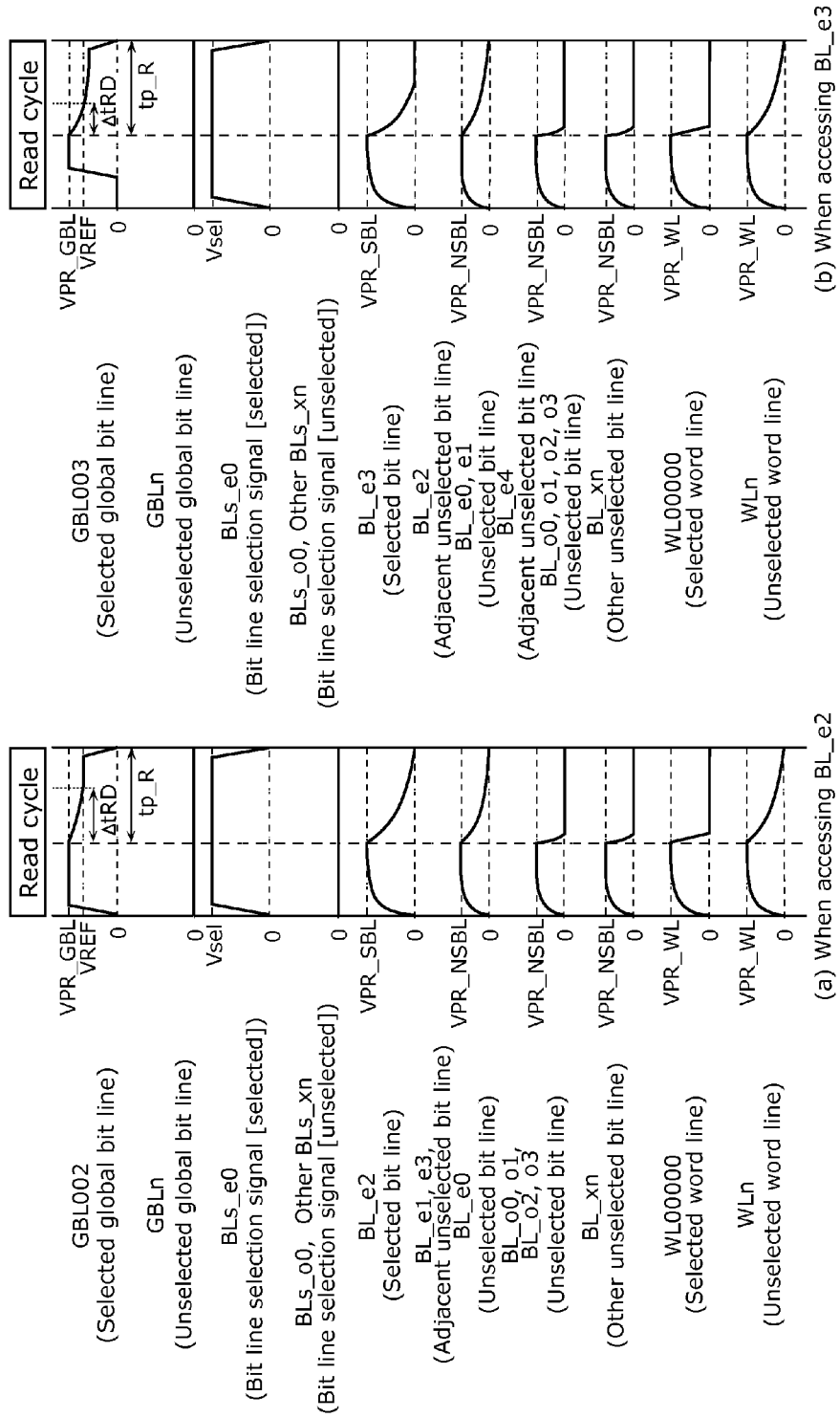
FIG. 24 Parts (a) and (b) of FIG. 24 are timing waveform diagrams for reading operation of the basic array plane group in FIG. 23.

Part (a) of FIG. 24 illustrates the case of reading a memory cell connected to the selected word line WL00000 and one of the selected bit lines BL_e2, as an example of the reading operation. In the read cycle, first, the precharge voltage VPR_GBL is applied to a selected global bit line (GBL002 in (a) of FIG. 24). A voltage may be applied or may not be applied to the other unselected global bit lines. Further, the selection voltage Vsel is applied to a selected one of an even-layer bit line selection signal BLs_e0 and an odd-layer bit line selection signal BLs_o0 (BLs_e0 in (a) of FIG. 24), and an unselection voltage (0 V in (a) of FIG. 24) is applied to the other unselected bit line selection signal. A voltage is not applied to a selected word line (WL00000 in (a) of FIG. 24) and unselected word lines. As a result of the above voltage application, the selected bit lines (BL_e2 in (a) of FIG. 24) are precharged to the precharge voltage VPR_SBL via the global bit line GBL002, the selected word line WL00000 and the unselected word lines are precharged to VPR_WL from the selected bit lines BL_e2 via a memory cell, and unselected bit lines are precharged to VPR_NSBL from selected and unselected word lines via memory cells.

Next, the application of a voltage to the selected global bit line GBL002 is stopped, and the voltage of the selected word line WL00000 is changed from VPR_WL to 0 V. A voltage is not applied to the other unselected word lines. Accordingly, the read voltage VPR_SBL is applied to the selected memory cell, and according to the resistance value of the variable resistance element of the memory cell, the electric charge stored in the selected bit lines BL_e2 and the selected global bit line GBL002 is discharged. A read circuit 216 in FIG. 9 detects a time ΔtRD until when the potential of the selected global bit line GBL002 reaches a determination voltage VREF, thereby determining whether a memory cell is in the low resistance state or the high resistance state.

Here, the voltage of the selected word line WL00000 has changed from VPR_WL to 0 V, and thus the voltages of the unselected bit lines and the unselected word lines respectively change from VPR_NSBL and VPR_WL to stable voltages determined based on the voltages of the selected bit lines BL_e2 and the selected word line WL00000.

At this time, as illustrated in FIG. 23, unselected bit lines adjacent to the selected bit lines BL_e2 in the same layers (i.e., in the Y direction) are the bit lines BL_e1 and BL_e3. Although both the unselected bit lines BL_e1 and BL_e3 are respectively connected to the global bit lines GBL001 and GBL003 by the even-layer bit line selection signal BLs_e0, the load capacitance of the global bit lines is larger, and thus signals in both the unselected bit lines BL_e1 and BL_e3 change toward the stable voltage at a lower speed. Although both changes in the voltages of the adjacent unselected bit lines BL_e1 and BL_e3 propagate to the selected bit lines BL_e2 via the interline capacitance between the selected bit lines BL_e2 and the adjacent unselected bit lines BL_e1 and between the selected bit lines BL_e2 and the adjacent unselected bit lines BL_e3, the change in both of the signals in the adjacent unselected bit lines BL_e1 and BL_e3 is slow, and thus a signal in the selected bit lines BL_e2 changes at a lower speed, compared with the case of (a) of FIG. 10D.

Further, (b) of FIG. 24 illustrates the case of reading a memory cell connected to the selected word line WL00000 and one of the selected bit lines BL_e3 as another example of the reading operation, when a memory cell array has a configuration according to a conventional example. It is assumed that the resistance value of the variable resistance element is the same as that of the memory cell connected to the word line WL00000 and one of the bit lines BL_e2 described above. In the read cycle, first, the precharge voltage VPR_GBL is applied to a selected global bit line (GBL003 in (b) of FIG. 24). A voltage may be applied or may not be applied to the other unselected global bit lines. Further, the selection voltage Vsel is applied to a selected one of the even-layer bit line selection signal BLs_e0 and the odd-layer bit line selection signal BLs_o0 (BLs_e0 in (b) of FIG. 24), and an unselection voltage (0 V in (b) of FIG. 24) is applied to the other unselected bit line selection signal. A voltage is not applied to a selected word line (WL00000 in (b) of FIG. 24) and unselected word lines. As a result of the above voltage application, the selected bit lines (BL_e3 in (b) of FIG. 24) are precharged to the precharge voltage VPR_SBL via the global bit line GBL003, the selected word line WL00000 and unselected word lines are precharged to VPR_WL from the selected bit lines BL_e3 via a memory cell, and unselected bit lines are precharged to VPR_NSBL from the selected and unselected word lines via memory cells.

After the end of the precharging, the application of a voltage to the selected global bit line GBL003 is stopped, thereby changing the voltage of the selected word line WL00000 from VPR_WL to 0 V. A voltage is not applied to the other unselected word lines. Accordingly, the read voltage VPR_SBL is applied to the selected memory cell, and the electric charge stored in the selected bit lines BL_e3 and the selected global bit line GBL003 is discharged via the memory cell. The read circuit 216 in FIG. 9 detects a time ΔtRD until when the potential of the selected global bit line GBL003 reaches the determination voltage VREF, thereby determining whether the memory cell is in the low resistance state or the high resistance state.

Here, the voltage of the selected word line WL00000 has changed from VPR_WL to 0 V, and thus the voltages of the unselected bit lines and the unselected word lines respectively change from VPR_NSBL and VPR_WL to stable voltages determined based on the voltages of the selected bit lines BL_e3 and the selected word line WL00000.

At this time, as illustrated in FIG. 23, unselected bit lines adjacent to the selected bit lines BL_e3 in the same layers (i.e., in the Y direction) are the bit lines BL_e2 and BL_e4. The unselected bit lines BL_e2 are connected to a global bit line by the even-layer bit line selection signal BLs_e0, and the load capacitance of the lines is larger. Thus, a signal in the unselected bit lines BL_e2 changes toward the stable voltage at a lower speed. In contrast, the unselected bit lines BL_e4 are disconnected from a global bit line by an even-layer bit line selection signal BLs_e1 (since the even-layer selection switch element 405 is in the disconnected state), the load capacitance of the lines is smaller, and thus a signal in the unselected bit lines BL_e4 changes toward the stable voltage at a higher speed. Although a change in the signals in the adjacent unselected bit lines propagates to the selected bit lines via the interline capacitance between the selected bit lines and the adjacent unselected bit lines, a signal in the adjacent unselected bit lines BL_e2 on one side changes at a higher speed, whereas a signal in the adjacent unselected bit lines BL_e4 on the other side changes at a lower speed, and thus the signal in the selected bit lines BL_e3 changes at a higher speed than the case in (a) of FIG. 24 and at a lower speed than the cases in (a) and (b) of FIG. 10D.

Specifically, the signal in the adjacent unselected bit lines BL_e2 changes at a lower speed, and the signal in the adjacent unselected bit lines BL_e4 changes at a higher speed. However, as described above, signals in both the adjacent unselected bit lines BL_e1 and BL_e3 change at a lower speed in the case of reading the memory cell connected to the word line WL00000 and one of the bit lines BL_e2. Therefore, even if the resistance value of a variable resistance element of a selected memory cell is the same, a time ΔtRD until when the potential of a global bit line reaches the determination voltage VREF is shorter than that in the case of reading the memory cell connected to the word line WL00000 and one of the bit lines BL_e2, which causes fluctuations in the determination time.

As described above, when a memory cell array has a configuration according to a conventional example, even if the resistance value of the variable resistance elements of memory cells is the same, a read time fluctuates depending on the position of the memory cell to be read. However, a memory cell array having a configuration according to the present embodiment has a feature that a read time does not fluctuate, irrespective of the position of a memory cell to be read.

(Simultaneous Reading from Basic Array Planes which are not Adjacent to Each Other)

The above is a description of the case of reading only one memory cell from one basic array plane in the basic array plane group 100 in the read cycle. Specifically, although a description has been given on the case in which only one global bit line is selected and reading operation is performed, the circuit configuration of the basic array plane group illustrated in FIG. 6 includes global bit lines corresponding to, in number, the basic array planes included in the basic array plane group. The word lines are common in the basic array plane group, and thus in the read cycle, it is possible to simultaneously read memory cells connected to the same word line in a plurality of basic array planes by simultaneously selecting these global bit lines.

However, in the case of simultaneously selecting memory cells in a plurality of given basic array planes in the basic array plane group, there are three possible cases, namely, the case in which bit lines adjacent to a selected bit line on both sides in the Y direction are both unselected bit lines, the case in which one of such bit lines is a selected bit line, and the other is an unselected bit line, and the case in which both of such bit lines are selected bit lines. Accordingly, as with the case of the conventional circuit configuration described with reference to FIG. 23, and (a) and (b) of FIG. 24, the behavior of a signal in an adjacent line in the Y direction is different, depending on the position of a memory cell (bit line) to be selected, and thus a read speed fluctuates, which is a problem.

This problem can be solved by simultaneously reading, when a bit in a certain basic array plane is to be read, a bit in a basic array plane which is not adjacent to the certain basic array plane on both sides in the Y direction. For example, in the case of the circuit configuration in FIG. 6, it is sufficient for the global bit line decoder/driver 202 to, under the control of the control circuit 212, simultaneously select a memory cell in the basic array plane 2 when selecting a memory cell in the basic array plane 0, and simultaneously select a memory cell in the basic array plane 3 when selecting a memory cell in the basic array plane 1.

Figure 10E:
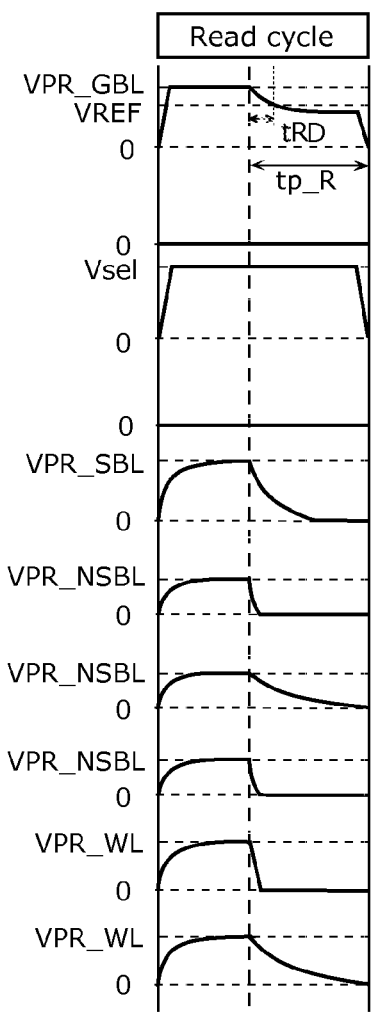
FIG. 10E is a timing waveform diagram for simultaneous reading operation of the basic array plane group in FIG. 6.

FIG. 10E illustrates the case of simultaneously reading a memory cell connected to the selected word line WL00000 and one of the selected bit lines BL_e1, and a memory cell connected to the selected word line WL00000 and one of the selected bit lines BL_e3, as an example of the simultaneous reading operation in the circuit configuration of FIG. 6. Although an overview of the operation is the same as in the case of (b) of FIG. 10D, a difference is that the global bit line decoder/driver 202 can simultaneously select the global bit line GBL001 in addition to the global bit line GBL003. At this time, although unselected bit lines adjacent in the Y direction to BL_e1 which is one of the sets of the selected bit lines are bit lines BL_e0 and BL_e2, both the unselected bit lines BL_e0 and BL_e2 are disconnected from the global bit lines by the bit line selection signal BL_f0 (since the first selection switch elements 101 and 103 are in the disconnected state). In contrast, unselected bit lines adjacent in the Y direction to BL_e3 which is another set of the selected bit lines are the bit lines BL_e2 and BL_e4, and also the unselected bit lines BL_e2 and BL_e4 are disconnected from the global bit lines by the bit line selection signals BL_f0 and BL_f1, respectively (since the first selection switch elements 103 and 105 are in the disconnected state). Therefore, unselected bit lines adjacent to both the selected bit lines BL_e1 and BL_e3 in the Y direction are disconnected from the global bit lines, and thus as in the case of (a) and (b) of FIG. 10D, if the resistance value of variable resistance elements of the selected memory cells is the same, a time ΔtRD until when the potential of the global bit lines reaches the determination voltage VREF has a substantially same value for both the global bit lines.

It should be noted that when a memory cell connected to the word line WL00000 and one of the bit lines BL_e0 and a memory cell connected to the word line WL00000 and one of the bit lines BL_e2 are simultaneously read, and when a memory cell connected to the word line WL00000 and one of the bit lines BL_e0 and a memory cell connected to the word line WL00000 and one of the bit lines BL_e3 are simultaneously read, all unselected bit lines adjacent to the selected bit lines in the Y direction are disconnected from the global bit lines, similarly. Thus, in the above three cases, if the resistance value of variable resistance elements of selected memory cells is the same, the time ΔtRD until when the potential of the global bit lines reaches the determination voltage VREF has substantially the same value for the three cases.

(Operation in Standby Cycle)

When not performing writing, erasing, and reading operation, the cycle is set to the standby cycle illustrated in FIG. 10C. Although FIG. 10C illustrates the case where a potential of 0 V is applied to a global bit line, a bit line, and a word line and a potential of 0 V is applied to a bit line selection signal as an example, the potential applied to a global bit line, a bit line, and a word line is not limited to 0 V, and an intermediate potential may be applied or the lines may be caused to be in a floating state. In addition, a selection potential may be applied as a bit line selection signal, rather than 0 V.

(Operation Performed when Making Successive Accesses)

The above is a description of an operation in a cycle of one access operation, with regard to operations (accesses) of writing, erasing, and reading. The following is a description of the case of successively writing to a certain area in a memory cell array while incrementing an address (the case of successively writing to memory cells connected to the same word line in different array planes). When successive writing is performed, in general, a memory cell is written to which is connected to a first word line (WL00000 in FIG. 6) in a first basic array plane (basic array plane 0 in FIG. 6) in a first cycle, whereas in a second cycle following the first cycle, a memory cell is written to which is connected to the first word line (WL00000 in FIG. 6) in a second basic array plane (basic array plane 1 in FIG. 6) adjacent to the first basic array plane in the Y direction. In this manner, memory cells are written to one by one, which are connected to the same word line in adjacent basic array planes. It should be noted that in the following description of the operation performed when making successive accesses, it is assumed that portions except for the memory cell array 200 illustrated in the block diagram in FIG. 9 serve as a control unit.

First, a description is given of aforementioned general successive writing operation using a schematic diagram.

Figure 11A:
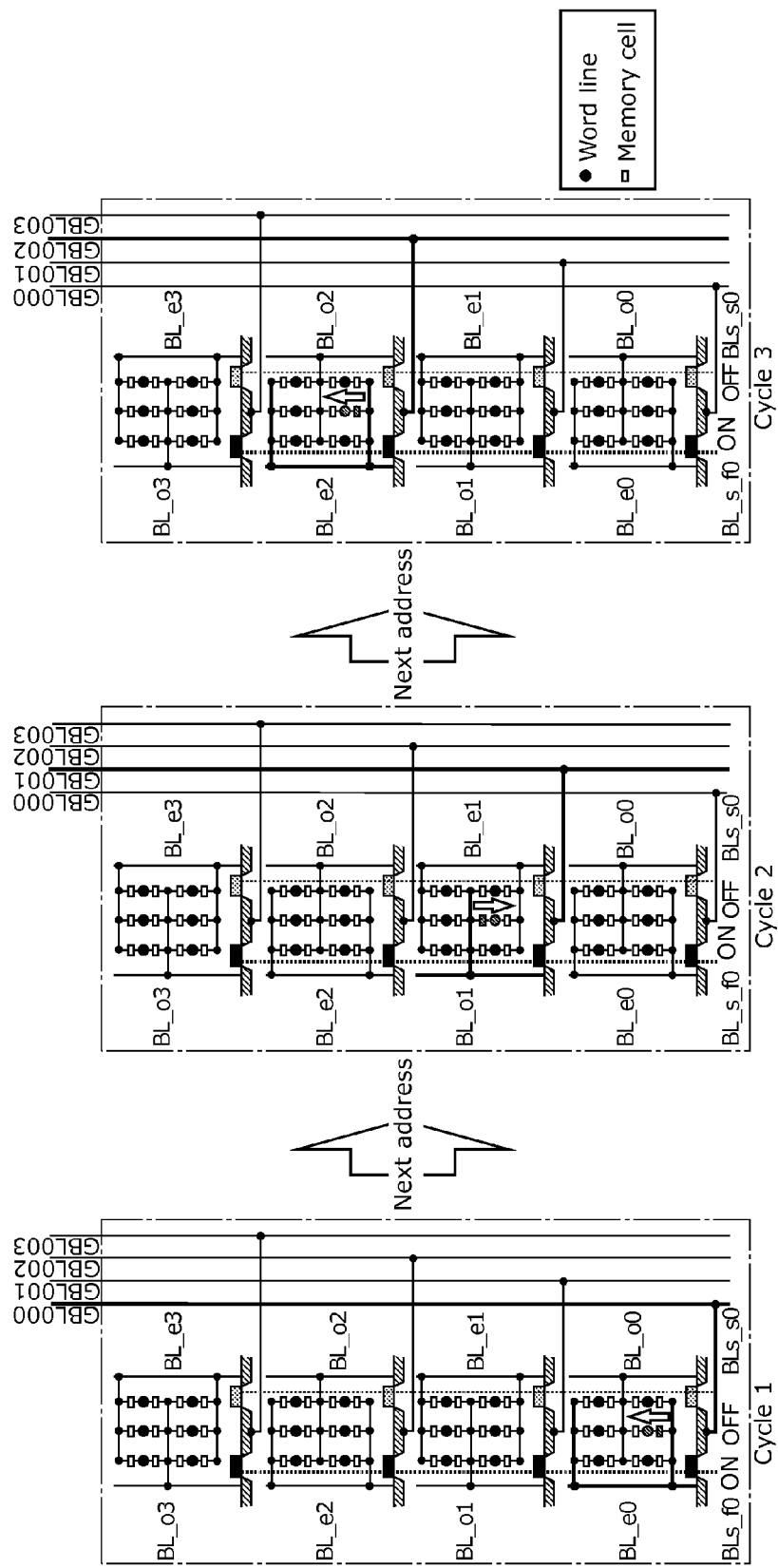
FIG. 11A is a schematic diagram illustrating general writing operation of the basic array plane group in FIG. 6.

FIG. 11A is a schematic diagram for describing such general successive writing operation.

First, in cycle 1, a memory cell is written to (causing the memory cell to have low resistance) which is connected to the word line WL00000 and one of the bit lines BL_e0 in the basic array plane 0. At this time, the global bit line GBL000 and the word line WL00000 are selected. The selection switch controlled by the bit line selection signal BLS_f0 is turned ON, and thus the selected bit lines are BL_e0.

Voltages are applied to the selected word line and the selected bit lines so that the selected memory cell is caused to have low resistance.

Therefore, as illustrated in FIG. 11A, a current flows into the selected memory cell from the selected bit line BL_e0 side, or in other words, from the variable resistance element side, thereby causing the memory cell to have low resistance.

In cycle 2 following cycle 1, a memory cell is selected which is connected to the word line WL00000 in the basic array plane 1 adjacent to the basic array plane 0 in the Y direction. At this time, in general, only a global bit line is changed from the state in cycle 1. Specifically, the global bit line GBL001 is selected and the selected bit lines BL_o1 are selected.

As illustrated in FIG. 11A, if voltages are applied to the word line and the bit lines in this state as in cycle 1, a current flows into the selected memory cell from the selected bit line BL_o1 side, or in other words, the diode element side, thereby causing the memory cell to have high resistance. Accordingly, it is necessary to perform control to change a voltage applied to the word line and a voltage applied to the bit lines, thereby allowing a current to flow from the variable resistance element side into a memory cell.

A detailed description is given of the above operation using a timing wave form chart for writing operation illustrated in FIG. 12A. First, in cycle 1, a memory cell is written to (is caused to have low resistance) which is connected to the word line WL00000 and one of the bit lines BL_e0 in the basic array plane 0. First, the precharge voltage Vp is applied to the selected global bit line GBL000 and the selected word line WL00000. The precharge voltage is not applied to the other unselected global bit lines and the other unselected word lines. In addition, the selection voltage Vsel is applied to the first bit line selection signal BLs_f0, and the selected bit lines BL_e0 are precharged to the precharge voltage Vp. Unselected global bit lines, unselected bit lines, and unselected word lines are precharged to the precharge voltage Vp by a current which has leaked from the selected bit lines and the selected word line via memory cells.

Next, the writing voltage Vw is applied to the selected global bit line GBL000, thereby applying the writing voltage Vwb to the selected bit lines BL_e0. In addition, 0 V is applied to the selected word line WL00000, and the writing voltage Vwb is applied to the memory cell connected to the selected word line WL00000 and one of the selected bit lines BL_e0, thereby writing to the memory cell. It should be noted that when not writing to the memory cell connected to the word line WL00000 and one of the bit lines BL_e0, it is sufficient that the word line and the bit lines remain at the precharge voltage and the writing voltage is not applied.

Next, in cycle 2 following cycle 1, a memory cell is written to (is caused to have low resistance) which is connected to the word line WL00000 and one of the bit lines BL_o1 in the basic array plane 1 adjacent to the basic array plane 0 in the Y direction. First, the precharge voltage Vp is applied to the selected global bit line GBL001 and the selected word line WL00000. The precharge voltage is not applied to the other unselected global bit lines and the other unselected word lines. In addition, the selection voltage Vsel is continuously applied to the first bit line selection signal BLs_f0, and the selected bit lines BL_o0 are precharged to the precharge voltage Vp. Unselected global bit lines, unselected bit lines, and unselected word lines are precharged to the precharge voltage Vp by a current which has leaked from the selected bit lines and the selected word line via memory cells.

Next, the writing voltage Vwb is applied to the selected word line WL00000, and 0 V is applied to the selected global bit line GBL001. Accordingly, 0 V is applied to the selected bit lines BL_o1, and the writing voltage Vwb is applied to a memory cell connected to the selected word line WL00000 and one of the selected bit lines BL_o1, thereby writing to the memory cell. It should be noted that when not writing to the memory cell connected to the word line WL00000 and one of the bit lines BL_o1, it is sufficient that the word line and the bit lines remain at the precharge voltage and the writing voltage is not applied.

In each of cycles 3 and 4 following cycle 2, successive writing is performed by changing a global bit line and a writing voltage applied across a word line and a bit line, using the same method as in cycles 1 and 2.

In the above, when writing is performed, the writing voltage Vw is applied to the global bit line GBL000 in cycle 1, whereas 0 V is applied to the global bit line GBL001 in cycle 2. In addition, 0 V is applied to the word line WL00000 in cycle 1, whereas the writing voltage Vwb is applied to the word line WL00000 in cycle 2. Thus, it is necessary to perform control to switch, in each cycle, voltages applied to a global bit line and a word line to one of 0 V, the writing voltage Vw, and the writing voltage Vwb. Accordingly, a problem is that it is necessary to perform complicated control to switch an applied voltage in each cycle. In addition, a potential relation between a selected word line and a selected bit line is reversed in each cycle, and thus a potential of each unselected word line and each unselected bit line also changes in each cycle, which even leads to a problem that power consumption increases.

Based on the above problem, a description is given of an embodiment of access operation according to the present invention, using schematic diagrams.

Figure 11B:
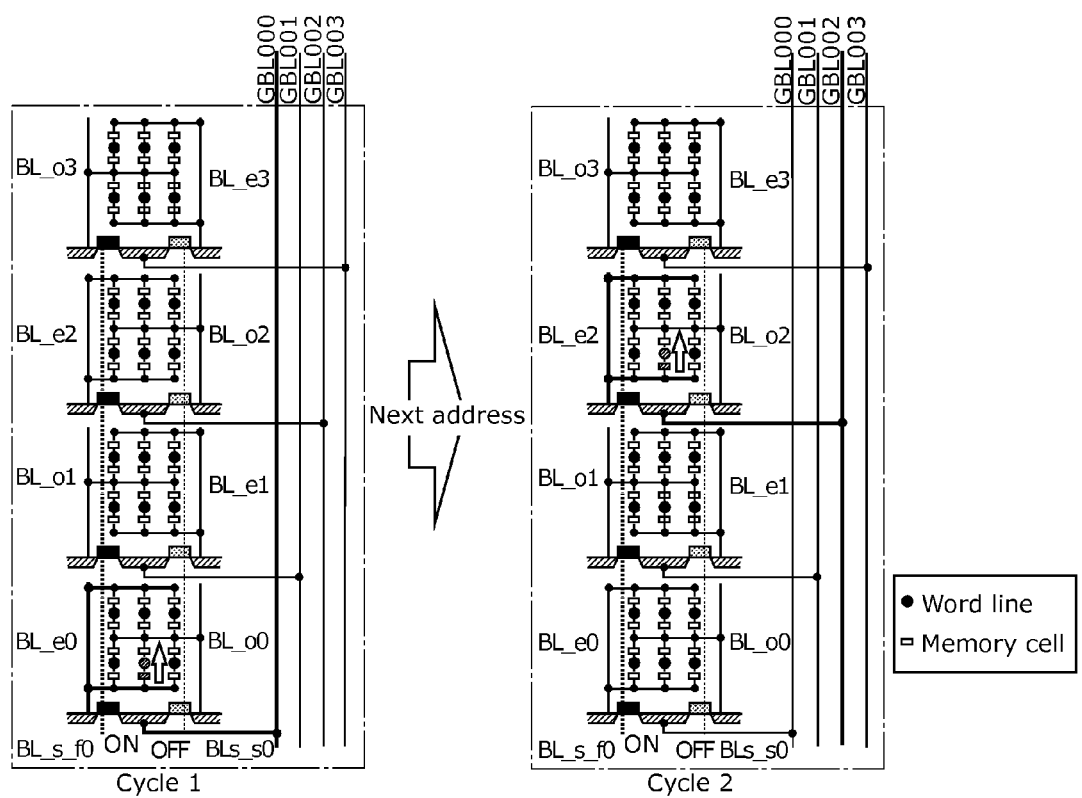
FIG. 11B is a schematic diagram illustrating writing operation according to the embodiment of the present invention.

FIG. 11B is a schematic diagram for describing such writing operation according to an embodiment of the present invention.

First, in cycle 1, the control unit makes a first access. Specifically, a memory cell is written to (is caused to have low resistance) which is connected to the word line WL00000 and one of the bit lines BL_e0 in the basic array plane 0. At this time, the global bit line GBL000 and the word line WL00000 are selected. Since the selection switch controlled by the bit line selection signal BLs_f0 is turned ON, the selected bit lines are BL_e0.

Voltages are applied to the selected word line and the selected bit lines so that the selected memory cell is caused to have low resistance.

Therefore, as illustrated in FIG. 11B, a current flows into the selected memory cell from the selected bit line BL_e0 side, or in other words, from the variable resistance element side, thereby causing the memory cell to have low resistance.

In cycle 2 following cycle 1, the control unit makes a second access. Specifically, a memory cell is selected which is connected to the word line WL00000 not in the basic array plane 1 adjacent to the basic array plane 0 in the Y direction, but in the basic array plane 2 adjacent to the basic array plane 1. Specifically, the global bit line GBL002 is selected and the selected bit lines BL_e2 are selected.

As illustrated in FIG. 11B, if voltages are applied to the word line and the bit lines in this state as in cycle 1, a current flows into the selected memory cell from the selected bit line BL_e2 side, or in other words, the variable resistance element side, thereby causing the memory cell to have low resistance. Accordingly, it is not necessary to perform control for changing a voltage applied to the word line and a voltage applied to the bit lines.

Figure 12B:
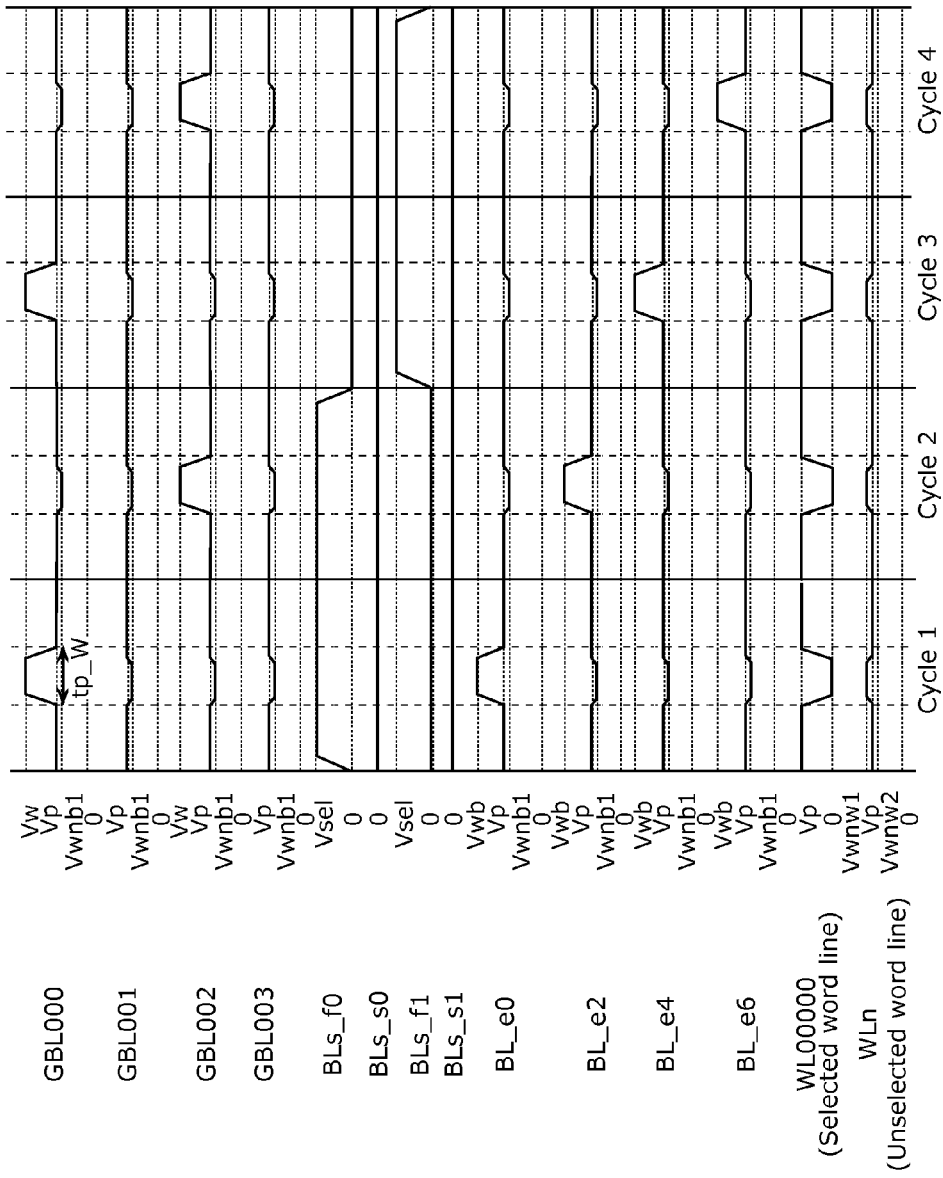
FIG. 12B is a timing waveform diagram for writing operation according to the embodiment of the present invention.

Next, a detailed description is given of the writing operation in FIG. 11B, using a timing wave form chart for writing operation illustrated in FIG. 12B.

First, in cycle 1, a memory cell is written to (is caused to have low resistance) which is connected to the word line WL00000 and one of the bit lines BL_e0 in the basic array plane 0. First, the precharge voltage Vp is applied to the selected global bit line GBL000 and the selected word line WL00000. The precharge voltage is not applied to the other unselected global bit lines and the other unselected word lines. In addition, the selection voltage Vsel is applied to the first bit line selection signal BLs_f0, and the selected bit lines BL_e0 are precharged to the precharge voltage Vp. Unselected global bit lines, unselected bit lines, and unselected word lines are precharged to the precharge voltage Vp by a current which has leaked from the selected bit lines and the selected word line via memory cells.

Next, the writing voltage Vw is applied to the selected global bit line GBL000, thereby applying the writing voltage Vwb to the selected bit lines BL_e0. In addition, 0 V is applied to the selected word line WL00000, and the writing voltage Vwb is applied to the memory cell connected to the selected word line WL00000 and one of the selected bit lines BL_e0, thereby writing to the memory cell. It should be noted that when not writing to the memory cell connected to the word line WL00000 and one of the bit lines BL_e0, it is sufficient that the word line and the bit lines remain at the precharge voltage and the writing voltage is not applied.

Next, in cycle 2 following cycle 1, a memory cell is written to (is caused to have low resistance) which is connected to the word line WL00000 and one of the bit lines BL_e2 in the basic array plane 2 adjacent to the basic array plane 1 in the Y direction on a side opposite to the basic array plane 0 which is adjacent to the basic array plane 1 in the Y direction. First, the precharge voltage Vp is applied to the selected global bit line GBL002 and the selected word line WL00000. The precharge voltage is not applied to the other unselected global bit lines and the other unselected word lines. In addition, the selection voltage Vsel is continuously applied to the first bit line selection signal BLs_f0, and the selected bit lines BL_e2 are precharged to the precharge voltage Vp. Unselected global bit lines, unselected bit lines, and unselected word lines are precharged to the precharge voltage Vp by a current which has leaked from the selected bit lines and the selected word line via memory cells.

Next, a writing voltage Vw is applied to the selected global bit line GBL002, thereby applying the writing voltage Vwb to the selected bit lines BL_e2. In addition, 0 V is applied to the selected word line WL00000, and the writing voltage Vwb is applied to the memory cell connected to the selected word line WL00000 and one of the selected bit lines BL_e2, thereby writing to the memory cell. It should be noted that when not writing to the memory cell connected to the word line WL00000 and one of the bit lines BL_e2, it is sufficient that the word line and the bit lines remain at the precharge voltage and the writing voltage is not applied.

Furthermore, in cycle 3 following cycle 2, a memory cell is written to (is caused to have low resistance) which is connected to the word line WL00000 and one of the bit lines BL_e4 in the basic array plane 4 adjacent to the basic array plane 3 in the Y direction on a side opposite to the basic array plane 2 which is adjacent to the basic array plane 3 in the Y direction. First, the precharge voltage Vp is applied to the selected global bit line GBL004 and the selected word line WL00000. The precharge voltage is not applied to the other unselected global bit lines and the other unselected word lines. In addition, the selection voltage Vsel is continuously applied to the first bit line selection signal BLs_f1, and the selected bit lines BL_e4 are precharged to the precharge voltage Vp. Unselected global bit lines, unselected bit lines, and unselected word lines are precharged to the precharge voltage Vp by a current which has leaked from the selected bit lines and the selected word line via memory cells.

Next, the writing voltage Vw is applied to the selected global bit line GBL000, thereby applying the writing voltage Vwb to the selected bit lines BL_e4. In addition, 0 V is applied to the selected word line WL00000, and the writing voltage Vwb is applied to the memory cell connected to the selected word line WL00000 and one of the selected bit lines BL_e4, thereby writing to the memory cell. It should be noted that when not writing to the memory cell connected to the word line WL00000 and one of the bit lines BL_e4, it is sufficient that the word line and the bit lines remain at the precharge voltage and the writing voltage is not applied. After that, in cycle 4 following cycle 3, writing is also performed using a corresponding global bit line by the same method as that used in cycles 1 to 3.

With the above writing method, the writing voltage Vw is applied to the global bit line GBL000 and 0 V is applied to the word line WL00000 in cycle 1. Also in cycle 2 following cycle 1, the writing voltage Vw is applied to the global bit line GBL002, and 0 V is applied to the word line WL00000, similarly. The same applies to the following cycles. Thus, also in any of the cycles, the voltage applied to a global bit line is the writing voltage Vw, and the voltage applied to a word line is 0 V. Thus, it is not necessary to change voltages applied in each cycle, which allows the control for applying voltages to a global bit line and a word line to be simplified. In addition, a potential relation between a selected word line and a selected bit line does not change in each cycle, and thus the potential of an unselected word line and an unselected bit line does not change in each cycle, either, thereby reducing power consumption.

It should be noted that address selection in the above method may be changed so as to designate the basic array planes 0, 2, 4 and so on in the stated order using the address signal in FIG. 9, or a circuit may be configured such that address control signals are generated for the basic array planes 0, 2, 4 and so on in the stated order in the address input circuit in FIG. 9, after an address signal is given as with a conventional technique.

A description is given of another embodiment of access operation according to the present invention, using schematic diagrams.

Figure 11C:
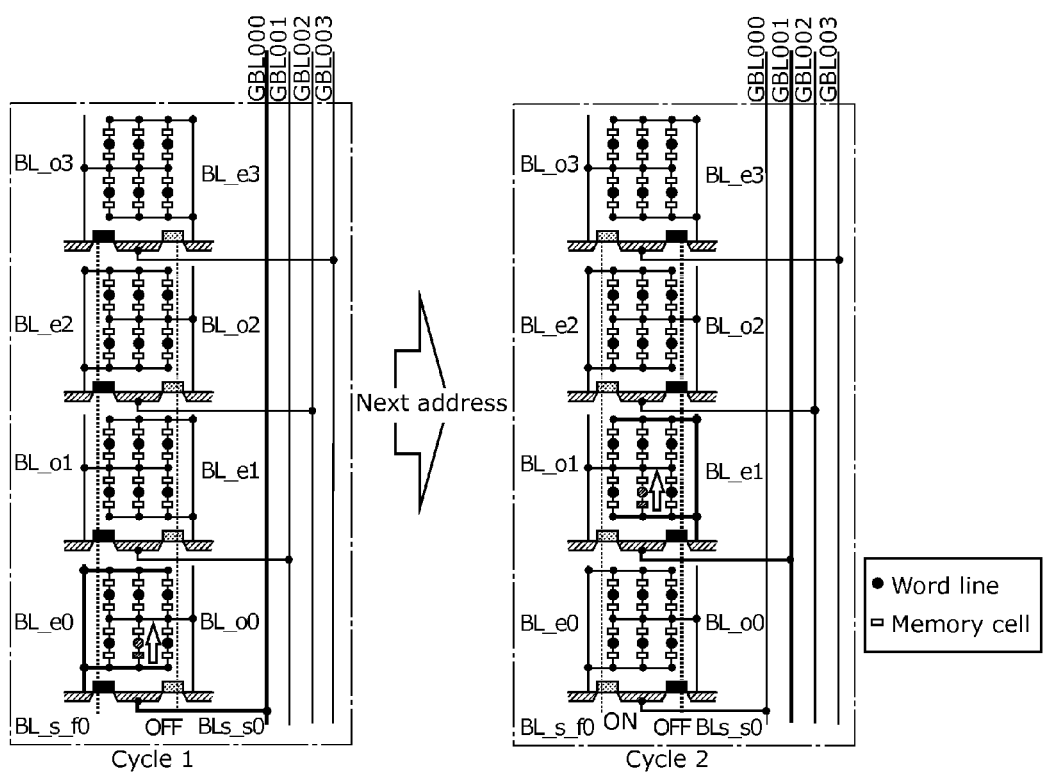
FIG. 11C is a schematic diagram illustrating writing operation according to another embodiment of the present invention.

FIG. 11C is a schematic diagram for describing such writing operation according to another embodiment of the present invention.

First, in cycle 1, the control unit makes a first access. Specifically, a memory cell is written to (is caused to have low resistance) which is connected to the word line WL00000 and one of the bit lines BL_e1 in the basic array plane 0. At this time, the global bit line GBL000 and the word line WL00000 are selected. Since the selection switch controlled by the bit line selection signal BLs_f0 is turned ON, selected bit lines are BL_e0.

Voltages are applied to the selected word line and the selected bit lines so that the selected memory cell is caused to have low resistance.

Accordingly, as illustrated in FIG. 11C, a current flows into the selected memory cell from the selected bit line BL_e0 side, or in other words, the variable resistance element side, thereby causing the memory cell to have low resistance.

In cycle 2 following cycle 1, the control unit makes a second access. Specifically, a memory cell is selected which is connected to the word line WL00000 in the basic array plane 1 adjacent to the basic array plane 0 in the Y direction. Specifically, the global bit line GBL001 is selected.

The selected bit lines BL_e1 are selected in cycle 2. Specifically, in cycle 2, the selection switch controlled by the bit line selection signal BLs_f0 is turned OFF, and the selection switch controlled by the bit line selection signal BLs_s0 is turned ON, thereby selecting the selected bit lines BL_e1.

As illustrated in FIG. 11C, if voltages are applied to the word line and the bit lines in this state as in cycle 1, a current flows into the selected memory cell from the selected bit line BL_e1 side, or in other words, the variable resistance element side, thereby causing the memory cell to have low resistance. Accordingly, it is not necessary to perform control to change a voltage applied to the word line and a voltage applied to the bit lines.

Figure 12C:
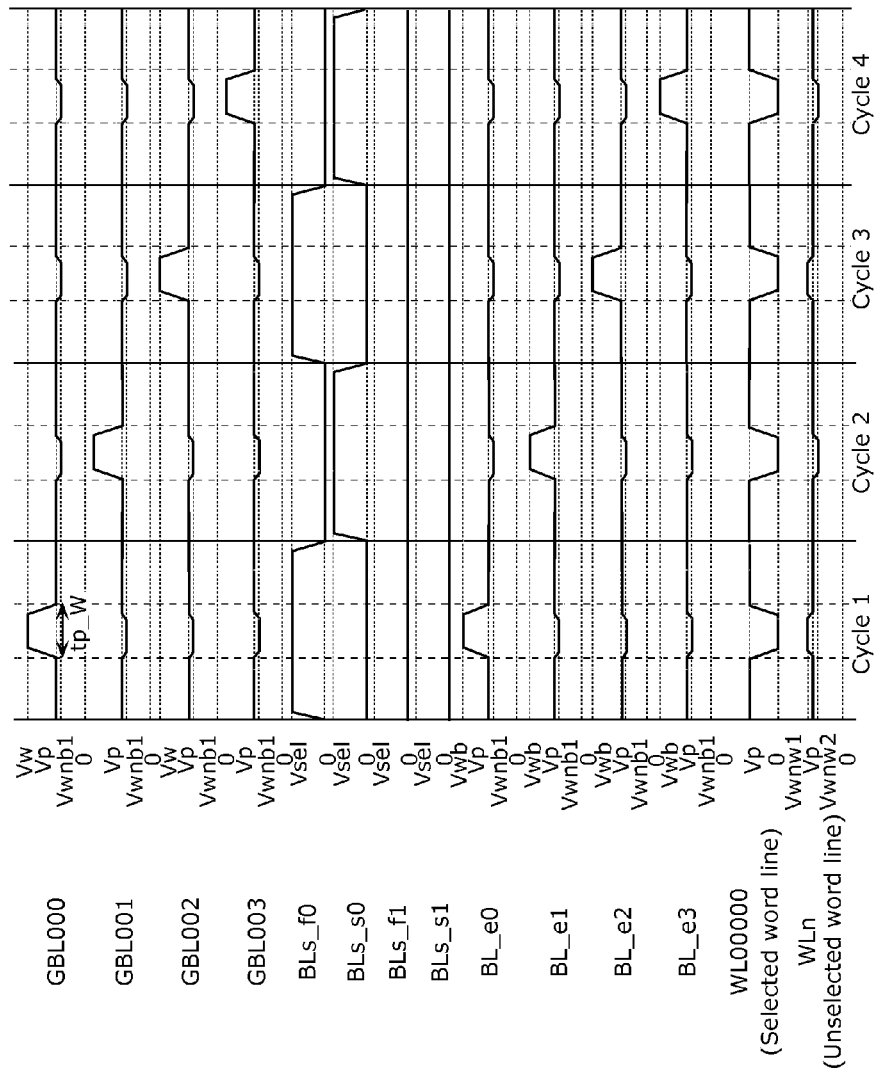
FIG. 12C is a timing waveform diagram for writing operation according to another embodiment of the present invention.

Next, a detailed description is given of operation in FIG. 11C, using the timing wave form chart for writing operation illustrated in FIG. 12C.

First, in cycle 1, a memory cell is written to (is caused to have low resistance) which is connected to the word line WL00000 and one of the bit lines BL_e0 in the basic array plane 0. First, the precharge voltage Vp is applied to the selected global bit line GBL000 and the selected word line WL00000. The precharge voltage is not applied to the other unselected global bit lines and the other unselected word lines. In addition, the selection voltage Vsel is applied to the first bit line selection signal BLs_f0, and the selected bit lines BL_e0 are precharged to the precharge voltage Vp. Unselected global bit lines, unselected bit lines, and unselected word lines are precharged to the precharge voltage Vp by a current which has leaked from the selected bit lines and the selected word line via memory cells.

Next, the writing voltage Vw is applied to the selection global bit line GBL000, thereby applying the writing voltage Vwb to the selected bit lines BL_e0. In addition, 0 V is applied to the selected word line WL00000, and the writing voltage Vwb is applied to the memory cell connected to the selected word line WL00000 and one of the selected bit lines BL_e0, thereby writing to the memory cell. It should be noted that when not writing to the memory cell connected to the word line WL00000 and one of the bit lines BL_e0, it is sufficient that the word line and the bit lines remain at the precharge voltage and a writing voltage is not applied.

Next, in cycle 2 following cycle 1, a memory cell is written to (is caused to have low resistance) which is connected to the word line WL00000 and one of the bit lines BL_e1 in the basic array plane 1 adjacent to the basic array plane 0 in the Y direction. First, the precharge voltage Vp is applied to the selected global bit line GBL001 and the selected word line WL00000. The precharge voltage is not applied to the other unselected global bit lines and the other unselected word lines. In addition, 0 V is applied to the first bit line selection signal BLs_f0, and the selection voltage Vsel is applied to the second bit line selection signal BLs_s0, and the selected bit lines BL_e1 are precharged to the precharge voltage Vp. Unselected global bit lines, unselected bit lines, and unselected word lines are precharged to the precharge voltage Vp by a current which has leaked from the selected bit lines and the selected word line via memory cells.

Next, the writing voltage Vw is applied to the selected global bit line GBL001, thereby applying the writing voltage Vwb to the selected bit line BL_e1. In addition, 0 V is applied to the selected word line WL00000, and the writing voltage Vwb is applied to the memory cell connected to the selected word line WL00000 and one of the selected bit lines BL_e1, thereby writing to the memory cell. It should be noted that when not writing to the memory cell connected to the word line WL00000 and one of the bit lines BL_e1, it is sufficient that the word line and the bit lines remain at the precharge voltage and the writing voltage is not applied. After that, in cycles 3 and 4 following cycle 2, writing is also performed using a corresponding global bit line by the same method as that used in cycles 1 and 2.

With the above writing method, the writing voltage Vw is applied to the global bit line GBL000, and 0 V is applied to the word line WL00000 in cycle 1. Also, in cycle 2, the writing voltage Vw is applied to the global bit line GBL001, and 0 V is applied to the word line WL00000. The same applies to the following cycles. Thus, also in any of the cycles, the voltage applied to a global bit line is the writing voltage Vw, and the voltage applied to a word line is 0 V. Thus, it is not necessary to change voltages applied in each cycle, which allows the control for applying voltages to a global bit line and a word line to be simplified. In addition, a potential relation between a selected word line and a selected bit line does not change in each cycle, and thus the potential of an unselected word line and an unselected bit line does not change in each cycle, either, thereby reducing power consumption.

It should be noted that address selection in the above method may be performed by alternately selecting the first bit line selection signal and the second bit line selection signal in each cycle, using the address signal in FIG. 9, or a circuit may be configured so that the first bit line selection signal and the second bit line selection signal are alternately generated in each cycle in the address input circuit in FIG. 9, after an address signal is given as with a conventional technique.

It should be noted that the above is a description of the case of writing to a certain area in a memory cell array while incrementing an address in successive cycles, and the same also applies to erase operation.

In addition, such an address selection method is also applicable to read operation. A potential relation between a selected word line and a selected bit line does not change in each cycle, which allows read operation to be stably performed.

<Physical Structure (Layout) of Basic Array Plane Group>

Figure 13:
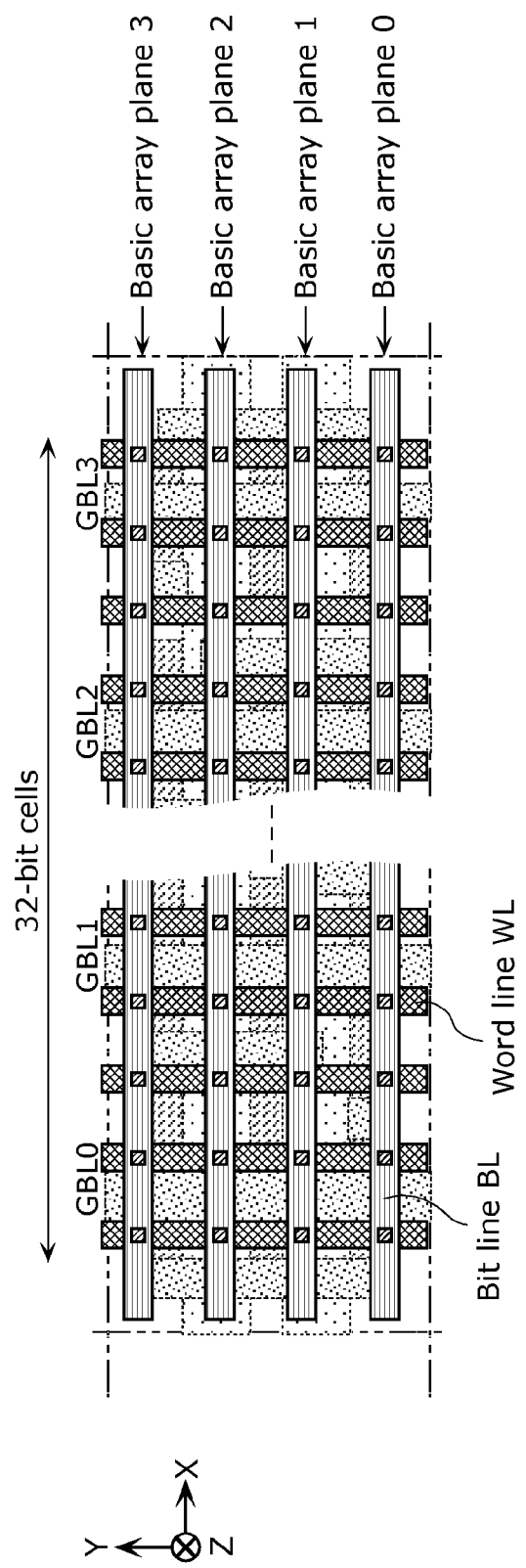
FIG. 13 is a plan view illustrating a physical structure of the basic array plane group according to the present invention.
Figure 14:
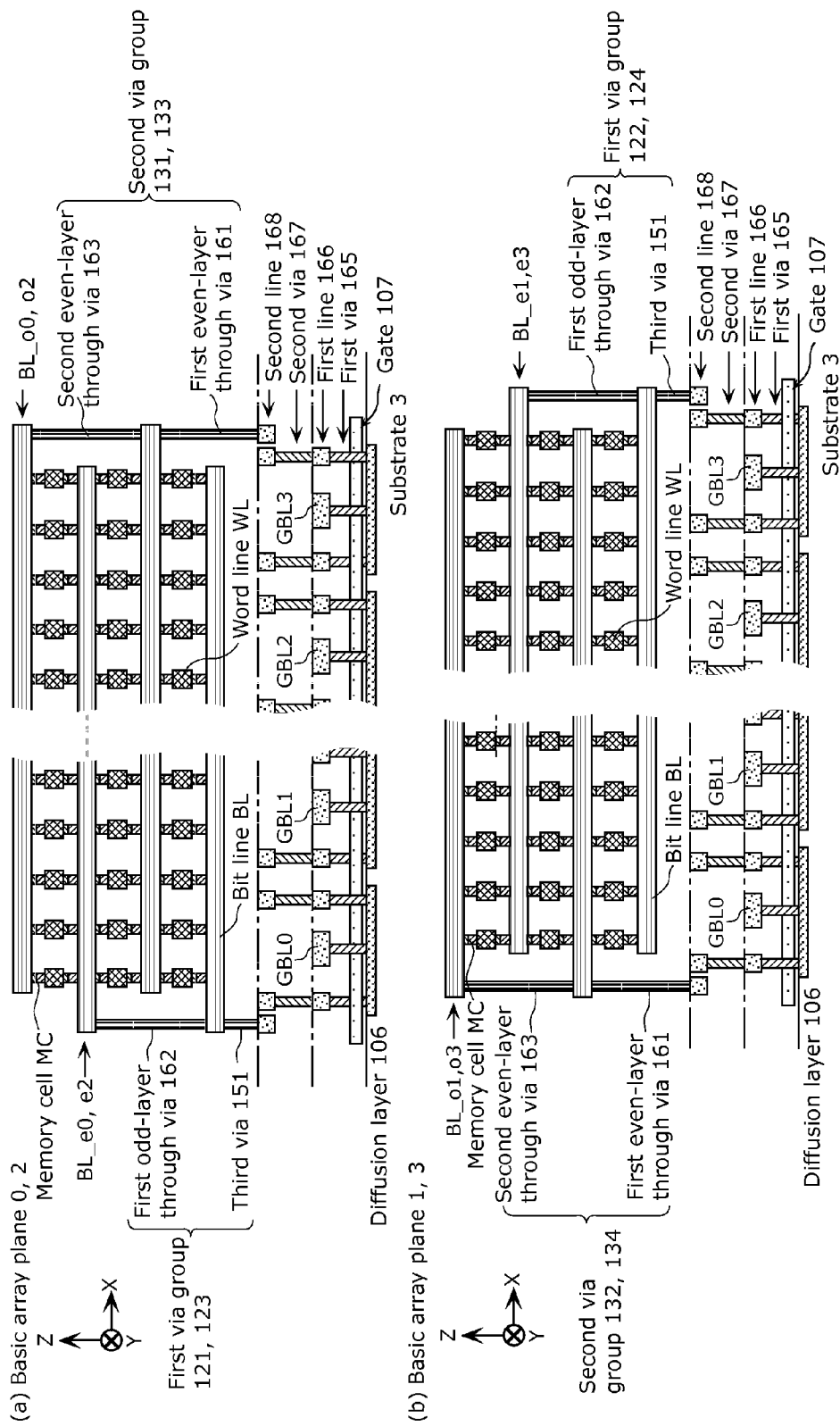
FIG. 14 Parts (a) and (b) of FIG. 14 are cross-sectional views illustrating physical structures of the basic array plane group according to the present invention.

FIG. 13 and (a) and (b) of FIG. 14 illustrate an embodiment of a physical structure of a basic array plane group according to the present embodiment. FIG. 13 is a plan view, and (a) and (b) of FIG. 14 are cross-sectional views. In FIG. 13, a horizontal direction is the X direction in which bit lines BL extend, a vertical direction is the Y direction in which word lines WL extend, and the direction orthogonal to the plane of the drawing is the Z direction. In (a) and (b) of FIG. 14, a horizontal direction is the X direction in which bit lines BL extend, a vertical direction is the Z direction, and a direction orthogonal to the plane of the drawings is the Y direction in which word lines WL extend.

In the physical structure illustrated in FIG. 13, and (a) and (b) of FIG. 14, a basic array plane group in which a plurality of memory cells MC are arranged is formed above a substrate 3. Global bit lines GBL0 to GBL3 are formed to extend in the Y direction in a layer (layer of first lines 166) under bit lines BL in the undermost layer. Further, each of the first and second selection switch elements includes a metal-oxide-semiconductor field-effect transistor (MOSFET), and includes a diffusion layer 106 and a gate 107 which are formed over the substrate 3, and under the global bit lines GBL0 to GBL3. The global bit lines GBL0 to GBL3 and the diffusion layer 106 are connected via first vias 165.

Further, in the basic array planes 0 to 3, bit lines BL in even layers (here, bit lines in two layers) are commonly connected via one of the first via groups 121 to 124 (first odd-layer through vias 162) which connect the even-layer bit lines (BL_e0 to BL_e3). Similarly, bit lines BL in odd layers (here, bit lines in two layers) are commonly connected via one of the second via groups 131 to 134 (second even-layer through vias 163) which connect the odd-layer bit lines (BL_o0 to BL_o3). Then, each set of the even-layer bit lines BL_e0 to BL_e3 which are commonly connected is connected to a second line 168 via a third via (via 151), and each set of the odd-layer bit lines BL_o0 to BL_o3 which are commonly connected is connected to a second line 168 via a first even-layer through via (via 161).

Here, (a) of FIG. 14 illustrates a cross-sectional view of the basic array planes 0 and 2, and (b) of FIG. 14 illustrates a cross-sectional view of the basic array planes 1 and 3. As illustrated in (a) of FIG. 14, in the basic array planes 0 and 2, the first via groups 121 and 123 which respectively connect the even-layer bit lines BL_e0 and BL_e2 to the second line 168 are arranged on the left side in the basic array planes, and the second via groups 131 and 133 which respectively connect the odd-layer bit lines BL_o0 and BL_o2 to the second line 168 are arranged on the right side in the basic array planes. In contrast, as illustrated in (b) of FIG. 14, in the basic array planes 1 and 3, the first via groups 122 and 124 which respectively connect the even-layer bit lines BL_e1 and BL_e3 to the second line 168 are arranged on the right side in the basic array planes, and the second via groups 132 and 134 which respectively connect the odd-layer bit lines BL_o1 and BL_o3 to the second line 168 are arranged on the left side in the basic array planes.

Figure 15:
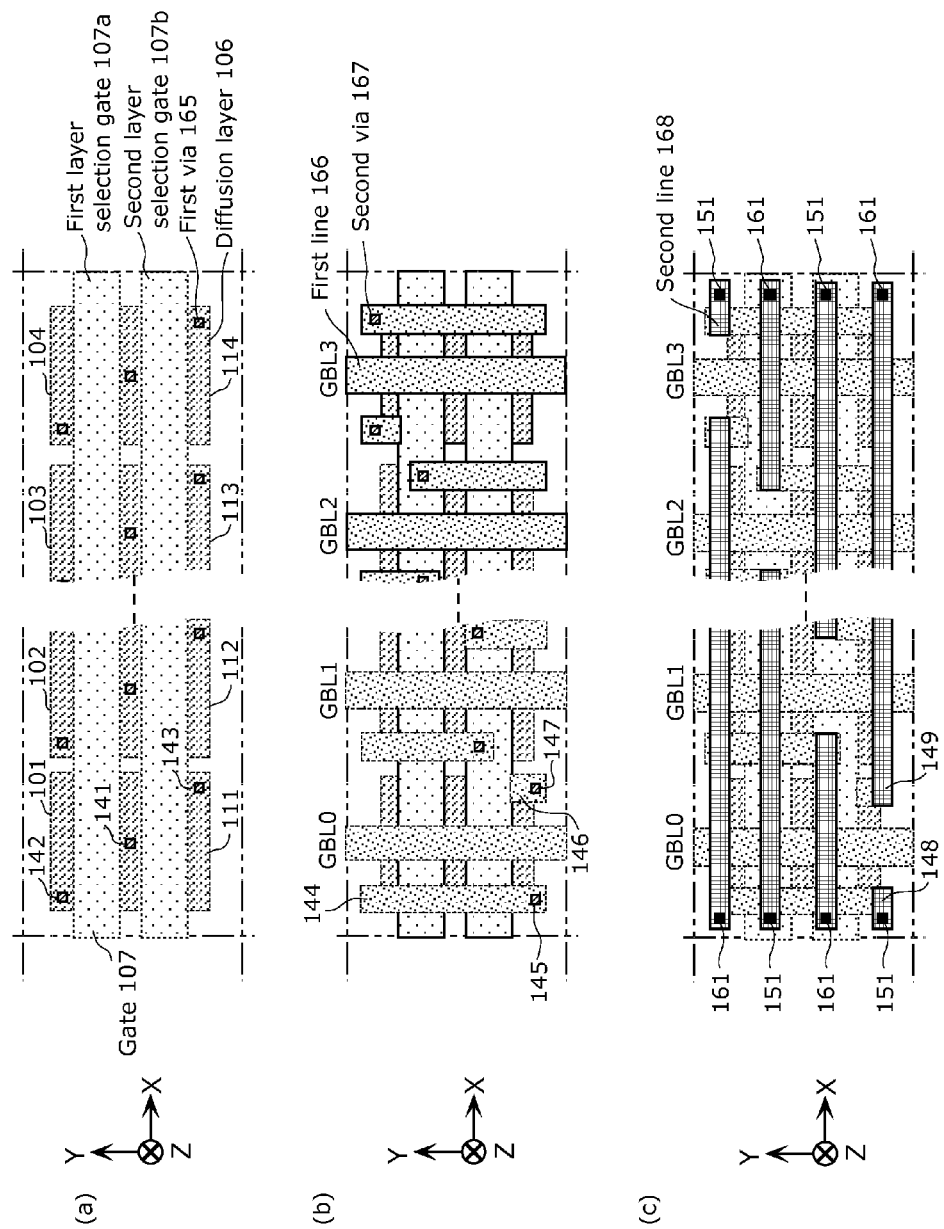
FIG. 15 Parts (a) to (c) of FIG. 15 are plan views each illustrating a layer obtained by dividing the physical structure of the basic array plane group according to the present invention.
Figure 16:
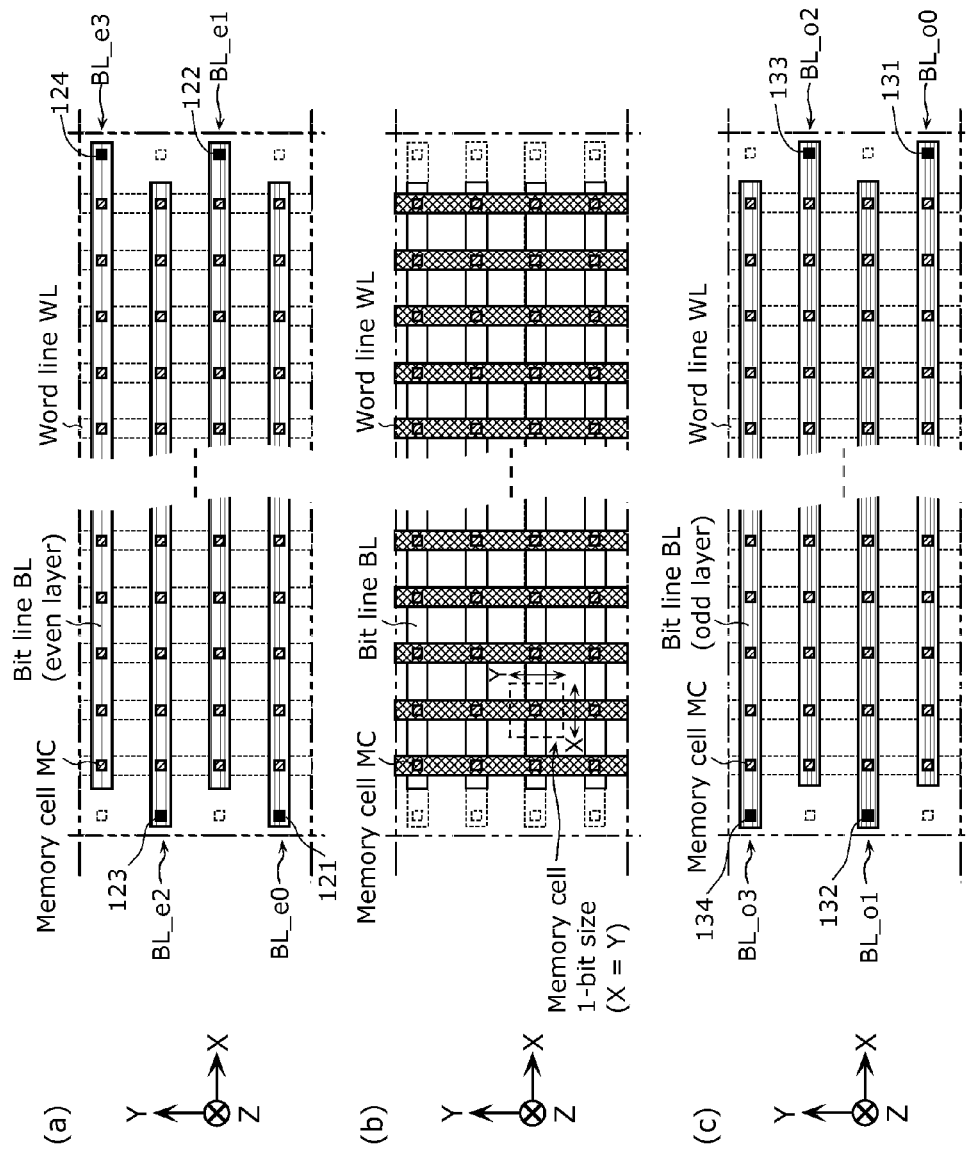
FIG. 16 Parts (a) to (c) of FIG. 16 are plan views each illustrating a layer obtained by dividing the physical structure of the basic array plane group according to the present invention.

Parts (a) to (c) of FIG. 15 and (a) to (c) of FIG. 16 are plan views each of which illustrates a layer obtained by dividing the physical structure illustrated in FIG. 13 and (a) and (b) of FIG. 14. The physical structure of the basic array plane group according to the present embodiment is described in more detail, using (a) to (c) of FIG. 15 and (a) to (c) of FIG. 16.

Part (a) of FIG. 15 is a plan view illustrating a state in which a diffusion layer and gates that are included in the first and second selection switch elements and the first vias 165 are formed. As illustrated in (a) of FIG. 15, each of the first selection switch elements 101 to 104 and the second selection switch elements 111 to 114 illustrated in FIG. 6 includes a MOSFET which includes the diffusion layer 106 and the gate 107 (107a and 107b). Further, a MOSFET included in the first selection switch element 101 and the second selection switch element 111 in the basic array plane 0 shares one of diffusion regions serving as a sauce or a drain, and forms a MOSFET pair. Similarly, each set of the first selection switch element 102 and the second selection switch element 112 in the basic array plane 1, the first selection switch element 103 and the second selection switch element 113 in the basic array plane 2, and the first selection switch element 104 and the second selection switch element 114 in the basic array plane 3 shares a diffusion region, and forms a MOSFET pair.

Four MOSFET pairs are arranged such that the gate length direction thereof is the same direction as the Y direction, and arranged in the X direction. It should be noted that the number of MOSFET pairs corresponds to the number of basic array planes in a basic array plane group, and in the case of n basic array planes (n is an integer of 2 or greater), n MOSFET pairs will be aligned.

Further, in the four MOSFET pairs, the gates of the MOSFETs included in the first selection switch elements 101 to 104 are connected to one another to form the first selection gate 107a, and also the gates of the second selection switch elements 111 to 114 are connected to one another to form the second selection gate 107b. The first bit line selection signal BLs_f0 is applied to the first selection gate 107a, and the second bit line selection signal BLs_s0 is applied to the second selection gate 107b.

The first vias 165 (such as vias 141) for connection to the global bit lines GBL0 to GBL3 are respectively formed in the shared diffusion regions in the MOSFET pairs. Further, the first vias 165 (such as vias 142) for connection to the bit lines BL_e0, BL_o1, BL_e2, and BL_o3 are respectively formed in the other diffusion regions of the first selection switch elements 101 to 104, and the first vias 165 (such as vias 143) for connection to the bit lines BL_o0, BL_e1, BL_o2, and BL_e3 are respectively formed in the other diffusion regions of the second selection switch elements 111 to 114.

Part (b) of FIG. 15 is a plan view illustrating a state in which the first lines 166 including the global bit lines and second vias 167 are formed over the structure in (a) of FIG. 15. As illustrated in (b) of FIG. 15, each of the global bit lines GBL0 to GBL3 extends in the Y direction, and is connected to the shared diffusion region in a corresponding MOSFET pair via the first via 165 (such as via 141). Further, lines (such as lines 144) connected to the other diffusion regions of the first selection switch elements 101 to 104 via the first vias 165 are provided. In addition, the second vias 167 (such as vias 145) for connection to the bit lines BL_e0, BL_o1, BL_e2, and BL_o3 are formed in the lines. Furthermore, lines (such as lines 146) connected to the other diffusion regions of the second selection switch elements 111 to 114 via the first vias 165 (such as vias 143) are provided. In addition, the second vias 167 (such as vias 147) for connecting the lines (such as lines 146) to the bit lines BL_o0, BL_e1, BL_o2, and BL_e3 are formed.

Part (c) of FIG. 15 is a plan view illustrating the state in which the second lines 168, the third vias, and the first even-layer through vias are formed over the structure in (b) of FIG. 15. The second lines 168 are formed in a wiring layer provided between the global bit lines GBL and the basic array plane group. As illustrated in (c) of FIG. 15, the third vias 151 of the basic array planes 0 and 2 and the first even-layer through vias 161 of the basic array planes 1 and 3 are aligned in the Y direction at the left ends of the second lines 168, and the first even-layer through vias 161 of the basic array planes 0 and 2 and the third vias 151 of the basic array planes 1 and 3 are aligned in the Y direction at the right ends of the second lines 168. Specifically, respective via regions for common connection of even-layer bit lines BL_e0 commonly connected in the basic array plane 0, the odd-layer bit lines BL_o1 commonly connected in the basic array plane 1, the even-layer bit lines BL_e2 commonly connected in the basic array plane 2, and the odd-layer bit lines BL_o3 commonly connected in the basic array plane 3 are disposed to be adjacent to each other in the Y direction at the left ends of the second lines 168, and also respective via regions for common connection of the odd-layer bit lines BL_o0 commonly connected in the basic array plane 0, the even-layer bit lines BL_e1 commonly connected in the basic array plane 1, the odd-layer bit lines BL_o2 commonly connected in the basic array plane 2, and the even-layer bit lines BL_e3 commonly connected in the basic array plane 3 are disposed to be adjacent to each other in the Y direction at the right ends of the second lines 168. Further, as is clear from the cross-sectional views of (a) and (b) of FIG. 14, the via groups of the bit lines BL which are commonly connected extend in a direction perpendicular to the substrate 3 from the via regions in the wiring layer.

In addition, lines (such as lines 148) are provided to connect the third vias 151 to the second vias 167 (such as vias 145) connected to the other diffusion regions of the selection switch elements 101, 112, 103, and 114. Further, lines (such as lines 149) are provided to connect the first even-layer through vias to the second vias 167 (such as vias 147) connected to the other diffusion regions of the second selection switch elements 111, 102, 113, and 104. Accordingly, the vias 151 and 161 are respectively connected to unshared diffusion regions of the first selection switch elements 101 to 104 and the second selection switch elements 111 to 114.

In this manner, a wiring layer is provided between the global bit lines and the basic array plane group, and the lines in this wiring layer are caused to be interposed for the electrical connection between the commonly-connected bit lines and the selection switch elements. Consequently, the arrangement of the selection switch elements is not restricted due to the arrangement of the bit line contact regions, thus enabling the arrangement and a size configuration with high flexibility.

Part (a) of FIG. 16 is a plan view illustrating the even-layer bit lines formed above the structure in (c) of FIG. 15. As illustrated in (a) of FIG. 16, the even-layer bit lines BL (BL_e0 to BL_e3) are commonly connected via the first via groups 121 to 124 which connect the bit lines in even layers in the common Z direction, and are further connected to the third vias 151 illustrated in (c) of FIG. 15. It should be noted that memory cells MC are represented using rectangles in (a) of FIG. 16 and other plan views, but have a circular shape in the actual finished dimension.

Here, at the point in time when even-layer bit lines are formed, odd-layer through vias are not formed (dotted-line squares in the drawing), and the interval between the sets of the even-layer bit lines in the via regions is twice as much as the interval between the basic array planes (in the drawing, between BL_e0 and BL_e2 and between BL_e1 and BL_e3), which achieves an advantage of allowing a process to be performed with ease.

Part (b) of FIG. 16 is a plan view illustrating word lines formed above the structure in (c) of FIG. 15. Further, in (b) of FIG. 16, a dashed-line rectangle shows a 1-bit (pitch) size of a memory cell MC. Although the pitch in the X direction (bit line direction) is the same as the pitch in the Y direction (word line direction) here, the pitches do not need to be the same.

Part (c) of FIG. 16 is a plan view illustrating odd-layer bit lines formed above the structure in (c) of FIG. 15. As illustrated in (c) of FIG. 16, the odd-layer bit lines BL (BL_o0 to BL_o3) are commonly connected via the second via groups 131 to 134 which connect the bit lines in odd layers in the common Z direction, and are further connected to the first even-layer through vias 161 illustrated in (c) of FIG. 15.

Further, at the point in time when the odd-layer bit lines are formed, the even-layer through vias are not formed (dotted-line squares in the drawing), and the interval between the sets of the odd-layer bit lines in the via regions is twice as much as the interval between the basic array planes (in the drawing, between BL_o0 and BL_o2 and between BL_o1 and BL_o3), which achieves an advantage of allowing a process to be performed with ease.

Figure 17:
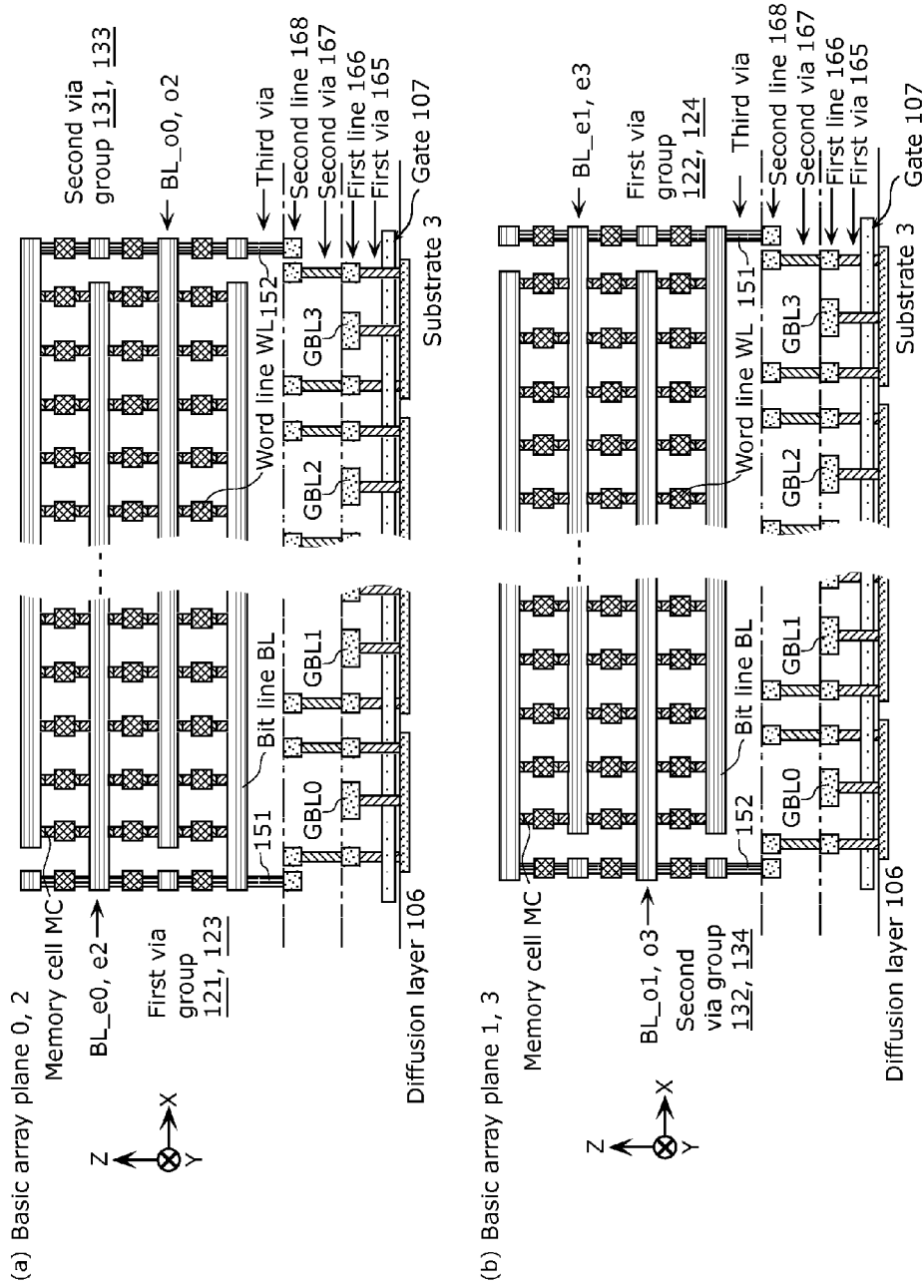
FIG. 17 Parts (a) and (b) of FIG. 17 are cross-sectional views each illustrating a physical structure of the basic array plane group according to the present invention.
Figure 18:
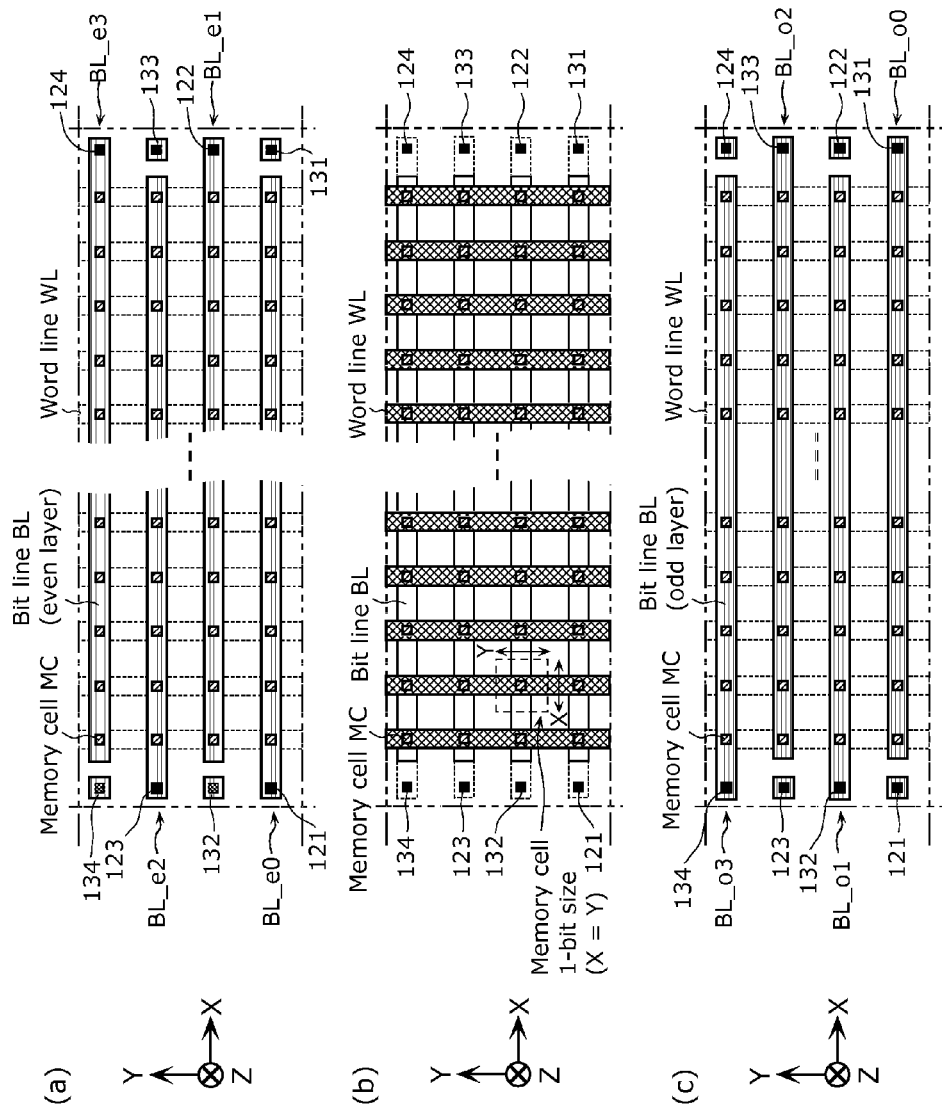
FIG. 18 Parts (a) to (c) of FIG. 18 are plan views each illustrating a layer obtained by dividing the physical structure of the basic array plane group according to the present invention.

It should be noted that each of the first via groups 121 to 124 and the second via groups 131 to 134 may be formed by disposing, in layers of word lines and bit lines which are not connected to the via group, separate wiring patterns for connecting upper and lower vias, and connecting the wiring layers using the vias, as illustrated in (a) and (b) of FIG. 17 and (a) to (c) of FIG. 18.

<Feature of Variable Resistance Nonvolatile Memory Device 500 According to Present Invention>

In considering the structure of multilayer hierarchical bit lines, inventors of the present invention noted the following points.

As the first point, the inventors thought that fluctuations in the read speed can be reduced by arranging and controlling lines such that during a reading operation, the behavior of signals is always the same in unselected bit lines adjacent to a selected bit line on both sides in the Y direction, irrespective of the position of the selected bit line.

In the variable resistance nonvolatile memory device 500 according to the present invention, bit lines and bit line selection switches are arranged and controlled such that when an even-layer bit line is selected in a certain basic array plane, even-layer bit lines in basic array planes adjacent on both sides in the Y direction are always disconnected from respective global bit lines, whereas when an odd-layer bit line is selected in a certain basic array plane, odd-layer bit lines in basic array planes adjacent on both sides in the Y direction are always disconnected from respective global bit lines, thereby causing the behavior of signals to be always the same in unselected bit lines adjacent on both sides in the Y direction, irrespective of the position of a bit line to be selected. This line arrangement and control enables a reduction in fluctuations in the read speed depending on a selected position, and thus bit lines can be provided at minimum intervals.

As the second point, the inventors conceived the physical structure of vias in which in the Z direction that is a layer stacking direction, even-layer bit lines adjacent to each other with an odd layer interposed therebetween are connected using a single via (such as the first odd-layer through via 162), and similarly odd-layer bit lines adjacent to each other with an even layer interposed therebetween are connected using a single via (such as the second odd-layer through via 163), thereby preventing a wiring layer from being provided in a word line or bit line layer which is not connected to a via group. With this physical structure of vias, at the point in time when forming even-layer bit lines, the first odd-layer through vias 162 are not formed, and an interval between sets of even-layer bit lines in via regions is twice as much as the interval between basic array planes, which achieves an advantage of allowing a process to be performed with ease. The same also applies to the forming of odd layers.

In the variable resistance nonvolatile memory device, there is a case in which a current used for writing and erasing needs to be limited when performing write and erase operation. An example of such a case is when the state of a variable resistance element is changed from the high resistance state to the low resistance state. In this case, it is sufficient to provide, in the configuration of the basic array plane group according to the embodiment of the present invention illustrated in FIG. 6, current limiting circuits 171 to 175 and 181 to 185 between the global bit lines GBL000 to GBL003 and bit line selection switch elements 101 to 105 and 111 to 115, as in FIG. 19.

Specifically, for each of the basic array planes, a current limiting circuit is obtained by inserting, between one of the global bit lines GBL000 to GBL003 and one of the connection points of the first selection switch elements 101 to 105 and the second selection switch elements 111 to 115, a parallel circuit including one of the pairs of the N-MOS transistors 171 to 175 and the P-MOS transistors 181 to 185. In the writing and erasing, between an N-MOS transistor and a P-MOS transistor which form a pair, only one of the transistors which performs a source follower operation is turned ON, thereby causing the transistor which is ON to operate as a current limiting circuit due to a substrate bias effect, for example. Specifically, when a current is caused to flow from a memory cell towards a global bit line, only a P-MOS transistor is turned ON, whereas when a current is caused to flow from a global bit line towards a memory cell, only an N-MOS transistor is turned ON, thereby enabling limitation of a current. Accordingly, it is possible to avoid a problem that when the state of a variable resistance element is changed from a high resistance state to a low resistance state, the resistance of the variable resistance element is excessively decreased due to an excessive current, and thus the following operations become unstable.

Figure 19:
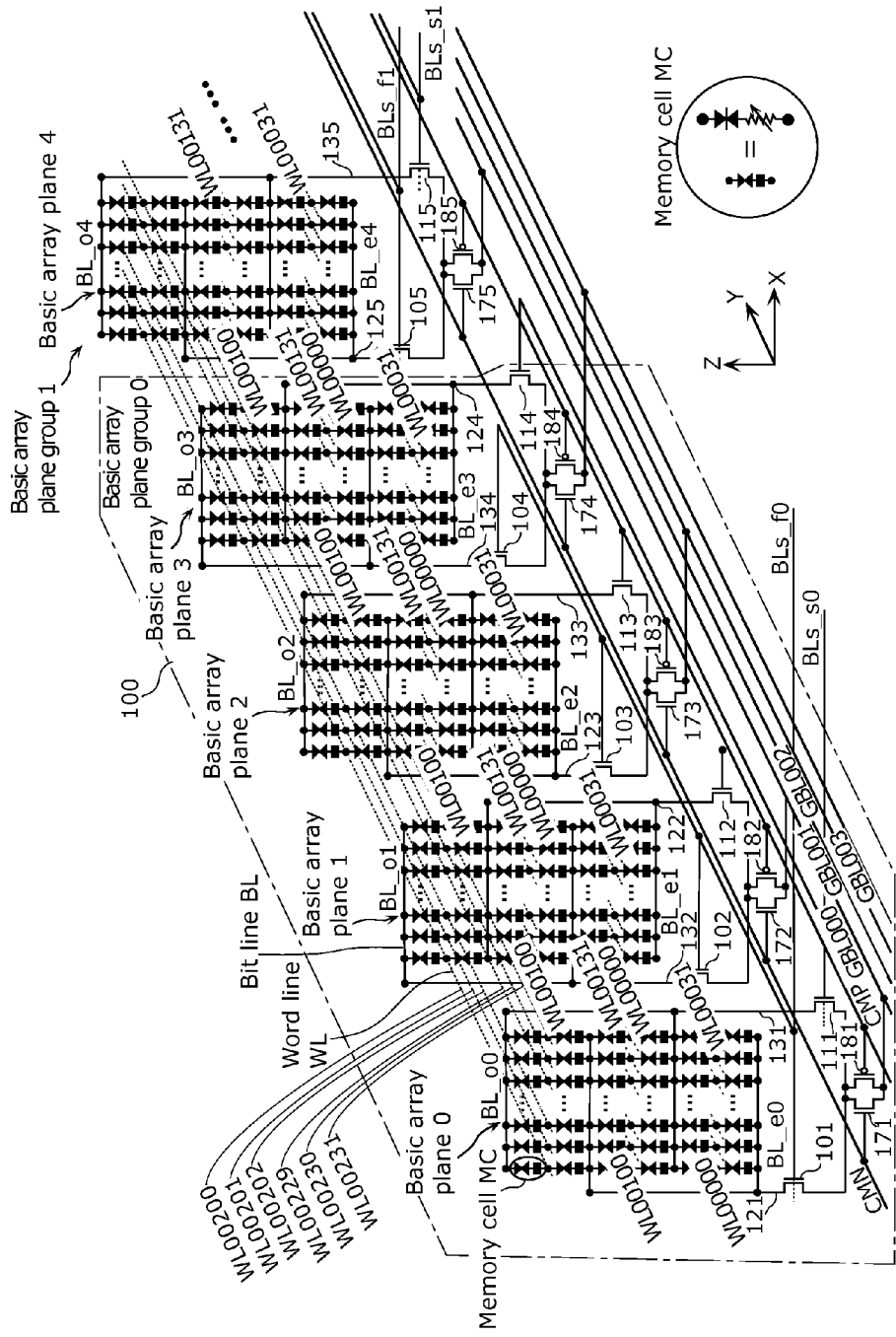
FIG. 19 is a circuit diagram illustrating one embodiment of the configuration of the basic array plane group according to the present invention.

It should be noted that in the memory cell array which includes a basic array plane group configured as illustrated in FIGS. 6 and 19, only a basic array plane at the end portion thereof (the basic array plane 0 in FIGS. 6 and 19) has one adjacent basic array plane (the basic array plane 1 in FIGS. 6 and 19), instead of two adjacent basic array planes. Therefore, although there is a concern that only when accessing the basic array plane 0 at the end portion, a read speed may be different from that when accessing another basic array plane, this concern can be solved by arranging, on the side where the basic array plane 1 is not provided, a dummy basic array plane adjacent to the basic array plane 0 in the Y direction. In this case, both the first selection switch element and the second selection switch element of the dummy basic array plane may be fixed in the OFF state so as to disconnect bit lines from global bit lines.

<Effect Achieved by Variable Resistance Nonvolatile Memory Device 500 According to Present Invention>

Next is a description of effects of the configuration of the memory cell array included in the variable resistance nonvolatile memory device 500 according to the present invention, taking particular notice of the behavior of signals in a selected bit line and an unselected bit line adjacent to the selected bit line in the Y direction during reading operation.

With the configuration of the conventional memory cell array illustrated in FIG. 23, depending on the position of a bit line to be selected, there are two cases, namely the case where both unselected bit lines adjacent to the selected bit line on both sides in the same wiring layer (i.e., in the Y direction) are connected to global bit lines by bit line selection switch elements (even-layer selection switch elements 401 to 405 or odd-layer selection switch elements 411 to 415), and the case where one of such unselected bit lines is connected to a global bit line by a corresponding bit line selection switch element, and the other of such unselected bit lines is disconnected from a global bit line. In contrast, the configuration of the memory cell array included in the variable resistance nonvolatile memory device 500 according to the present invention illustrated in FIG. 6 has a feature that irrespective of the position of a bit line to be selected, both unselected bit lines adjacent to the selected bit line on both sides in the same wiring layer (i.e., in the Y direction) are disconnected from global bit lines by bit line selection switch elements (the first selection switch elements 101 to 105 or the second selection switch elements 111 to 115).

Figure 20:
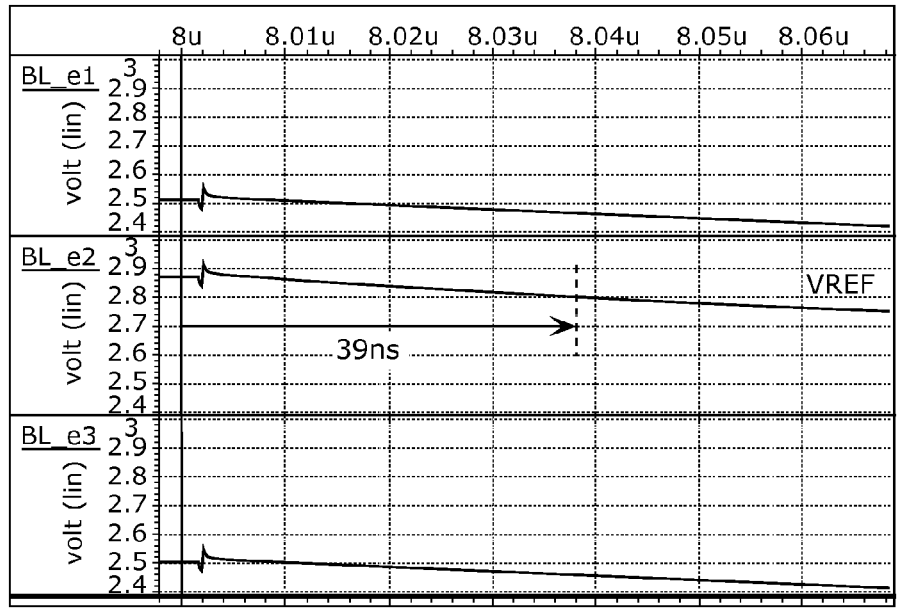
FIG. 20 Parts (a) and (b) of FIG. 20 are waveform diagrams each illustrating a simulation result of reading operation in a conventional basic array plane group.
Figure 20:
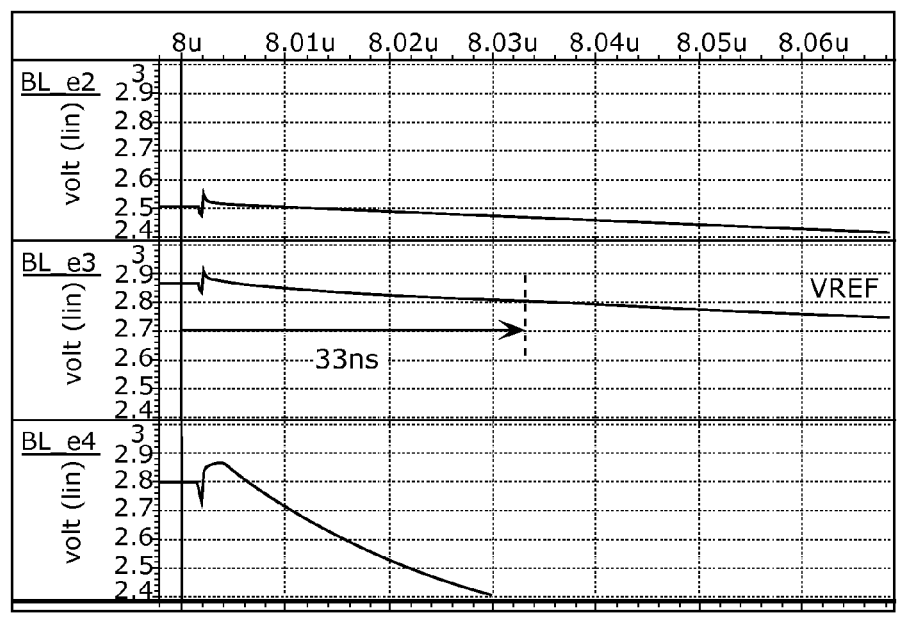

With the configuration of the conventional memory cell array, depending on the position of a bit line to be selected, the behavior of signals is different in unselected bit lines adjacent on both sides in the Y direction, which causes a difference in the influence from the unselected bit lines onto the selected bit line due to interline capacitance. Accordingly, even when the resistance value of variable resistance elements of selected memory cells is the same, depending on the selected position, a difference occurs in the behavior of signals in the selected bit lines, and fluctuations in the read speed occur. Part (a) of FIG. 20 illustrates, in the case of the configuration of the basic array plane group illustrated in FIG. 23, the behavior of signals in the unselected bit lines BL_e1, the selected bit lines BL_e2, and the unselected bit lines BL_e3 when reading a memory cell connected to the selected word line WL00000 and one of the selected bit lines BL_e2, the behavior being obtained as a result of simulation. Further, (b) of FIG. 20 illustrates the behavior of signals in the unselected bit lines BL_e2, the selected bit lines BL_e3, and the unselected bit lines BL_e4 when reading a memory cell connected to the selected word line WL00000 and one of the selected bit lines BL_e3, the behavior being obtained as a result of simulation. As illustrated in (a) of FIG. 20, when reading the memory cell connected to the selected word line WL00000 and one of the selected bit lines BL_e2, signals in both adjacent unselected bit lines change toward a stable voltage at a lower speed, whereas as illustrated in (b) of FIG. 20, when reading the memory cell connected to the selected word line WL00000 and one of the selected bit lines BL_e3, it can be seen that a signal in one of the adjacent unselected bit lines changes toward a stable voltage at a lower speed, and a signal in the other changes toward a stable voltage at a higher speed. As described above, since there is a difference in the behavior of signals in unselected bit lines adjacent in the Y direction, a read time when reading the memory cell connected to the selected word line WL00000 and one of the selected bit lines BL_e2 is 39 ns, whereas a read time when reading the memory cell connected to the selected word line WL00000 and one of the selected bit lines BL_e3 is 33 ns. Thus, it can be seen that there is a difference of 6 ns depending on the selected position.

Figure 21:
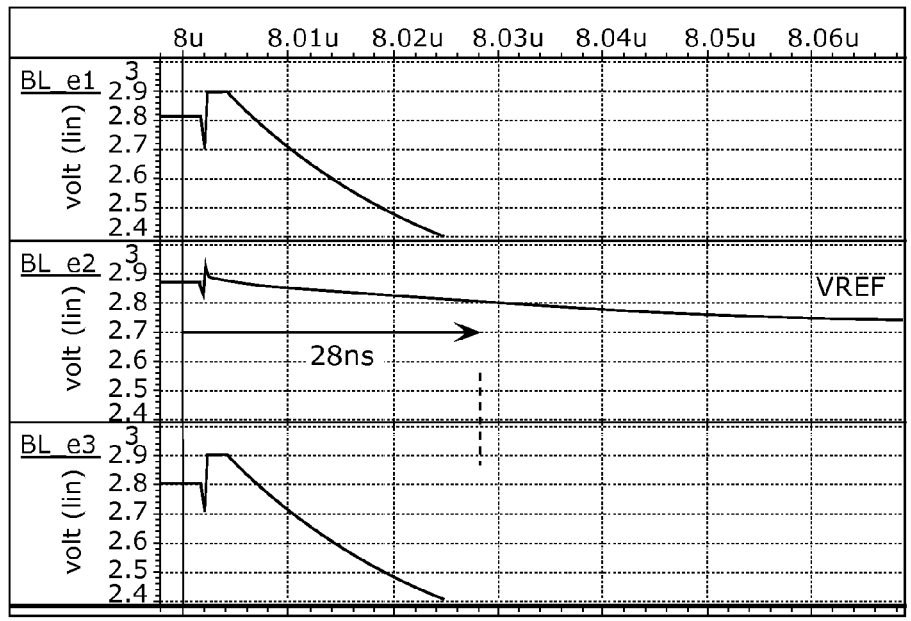
FIG. 21 Parts (a) and (b) of FIG. 21 are waveform diagrams each illustrating a simulation result of reading operation in the basic array plane group according to the present invention.
Figure 21:
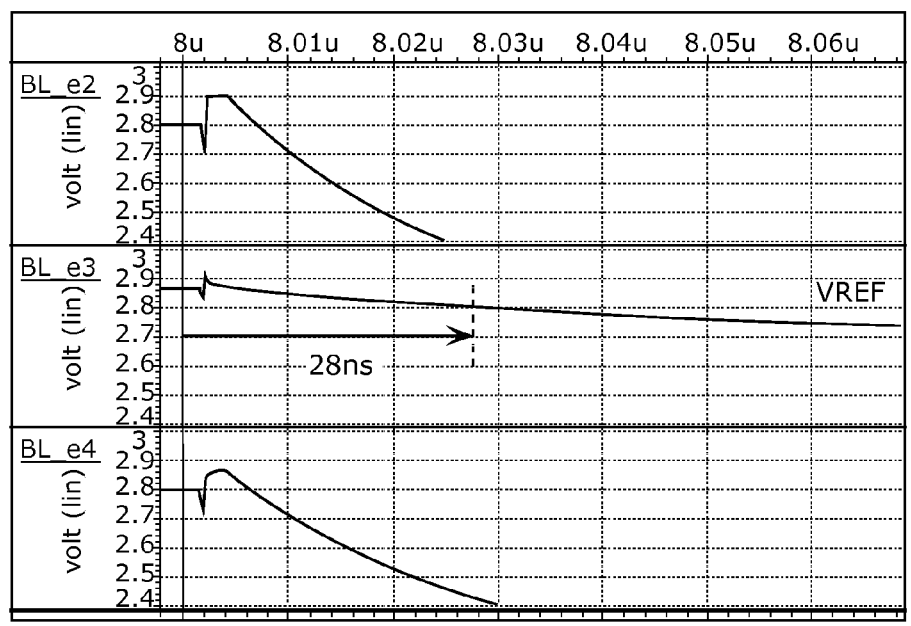

On the other hand, with the configuration of the memory cell array included in the variable resistance nonvolatile memory device 500 according to the present invention, irrespective of the position of a bit line to be selected, the behavior of signals is the same in unselected bit lines adjacent on both sides in the Y direction, and there is no difference in the influence on the selected bit line due to interline capacitance. Accordingly, when the resistance value of variable resistance elements of selected memory cells is the same, there is no difference in the behavior of signals in selected bit lines depending on the selected position, and thus fluctuations in the read speed do not occur. Parts (a) and (b) of FIG. 21 illustrate, in the case of the configuration of the basic array plane group illustrated in FIG. 6, the behavior of signals in a selected bit line and adjacent unselected bit lines in both the cases where a memory cell connected to the selected word line WL00000 and one of the selected bit lines BL_e2 is read and where a memory cell connected to the selected word line WL00000 and one of the selected bit lines BL_e3 is read as in the case of FIG. 20, the behavior being obtained as a result of simulation. In both of the cases in (a) and (b) of FIG. 21, it can be seen that signals in both adjacent unselected bit lines show a change to a stable voltage at a higher speed. Accordingly, a read time when reading the memory cell connected to the selected word line WL00000 and one of the selected bit lines BL_e2 is 28 ns, and a read time when reading the memory cell connected to the selected word line WL00000 and one of the selected bit lines BL_e3 is also 28 ns, which shows that selected positions do not make a difference.

As described above, with the configuration of the memory cell array included in the variable resistance nonvolatile memory device according to the present invention, a read time is fixed, irrespective of the position to be selected, and it is not necessary to take into consideration the influence exerted by the behavior of a signal in an unselected bit line due to interline capacitance. Thus, it is possible to provide bit lines at minimum intervals without providing an extra margin in a read circuit. Further, although the above results are examples in the case of the basic array plane group illustrated in FIG. 6, if the number of wiring layers and the number of memory cells on the same bit line is further increased compared to those in the case of FIG. 6, the influence exerted due to interline capacitance will be more noticeable. Thus, the configuration of the memory cell array included in the variable resistance nonvolatile memory device according to the present invention which does not need to take such an influence into consideration will be more useful.

Although the above is a description of the variable resistance nonvolatile memory device according to the present invention based on an embodiment and the modification thereof, the present invention is not limited to the embodiment and the modification. Modifications obtained by applying various changes which can be conceived by a person skilled in the art to the embodiment and the modification and any combinations of the constituent elements in the embodiment and the modification are also included in the present invention without departing from the scope of the present invention.

For example, although the memory cell array included in the variable resistance nonvolatile memory device according to the present embodiment illustrated in FIG. 6 includes a plurality of basic array groups, and each basic array group includes four basic array planes, the memory cell array included in the variable resistance nonvolatile memory device according to the present invention is not limited to such a configuration, and may include at least one basic array group only, or one basic array group may include at least two basic arrays. It is because if a memory cell array includes at least two basic array planes, a feature can be achieved that a first via group in a first basic array plane (a via group which connects even-layer bit lines) and a second via group in a second basic array plane (a via group which connects odd-layer bit lines) are adjacent to each other in the Y direction, and a second via group in the first basic array plane and a first via group in the second basic array plane are adjacent to each other in the Y direction.

INDUSTRIAL APPLICABILITY

As described above, the variable resistance nonvolatile memory device according to the present invention is useful to achieve a memory for which successive access operation is controlled with ease and furthermore, power consumption for such control is reduced, since it is not necessary to change potentials applied to a word line and a bit line in each cycle when successively accessing memory cells in a certain area in a memory cell array while incrementing an address.

REFERENCE SIGNS LIST

MC Memory cell
BL Bit line
WL Word line

GBL Global bit line
BL_e0 to BL_e4 Even-layer bit line
BL_o0 to BL_o4 Odd-layer bit line
BLs_f0, BLs_f1 First bit line selection signal
BLs_s0, BLs_s1 Second bit line selection signal
BLs_e0, BLs_e1 Even-layer bit line selection signal
BLs_o0, BLs_o1 Odd-layer bit line selection signal
CMP Current-limiting-control signal
1 Variable resistance element
2 Bi-directional diode element
2a Unidirectional diode element
11 Lower line
12 Upper line
13 Lower electrode
14 Diode layer
15 Internal electrode
16 Variable resistance layer
16a First variable resistance layer (first tantalum oxide layer, first hafnium oxide layer, first zirconium oxide layer)
16b Second variable resistance layer (second tantalum oxide layer, second hafnium oxide layer, second zirconium oxide layer)
17 Upper electrode
100 Basic array plane group
101 to 105 First selection switch element
106 Diffusion layer
107 Gate
107a First selection gate
107b Second selection gate
111 to 115 Second selection switch element
121 to 125 First via group
131 to 135 Second via group
141 to 143, 145, 147, 151, 161 Via
144, 146, 148, 149 Line
165 First Via
166 First Line
167 Second Via
168 Second Line
171 to 175, 181 to 185 Current limiting circuit (N-MOS transistor, P-MOS transistor)
200 Memory cell array
201 Word line decoder/driver
202 Global bit line decoder/driver
203 Sub-bit line selection circuit
211 Address input circuit
212 Control circuit
213 Write pulse generation circuit
214 Write circuit
215 Data input-output circuit
216 Read circuit
300 Main part
400 Basic array plane group
401 to 405 Even-layer selection switch element
411 to 415 Odd-layer selection switch element
421 to 425 Even-layer contact via
431 to 435 Odd-layer contact via
500 Variable resistance nonvolatile memory device

The invention claimed is:

1. A variable resistance nonvolatile memory device which includes memory cells each having a variable resistance element, a resistance state of which reversibly changes based on an electrical signal, the variable resistance nonvolatile memory device comprising:
a substrate;
bit lines in a plurality of layers which are stacked in a Z direction, and in which the bit lines extending in an X direction are aligned in a Y direction, the X and Y directions being directions orthogonal to each other on a plane parallel to a main surface of the substrate, the Z direction being a direction in which the layers are stacked above the main surface of the substrate;
word lines in a plurality of layers which are stacked in the Z direction and formed at intervals between the layers of the bit lines, and in which the word lines extending in the Y direction are aligned in the X direction;
a memory cell array having the memory cells formed at crosspoints of the bit lines in the layers and the word lines in the layers and interposed between the bit lines and the word lines, the memory cell array including a plurality of basic array planes aligned in the Y direction and each having memory cells which are included in the memory cells and are interposed between, among the bit lines in the layers, bit lines in the layers at a same position in the Y direction and the word lines crossing the bit lines at the same position;
global bit lines provided in one-to-one correspondence with the basic array planes;
sets provided in one-to-one correspondence with the basic array planes, and each including a first selection switch element and a second selection switch element; and
a control unit configured to control an order of accessing the memory cells,
wherein each of the basic array planes further includes a first via group interconnecting even-layer bit lines among the bit lines in the basic array plane, and a second via group interconnecting odd-layer bit lines among the bit lines in the basic array plane,
for each of the basic array planes, the first via group in the basic array plane is connected to the global bit line corresponding to the basic array plane via one of the first selection switch element and the second selection switch element which are included in the set corresponding to the basic array plane, and the second via group in the basic array plane is connected to the corresponding global bit line via the other of the first selection switch element and the second selection switch element which are included in the corresponding set,
when one of the basic array planes is a first basic array plane, and a different one of the basic array planes is a second basic array plane, the different one being adjacent to the first basic array plane in the Y direction,
the first via group in the first basic array plane and the second via group in the second basic array plane are adjacent to each other in the Y direction, and the second via group in the first basic array plane and the first via group in the second basic array plane are adjacent to each other in the Y direction,
the first via group in the first basic array plane is connected to the global bit line corresponding to the first basic array plane via the first selection switch element corresponding to the first basic array plane, and the second via group in the first basic array plane is connected to the corresponding global bit line via the second selection switch element corresponding to the first basic array plane, and
the second via group in the second basic array plane is connected to the global bit line corresponding to the second basic array plane via the first selection switch element corresponding to the second basic array plane, and the first via group in the second basic array plane is connected to the corresponding global bit line via the second selection switch element corresponding to the second basic array plane, in the sets corresponding to the basic array planes and each including the first selection switch element and the second selection switch element, electrical connection and disconnection of the first selection switch elements are controlled by a first common bit line selection signal, and electrical connection and disconnection of the second selection switch elements are controlled by a second common bit line selection signal, resistance states of the memory cells change to a first resistance state when a current flows through the memory cells in the Z direction, and change to a second resistance state different from the first resistance state when a current flows through the memory cells in a direction opposite to the Z direction, the control unit is configured to make a first access to a first memory cell connected to a first word line and a first bit line in the first basic array plane, and subsequently to the first access, select a second memory cell connected to the first word line and a second bit line in a basic array plane different from the first basic array plane and make a second access to the second memory cell, and the control unit is configured to select the second memory cell so that:

a voltage applied to the first word line when the second access is made is the same as a voltage applied to the first word line when the first access is made;

a voltage applied to the second bit line when the second access is made is the same as a voltage applied to the first bit line when the first access is made; and a direction in which a current flows through the first memory cell by the first access is the same as a direction in which a current flows through the second memory cell by the second access.

2. The variable resistance nonvolatile memory device according to claim 1,
wherein the control unit is configured to select the second memory cell connected to the first word line and the second bit line in a third basic array plane which is the basic array plane different from the first basic array plane and adjacent to the second basic array plane in the Y direction, and make the second access to the second memory cell.

3. The variable resistance nonvolatile memory device according to claim 1,
wherein the control unit is configured to select the second memory cell connected to the first word line and the second bit line in the second basic array plane, and make the second access to the second memory cell.

4. The variable resistance nonvolatile memory device according to claim 1,
wherein for each of the basic array planes, the first via group in the basic array plane connects all the even-layer bit lines in the basic array plane using a single via, and the second via group in the basic array plane connects all the odd-layer bit lines in the basic array plane using a single via, the even-layer bit lines being adjacent in the Z direction with the odd-layer bit lines in the basic array plane interposed, the odd-layer bit lines being adjacent in the Z direction with the even-layer bit lines in the basic array plane interposed.

5. The variable resistance nonvolatile memory device according to claim 1, further comprising, for each of the basic array planes,
a current limiting circuit between the global bit line corresponding to the basic array plane and terminals, one of the terminals being a terminal of the first selection switch element corresponding to the basic array plane and the other of the terminals being a terminal of the second selection switch element corresponding to the basic array plane.

6. The variable resistance nonvolatile memory device according to claim 1, further comprising:
a global bit line decoder/driver which selects at least one of the global bit lines, and applies a read voltage to the at least one selected global bit line;
a read circuit which reads the resistance state of a memory cell in the basic array plane corresponding to the at least one global bit line selected by the global bit line decoder/driver; and
a control circuit which controls the global bit line decoder/driver,
wherein when an operation of reading from a memory cell in the first basic array plane is performed, the control circuit controls the global bit line decoder/driver to prevent an operation of reading from a memory cell in the second basic array plane from being simultaneously performed.

7. The variable resistance nonvolatile memory device according to claim 6,
wherein when the operation of reading from the memory cell in the first basic array plane is performed, the control circuit further controls the global bit line decoder/driver to cause an operation of reading from a memory cell in a third basic array plane to be simultaneously performed, the third basic array plane not being adjacent to the first basic array plane in the Y direction.

8. An accessing method for a variable resistance nonvolatile memory device which includes memory cells each having a variable resistance element, a resistance state of which reversibly changes based on an electrical signal, the variable resistance nonvolatile memory device including:
a substrate;
bit lines in a plurality of layers which are stacked in a Z direction, and in which the bit lines extending in an X direction are aligned in a Y direction, the X and Y directions being directions orthogonal to each other on a plane parallel to a main surface of the substrate, the Z direction being a direction in which the layers are stacked above the main surface of the substrate;
word lines in a plurality of layers which are stacked in the Z direction and formed at intervals between the layers of the bit lines, and in which the word lines extending in the Y direction are aligned in the X direction;
a memory cell array having the memory cells formed at crosspoints of the bit lines in the layers and the word lines in the layers and interposed between the bit lines and the word lines, the memory cell array including a plurality of basic array planes aligned in the Y direction and each having memory cells which are included in the memory cells and are interposed between, among the bit lines in the layers, bit lines in the layers at a same position in the Y direction and the word lines crossing the bit lines at the same position;
global bit lines provided in one-to-one correspondence with the basic array planes; and
sets provided in one-to-one correspondence with the basic array planes, and each including a first selection switch element and a second selection switch element,
wherein each of the basic array planes further includes a first via group interconnecting even-layer bit lines among the bit lines in the basic array plane, and a second via group interconnecting odd-layer bit lines among the bit lines in the basic array plane, for each of the basic array planes, the first via group in the basic array plane is connected to the global bit line corresponding to the basic array plane via one of the first selection switch element and the second selection switch element which are included in the set corresponding to the basic array plane, and the second via group in the basic array plane is connected to the corresponding global bit line via the other of the first selection switch element and the second selection switch element which are included in the corresponding set, when one of the basic array planes is a first basic array plane, and a different one of the basic array planes is a second basic array plane, the different one being adjacent to the first basic array plane in the Y direction, the first via group in the first basic array plane and the second via group in the second basic array plane are adjacent to each other in the Y direction, and the second via group in the first basic array plane and the first via group in the second basic array plane are adjacent to each other in the Y direction, the first via group in the first basic array plane is connected to the global bit line corresponding to the first basic array plane via the first selection switch element corresponding to the first basic array plane, and the second via group in the first basic array plane is connected to the corresponding global bit line via the second selection switch element corresponding to the first basic array plane, and the second via group in the second basic array plane is connected to the global bit line corresponding to the second basic array plane via the first selection switch element corresponding to the second basic array plane, and the first via group in the second basic array plane is connected to the corresponding global bit line via the second selection switch element corresponding to the second basic array plane, in the sets corresponding to the basic array planes and each including the first selection switch element and the second selection switch element, electrical connection and disconnection of the first selection switch elements are controlled by a first common bit line selection signal, and electrical connection and disconnection of the second selection switch elements are controlled by a second common bit line selection signal, and resistance states of the memory cells change to a first resistance state when a current flows through the memory cells in the Z direction, and change to a second resistance state different from the first resistance state when a current flows through the memory cells in a direction opposite to the Z direction, the accessing method comprising:

(a) making a first access to a first memory cell connected to a first word line and a first bit line in the first basic array plane; and subsequently (b) selecting a second memory cell connected to the first word line and a second bit line in a basic array plane different from the first basic array plane and making a second access to the second memory cell, wherein the second memory cell is selected so that:

a voltage applied to the first word line in step (b) is the same as a voltage applied to the first word line in step (a);

a voltage applied to the second bit line in step (b) is the same as a voltage applied to the first bit line in step (a); and a direction in which a current flows through the first memory cell in step (a) is the same as a direction in which a current flows through the second memory cell in step (b).

9. The accessing method according to claim 8, wherein in step (b), the second memory cell is selected which is connected to the first word line and the second bit line in a third basic array plane which is the basic array plane different from the first basic array plane and adjacent to the second basic array plane in the Y direction, and the second access is made to the second memory cell.

10. The accessing method according to claim 8, wherein in step (b), the second memory cell is selected which is connected to the first word line and the second bit line in the second basic array plane, and the second access is made to the second memory cell.

* * * * *